US012258263B1

(12) United States Patent
Awtar et al.

(10) Patent No.: US 12,258,263 B1
(45) Date of Patent: Mar. 25, 2025

(54) METHOD OF MANUFACTURE AND ASSEMBLY OF XY FLEXURE MECHANISM ASSEMBLY

(71) Applicant: The Regents of the University of Michigan, Ann Arbor, MI (US)

(72) Inventors: Shorya Awtar, Ann Arbor, MI (US); Kwun Sing Roger Ho, Ann Arbor, MI (US); Siddharth Rath, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 18/605,411

(22) Filed: Mar. 14, 2024

(51) Int. Cl.
*B81C 1/00* (2006.01)
*B81B 3/00* (2006.01)

(52) U.S. Cl.
CPC ........ *B81B 3/0051* (2013.01); *B81C 1/00134* (2013.01); *B81B 2201/0292* (2013.01); *B81B 2201/033* (2013.01); *B81B 2203/06* (2013.01); *B81C 2201/0128* (2013.01)

(58) Field of Classification Search
CPC ........ B81C 1/00134; B81C 2201/0128; B81B 3/0051; B81B 2201/0292; B81B 2201/033; B81B 2203/06
See application file for complete search history.

(56) References Cited

U.S. PATENT DOCUMENTS

| 6,688,183 | B2 | 2/2004 | Awtar et al. |
| 7,239,107 | B1 | 7/2007 | Ferreira et al. |
| 9,157,476 | B2 | 10/2015 | Panas |
| 9,200,689 | B2 | 12/2015 | Awtar et al. |
| 2005/0198844 | A1 | 9/2005 | Lee et al. |
| 2010/0116161 | A1 | 5/2010 | Shilpiekandula et al. |
| 2017/0191521 | A1* | 7/2017 | Hopkins ............... G01J 3/0202 |
| 2018/0252260 | A1* | 9/2018 | Bullard .................. F16C 11/12 |
| 2022/0260805 | A1* | 8/2022 | Ready ................. G02B 7/1827 |
| 2023/0056192 | A1* | 2/2023 | Patel ..................... H04N 23/55 |

OTHER PUBLICATIONS

Shorya Awtar and Gaurav Parmar, Design of a Large Range XY Nanopositioning System, Paper, Ann Arbor, MI (13 pages).
Shorya Awtar and Alexander H. Slocum, Constraint-based Design of Parallel Kinematic XY Flexure Mechanisms, Paper (33 pages).
(Continued)

*Primary Examiner* — Moazzam Hossain
(74) *Attorney, Agent, or Firm* — Reising Ethington P.C.

(57) ABSTRACT

A method of manufacturing and assembling a sandwich flexure mechanism assembly is set forth herein. The method involves manufacture of a monolithic sandwich flexure module having a multitude of out of plane rigid inter-stage connections between at least some sets of twin stages of the monolithic sandwich flexure module. The method further involves assembling an interconnect subassembly to intermediate bodies of the monolithic sandwich flexure module. The interconnect subassembly furnishing in-plane rigid inter-stage connections between pairs of the intermediate bodies that constitute sister stages of the monolithic sandwich flexure module. The method can further involve assembling a motion body, actuators, and displacement sensors at the monolithic sandwich flexure module.

11 Claims, 36 Drawing Sheets

(56) References Cited

OTHER PUBLICATIONS

Jiaxiang Zhu, Guangbo Hao, Shiyao Li, Shuwen Yu, Xianwen Kong, A Mirror-Symmetrical XY Compliant Parallel Manipulator with Improved Performances without Increasing the Footprint, Proceedings of the ASME 2021 International Design Engineering Technical Conferences and Computers and Information in Engineering Conference IDETC-CIE2021 Aug. 17-19, 2021, Virtual, Online (13 pages).
S. Awtar, A.H. Slocum, A Large Range XY Flexure Stage for Nanopositioning, Paper (4 pages).
Yuen Kuan Yong, Sumeet S. Aphale, and S. O. Reza Moheimani, Design, Identification, and Control of a Flexure-Based XY Stage for Fast Nanoscale Positioning, IEEE Transactions on Nanotechnology, vol. 8, No. 1, Jan. 2009 (9 pages).
Qingsong Xu, Design and Development of a Compact Flexure-Based XY Precision Positioning System With Centimeter Range, IEEE Transactions on Industrial Electronics, vol. 61, No. 2, Feb. 2014 (11 pages).
Kunhai Caia, Yanling Tiana, Xianping Liub, Dawei Zhanga, Jiangkun Shanga, Bijan Shirinzadehc, Development and control methodologies for 2-DOF micro/nano positioning stage with high out-of-plane payload capacity, Robotics and Computer Integrated Manufacturing, 2019 (11 pages).
Dongwoo Kang, Kihyun Kim, Dongmin Kim, Jongyoup Shim, Dae-Gab Gweon, Jaehwa Jeong, Optimal design of high precision XY-scanner with nanometer-level resolution and millimeter-level working range, Mechatronics, 2009 (9 pages).
Yiling Yang, Yanding Wei, Junqiang Lou and Fengran Xie, Design and analysis of a new flexure-based XY stage, Journal of Intelligent Material Systems and Structures 2017, vol. 28 (17) 2388-2402 (15 pages).
Shixun Fan, Hua Liu, and Dapeng Fan, Design and development of a novel monolithic compliant XY stage with centimeter travel range and high payload capacity, Mech. Sci., 9, 161-176, 2018 (16 pages).
Mohammad Olfatnia, Leqing Cui, Pankaj Chopra, and Shorya Awtar, MEMs Based XY Stage with Large Displacement, Proceedings of the ASME 2013 International Design Engineering Technical Conferences & Computers and Information in Engineering Conference IDETC/CIE 2013 Aug. 4-7, 2013, Portland, OR, USA (9 pages).
Mohammad Olfatnia, Siddharth Sood, Jason J. Gorman, Shorya Awtar, Large Stroke Electrostatic Comb-drive Actuators Based on a Novel Flexure Mechanism, Paper (4 pages).
Mohammad Olfatnia, Siddharth Sood, Shorya Awtar, Large Stroke Comb-Drive Actuators Using Reinforced, Clamped, Paired Double Parallelogram (C-DP-DP) Flexure, Proceedings of the ASME 2012 International Design Engineering Technical Conferences & Computers and Information in Engineering Conference IDETC/CIE 2012, Aug. 12-15, 2012, Chicago, IL, USA (9 pages).
Mohammad Olfatnia, Siddharth Sood, Jason J. Gorman, Member, IEEE, and Shorya Awtar, Member, ASME, Large Stroke Electrostatic Comb-Drive Actuators Enabled by a Novel Flexure Mechanism, Journal of Microelectromechanical Systems, vol. 22, No. 2, Apr. 2013 (12 pages).
Shorya Awtar and Alexander H. Slocum, Design of Parallel Kinematic XY Flexure Mechanisms, Proceedings of IDETC/CIE 2005 ASME 2005 International Design Engineering Technical Conferences & Computers and Information in Engineering Conference, Sep. 24-28, 2005, Long Beach, California, USA (11 pages).
Shorya Awtar, Alexander H. Slocum, Topology Evolution of High Performance XY Flexure Stages, Paper (4 pages).

\* cited by examiner

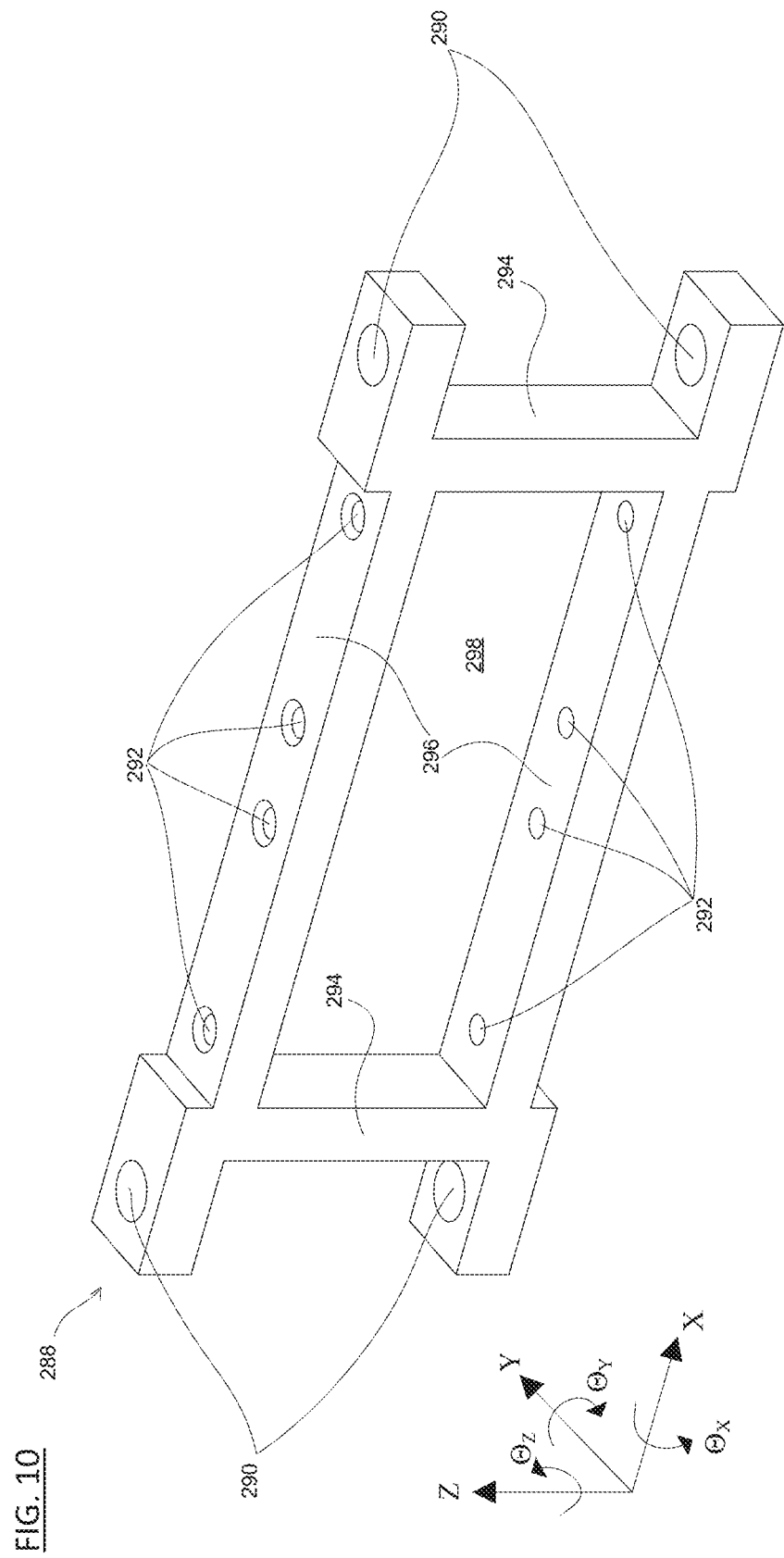

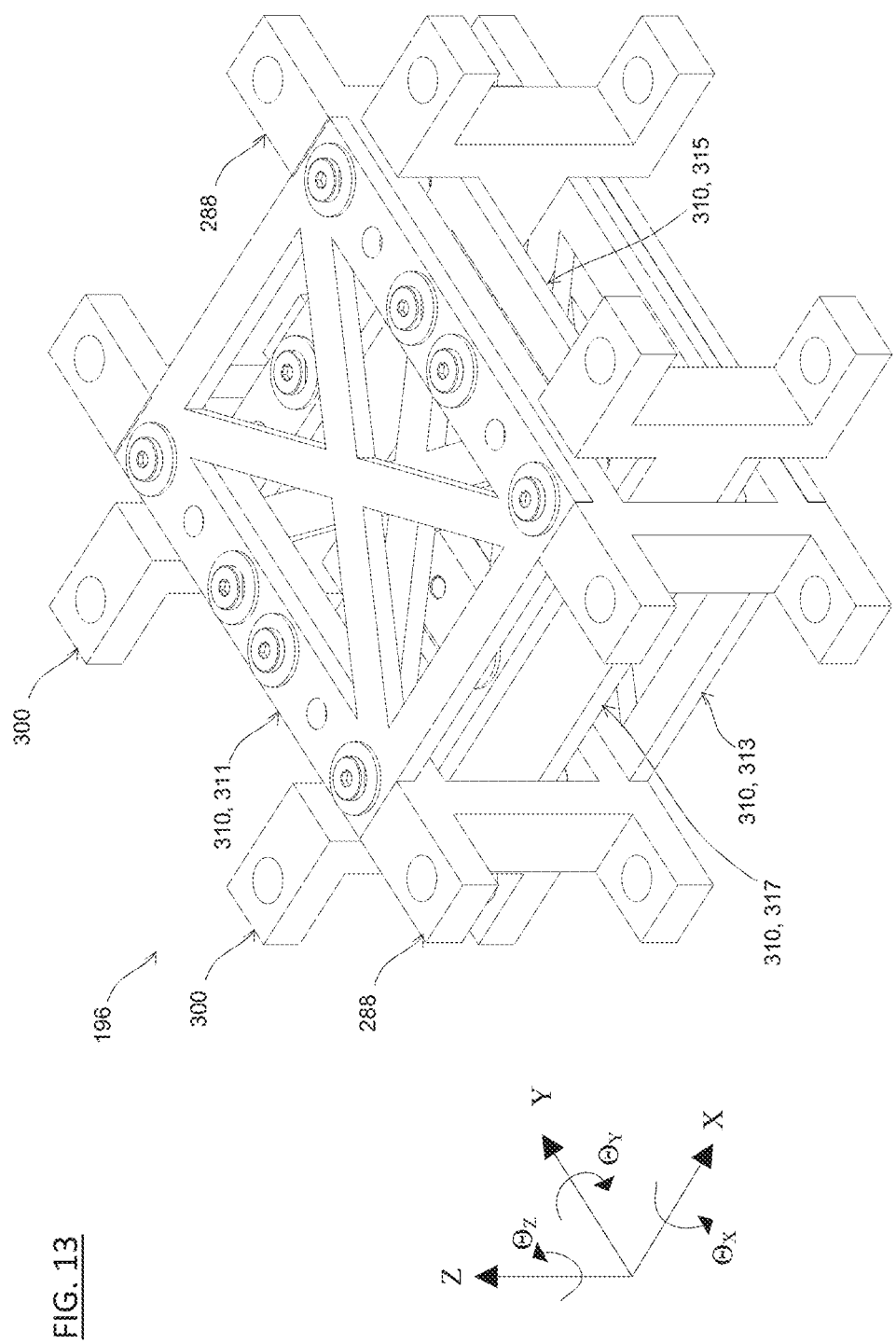

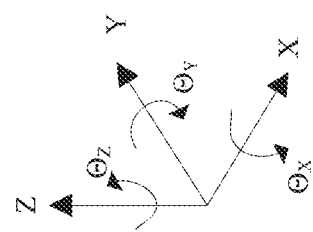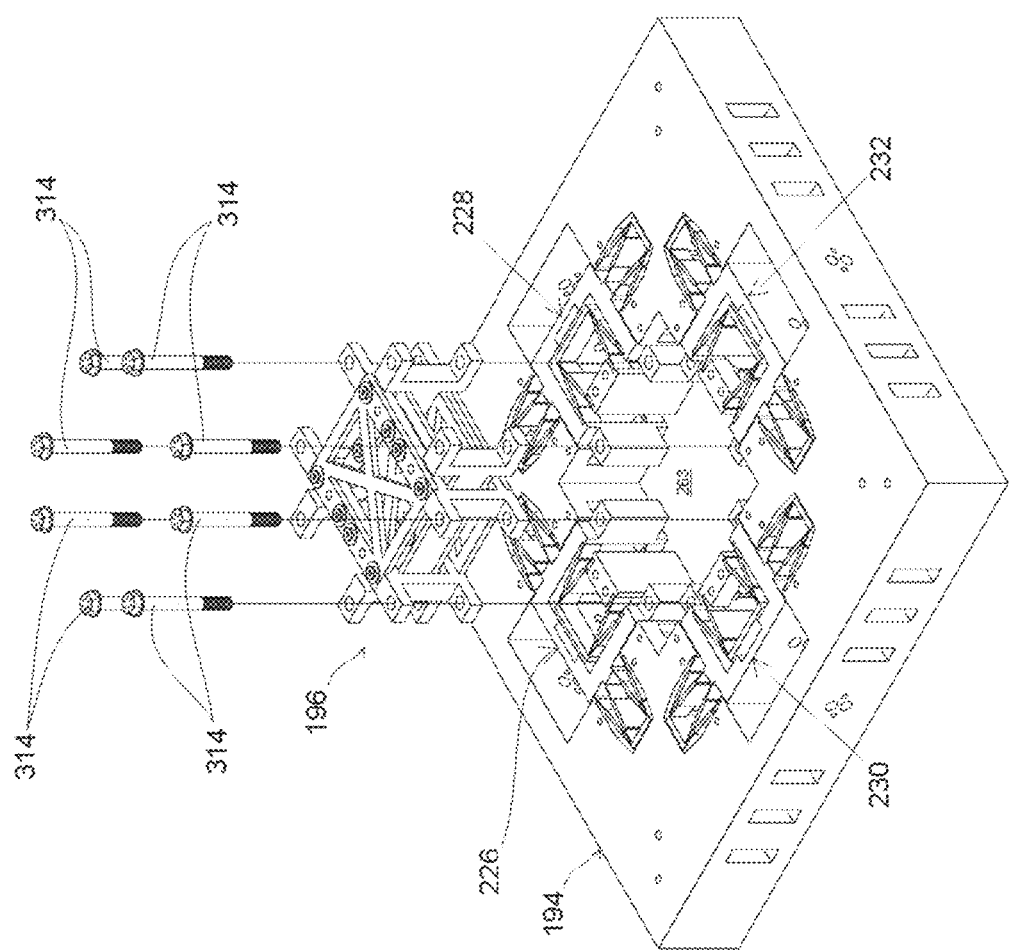
FIG. 15

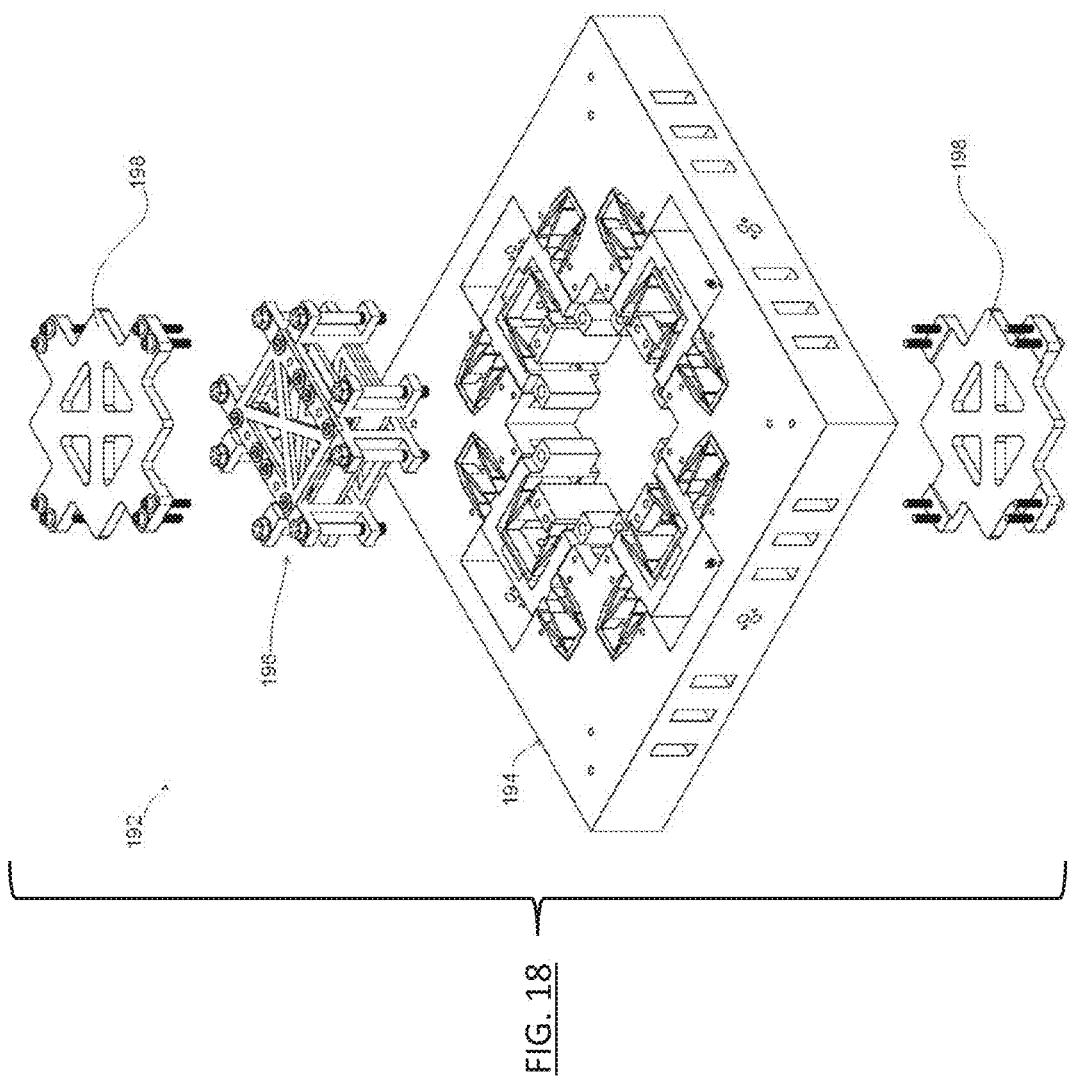

METHOD OF MANUFACTURE AND ASSEMBLY OF XY FLEXURE MECHANISM ASSEMBLY

GOVERNMENT FUNDING

This invention was made with government support under 1941194 awarded by the National Science Foundation. The government has certain rights in the invention.

TECHNICAL FIELD

This disclosure relates generally to flexure mechanisms for guiding motion and, more particularly, relates to the manufacture and assembly of XY flexure mechanism assemblies.

BACKGROUND

Flexure mechanisms are often employed as bearings to provide guided motion. Flexure mechanisms can move by elastic deformation and, when they do, are largely free of backlash, wear, and friction. Flexure mechanisms also lack the need of lubrication. Important in certain precision engineering and micro- and nano-positioning applications, flexure mechanisms exhibit low inertia and high accuracy. Examples of some general applications in which flexure mechanisms are useful include, but are not limited to, micro-electro mechanical system (MEMS) devices such as actuators and sensors, ultra-precision motion stages for fine alignment and adjustments, scanning probe microscopy and metrology, scanning probe nanolithography, memory storage, hard-drive and semiconductor inspection, semiconductor packaging, biological imaging, and non-contact macro scale actuators and sensors.

SUMMARY

In an embodiment, a method of manufacturing and assembling a sandwich flexure mechanism assembly may have multiple steps. One step may involve providing a monolithic sandwich module. The monolithic sandwich module may have a multitude of sandwich double parallelogram flexure mechanisms, a multitude of intermediate bodies, and a multitude of out of plane rigid inter-stage connections between some or more twin stages of the monolithic sandwich module. Another step may involve assembling an interconnect subassembly to a pair or more of intermediate bodies of the multitude of intermediate bodies. The interconnect subassembly may provide one or more in-plane rigid inter-stage connections between the pair or more of intermediate bodies of the multitude of intermediate bodies.

In an embodiment, a method of manufacturing a monolithic sandwich flexure module may have multiple steps. One step may involve removing material from a block along a first direction with respect to the block. Another step may involve removing material from the block along a second direction with respect to the block. The first direction and the second direction may be orthogonal with respect to each other. The monolithic sandwich flexure module may have one or more out of plane rigid inter-stage connections between one or more sets of twin stages of the monolithic sandwich flexure module.

In an embodiment, a method of manufacturing and assembling a sandwich flexure mechanism assembly may have multiple steps. One step may involve providing a monolithic sandwich module. The monolithic sandwich module may have a multitude of sandwich double parallelogram flexure mechanisms, a multitude of intermediate bodies, a multitude of inner bodies, a multitude of actuator pockets, and a multitude of out of plane rigid inter-stage connections between some or more twin stages of the monolithic sandwich module. Another step may involve assembling an interconnect subassembly to a pair or more of intermediate bodies of the multitude of intermediate bodies. The interconnect subassembly may provide one or more in-plane rigid inter-stage connections between the pair or more of intermediate bodies of the multitude of intermediate bodies. Yet another step may involve assembling a motion body to the multitude of inner bodies. And yet another step may involve assembling a multitude of actuators at the multitude of actuator pockets.

BRIEF DESCRIPTION OF THE DRAWINGS

Exemplary embodiments will hereinafter be described in conjunction with the appended drawings, wherein like designations denote like elements, and wherein:

FIG. 10 is a perspective view of an embodiment of an interconnect bar of the sandwich XY flexure mechanism assembly;

FIG. 13 is a perspective view of an embodiment of a subassembly of interconnect bars and plates;

FIG. 15 is a partially exploded view of an embodiment of an assembly method of the sandwich module and subassembly of interconnect bars and plates;

FIG. 18 is a partially exploded view of the sandwich XY flexure mechanism assembly;

DETAILED DESCRIPTION

Figure 1:
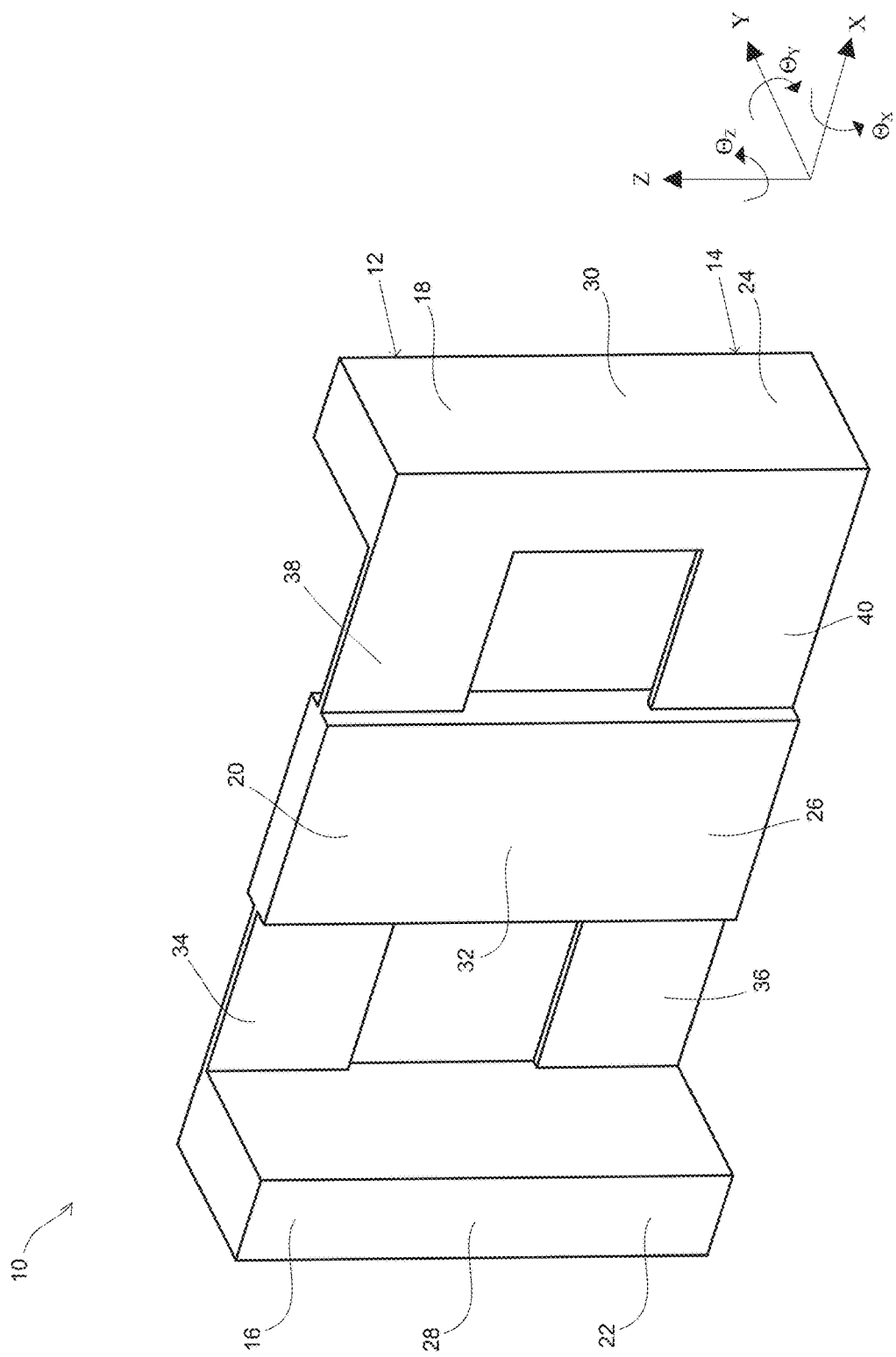
FIG. 1 is a perspective view of an embodiment of a sandwich flexure module.

Initially, definitions are presented for certain terms and phrases used in this detailed description and in the claims.

1) Body. A body can be part of an assembly, sub-assembly, or mechanism, etc. A body can be a rigid body or a flexible body. But nothing is ever truly rigid. Rather, what this term means is that the intent for the rigid body is to be rigid. In general, a rigid body will have some undesired compliance, referred to parasitic compliance, as subsequently described. A flexible body, on the other hand, is flexible by design. In other words, it has intentional (as opposed to undesired) compliance.

Elements, components, stages, etc., are all examples of rigid or flexible bodies. In this patent, stages are typically rigid bodies, while flexure elements (e.g., beams, strips, wires) are flexible bodies.

A flexible body may be intentionally flexible in certain portions and intentionally rigid in other portions. The portions can be monolithic or structurally assembled. A flexible body may also be referred to as a compliant body. Further, a body may be of homogeneous material composition or heterogeneous material composition.

As subsequently set forth, a rigid body or a flexible body can be a monolith or a structural assembly of multiple bodies. Structural assembly is defined as an interface between two bodies that eliminates all relative degrees of freedom between the two bodies.

2) The displacement(s) (used interchangeably with motion(s); a general term that includes both translations and rotations) of a body can generally be defined with respect to another body by describing motion or lack thereof along six directions (three translations and three rotations).

Of the six directions, the directions along which relative displacement is allowed between two bodies are called the "Degrees of Freedom (DoF)" between the two bodies. DoF is a technical term to capture or convey these allowed motions. Other terms that can be used interchangeably with degrees of freedom are directions of freedom, and motion directions.

Of the six directions, the directions along which relative displacement is not allowed are called "Degrees of Constraint (DoC)" between the two bodies. Displacements and loads (a general term that includes both force and moments) are transmitted from one body to the other along the DoC. Since relative motion is constrained, these are directions along which motions (i.e., translations or rotations) and loads (i.e., forces or moments) can be transmitted from one body to the other body. Since the joint/interface between the two bodies does not allow relative motion between the two bodies in the DoC direction, if one body moves in the DoC direction, it drives along with it the other body along that direction. In other words, motions are transmitted from one body to another body in the DoC directions. Consequently, loads are also transmitted from one body to the other in the DoC directions. Therefore, these directions are referred to as constraint directions, directions of constraint, load bearing directions, bearing directions, transmission directions, or non-motion directions.

In general, DoF plus DoC equals six in total. The number of relative DoF between two bodies is determined by the joint or interface between the two bodies.

3) Joint. Joints are interfaces between two bodies. When a joint or an interface is intended to eliminate all relative motions, or DoF, between two bodies, it is a structural joint. The two bodies interconnected by a structural joint may be referred to as a structural assembly. Examples of structural joints include, but are not limited to, a screwed joint, a bolted joint, a riveted joint, a brazed joint, a welded joint, a glued joint, and the like. When a joint or interface between two bodies is intended to allow one or more DoF(s), the joint is a kinematic joint. Examples of kinematic joints include, but are not limited to, a pin/pivot joint, a slider joint, a universal joint, a ball and socket joint, a flexure joint, and the like.

In all, there are six independent directions along which motions, or DoFs, are possible between two rigid bodies when there is no joint between them: three translations and three rotations. A joint allows anywhere between zero and six DoF(s) between two bodies. For the case when the joint allows zero DoF, this effectively becomes a structural joint as described above. In this case, the two bodies become rigid extensions of each other. While a structural joint is intended to be ideal—i.e., the stiffness of the joint or interface is desired to be infinity—that is never the case. There is always some undesired joint stiffness that leads to parasitic compliance in a structural assembly.

Where a joint allows six DoFs, this effectively means that there is no joint, or that the joint does not constrain any motions between the two bodies. In other words, the motions of the two bodies are entirely independent of each other. Any practical kinematic joint for the purpose of this patent allows one, two, three, four, or five DoF(s) between two bodies. If a joint allows one DoF, then the remaining five possible motions (DoCs) are constrained by the joint. If a joint allows two DoFs, then the remaining four possible motions (DoCs) are constrained by the joint. If a joint allows three DoFs, then the remaining three possible motions (DoCs) are constrained by the joint. If a joint allows four DoFs, then the remaining two possible motions (DoCs) are constrained by the joint. If a joint allows five DoFs, then the remaining one possible motion (DoC) is constrained by the joint.

TABLE 1 below sets forth certain nomenclature as used in this patent:

| | |
|---|---|
| Direction | Upper case |
| | Example: X, Y, Z, $\Theta_x$, $\Theta_y$, $\Theta_z$ directions |
| Motion/Displacement | Lower case |
| | Example: x, y, z, $\theta_x$, $\theta_y$, $\theta_z$ |
| | displacements/translations/rotations |
| Axis | Upper case |
| | Example: X1, X2, X3, Y1, Y2, Y3 axes |

Descriptions of certain embodiments are now presented with references to the figures.

Flexure Mechanism

A mechanism is an assembly of bodies that may be interconnected via interfaces/joints, and serves to offer relative motions (or DoF) between the bodies. In particular, a flexure mechanism is one that has at least one flexible body. Further, a flexure mechanism is one that provides at least some of these relative motions via intentional elastic deformation of one or more of its constituent flexible bodies. A flexure mechanism may also provide all of these relative motions via elastic deformation of its constituent flexible bodies.

In general, while a flexure mechanism can have multiple bodies, two bodies are often identified—a motion stage or body, and a ground stage or body. Typically, relative motions of the motion stage are described with respect to the ground stage. A flexure mechanism employs elastic deformation to provide relative motion between the motion stage and ground stage in one or more motion directions, or DoF; and, provides high stiffness and load bearing capability in the remaining non-motion directions, or bearing directions or DoC. Further, in the context of a mechanism like the flexure mechanism, the ground body or reference ground serves as a kinematic reference for the other bodies. The ground body is not necessarily an absolute ground in the sense that it is attached or bolted for the actual ground, although that is a possibility. The ground body serves as a mechanical reference with respect to which motions of other bodies are described or investigated.

Furthermore, as used herein, there is a certain equivalence among the terms flexure mechanism, flexure module, and flexure joint. All of these can be viewed as allowing certain motion(s) along certain degree(s) of freedom (DoF) between two bodies and constraining the remaining motions. A flexure joint, in particular, can include a single flexible body or a few flexible bodies; a flexure module can include more flexible bodies; and a flexure mechanism generally includes many flexible bodies. Typically, a joint is of simpler construction, a module if more complex and can include multiple joints, and a mechanism can include multiple joints and/or multiple modules.

Figure 5:
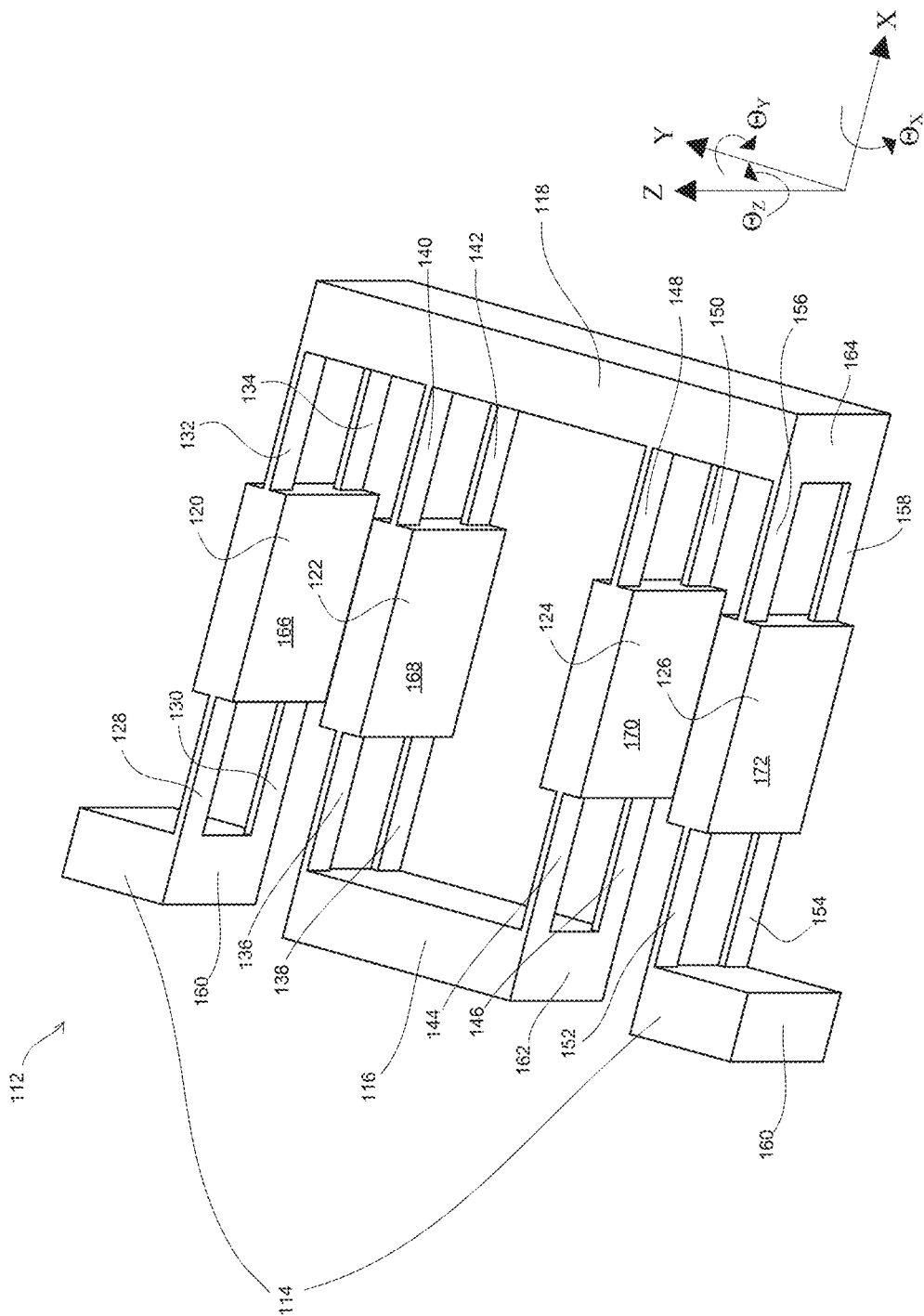
FIG. 5 is a perspective view of an embodiment of a sandwich double parallelogram flexure mechanism (DPFM)

Moreover, what is simple and what is complex depends on context. A mechanism under consideration may appear simple or small in the context of a much larger mechanism, in which case the particular mechanism under consideration may be referred to as a module or even as a joint. For instance, a sandwich double parallelogram flexure mechanism (DPFM), such as that presented in FIG. 5, can be considered a flexure mechanism when taken alone and by itself. But when the sandwich DPFM of FIG. 5 is employed to build a more complex mechanism like a sandwich XY flexure mechanism assembly of FIG. 7, then in that context the sandwich DPFM can be considered a flexure module (i.e., sandwich double parallelogram flexure module).

Ideal Bearing Behavior

Flexure mechanisms are commonly used as bearings to provide guided motion along the associated DoF in various motion control applications. When a flexure mechanism employs only elastic deformation of its accompanying flexible bodies to provide such guided motion, then the flexure mechanism is free of the friction and backlash associated with conventional rolling and sliding joints with sliding guideways or rolling element bearings. Examples of some general applications in which flexure mechanisms are utilized include, but are not limited to, micro-electro mechanical system (MEMS) devices such as actuators and sensors, ultra-precision motions stages for fine alignment and adjustments, scanning probe microscopy and metrology, scanning probe nanolithography, memory storage, hard-drive and semiconductor inspection, semiconductor packaging, biological imaging, and non-contact macro scale actuators and sensors. In these applications as well as others, it is highly desirable to achieve ideal bearing behavior in the flexure mechanisms.

A mechanism employed as a bearing in a motion control application exhibits ideal bearing behavior if it can effect: i) infinite motion and zero constraint (i.e., zero stiffness or resistance) along the motion directions (DoF) and over the entire range of motion in the DoF directions, and ii) zero error motion and infinite constraint (i.e., infinite stiffness or load bearing capability) along the non-motion or bearing directions (DOC) over the entire range of motions in the DoF directions. But a flexure mechanism, it is thought, can never achieve ideal bearing behavior because it produces motion due to the elastic deformation of its flexible/compliant bodies. It is impractical for the flexible/compliant bodies to have zero stiffness (i.e., infinite compliance) in some directions and infinite stiffness (i.e., zero compliance) in the other directions. Therefore, flexure mechanisms will have small but non-zero stiffness along their DoFs and large but finite stiffness along their DoCs. The large but finite stiffness of a flexure mechanism along its DoCs implies small but non-zero motion along its DoCs in the presence of applied force. This motion is referred to as elastic motion along the DoC because it arises due to the finite compliance of the mechanism along its DoCs. Another kind of motion is possible along the DoCs which is attributed to the kinematics of the flexure mechanism (and not its elastic behavior). Such motion is referred to as kinematic motion along the DoC. Apart from the flexible/compliant bodies, there are also rigid bodies in a flexure mechanism. While ideally rigid bodies should have zero compliance (i.e., infinite stiffness), in practice there is always some compliance exhibited by them which is referred to as parasitic compliance (described in more detail below). The parasitic compliance of these rigid bodies leads to further deviation of the flexure mechanisms from the ideal bearing behavior. Accordingly, the aim in flexure mechanism design is to approach ideal bearing behavior, while knowing it can never truly be achieved.

Parasitic Compliance

Rigid bodies are intended to be infinitely stiff in all six directions (i.e., X, Y, Z, $\Theta_x$, $\Theta_y$, $\Theta_z$ directions). But no rigid body can be infinitely stiff in practice. Even supposedly rigid bodies have some small finite compliance. Such unintended and often undesired compliance of the rigid bodies in any direction is referred to as parasitic compliance.

For a flexure mechanism consisting of multiple rigid bodies, there may be two or more rigid bodies that possess the exact same DoFs and DoCs. Certain rigid bodies can be referred to as familial stages. Under the umbrella term familial stages, there are multiple categories:

1) Twin Stages. If two or more familial stages—under quasi static loading along their DoF(s)—have kinematically identical motions, the stages are referred to as twin stages. Corresponding stages in a top layer and a bottom layer of a sandwich DPFM design, for instance, constitute twin stages. For example, top and bottom secondary stages are twin stages in a sandwich DPFM design (e.g., FIG. 5). It has been determined, at least according to certain embodiments, that out of plane inter-stage connections can be connected between twin stages in order to furnish improved static and dynamic performance of the accompanying flexure mechanism. The phrase "out of plane," as used herein with the phrase inter-stage connection(s), is not intended to mean that the inter-stage connection(s) is itself strictly configured out of a particular plane; rather, the phrase "out of plane" is in reference to the stages subject to connection being arranged in different planes or layers with respect to each other. The out of plane rigid inter-stage connections, where employed, provide six degrees of constraint (DOC) in all six directions (i.e., X, Y, Z, $\Theta_x$, $\Theta_y$, $\Theta_z$ directions) between the connected twin stages.

2) Sister Stages. If two or more familial stages—under the same quasi static loading along their DoF(s)—have kinematically compatible motion, the stages are referred to as sister stages. The motion amongst stages is said to be kinematically compatible if they have substantially the same motion along their DoF(s) without a conflict amongst their kinematic motions along their DoC(s). Unlike twin stages, sister stages do not have kinematically identical motion; rather, their motion is kinematically compatible. In a sandwich XY flexure mechanism assembly (e.g., FIG. 7), for instance, the associated intermediate stages are sister stages. When a positive X direction quasi static force is applied at an intermediate stage on one side of the associated motion stage, that intermediate stage as well as the intermediate stage on the opposite side of the motion stage translate in the positive X direction by substantially the same amount. Here, neither intermediate stages have kinematic motion along their DoCs (may still have small elastic motion), and hence there is no possibility of a kinematic conflict arising between their kinematic motions. It has been determined, at least according to certain embodiments, that in-plane rigid inter-stage connections can be connected between sister stages in order to furnish improved static and dynamic performance of the accompanying flexure mechanism. The term "in-plane," as used herein with the phrase inter-stage connection(s), is not intended to mean that the inter-stage connection(s) is itself strictly configured in or along a particular plane; rather, the term in-plane is in reference to the stages subject to connection being arranged in the same plane or layer with respect to each other. The in-plane rigid inter-stage connections, where employed, provide six degrees of constraint (DoC) in all six directions (i.e., X, Y, Z, $\Theta_x$, $\Theta_y$, $\Theta_z$ directions) between the connected sister stages.

3) Cousin Stages. If two or more familial stages—under quasi static loading along their DoF(s)—have substantially the same motion along their DoF(s) with a kinematic conflict along their DoC(s), the stages are referred to as cousin stages.

Referring now to FIG. 1, an embodiment of a sandwich flexure module 10 is presented. The sandwich flexure module 10 employs out of plane rigid inter-stage connections between its twin stages to achieve significantly higher DoC out of plane stiffness in the Z, $\Theta_x$, and $\Theta_y$ directions between its ground and motion stages compared to known prior art flexure mechanism designs. The sandwich flexure module 10 constitutes a building block for constructing more complex flexure mechanisms such as a sandwich parallelogram flexure mechanism (PFM) and a sandwich double parallelogram flexure mechanism (DPFM), both subsequently introduced. In this embodiment, the sandwich flexure module 10 is made-up of two identical flexure modules with reinforced blades spaced apart from each other in the Z direction: a first or upper flexure module 12 and a second or lower flexure module 14. The first flexure module 12, per this embodiment, includes a first ground stage or body 16, a first motion stage or body 18, and a first reinforcement stage or body 20. Similarly, the second flexure module 14 includes a second ground stage or body 22, a second motion stage or body 24, and a second reinforcement stage or body 26. These bodies of the sandwich flexure module 10 are rigid bodies.

Due to a first rigid inter-stage connection 28 extending in the Z direction between the first and second ground stages 16, 22, the three components 16, 22, and 28 constitute a single, monolithic ground stage or body. Here, the first and second ground stages 16, 22 constitute twin stages that exhibit kinematically identical motions. Likewise, due to a second rigid inter-stage connection 30 extending in the Z direction between the first and second motion stages 18, 24, the three components 18, 24, and 30 constitute a single, monolithic motion stage or body. Here, the first and second motion stages 18, 24 constitute twin stages that exhibit kinematically identical motions. And due to a third rigid-inter-stage connection 32 extending in the Z direction between the first and second reinforcement stages 20, 26, the three components 20, 26, and 32 constitute a single, monolithic reinforcement stage or body. Here, the first and second reinforcement stages 20, 26 constitute twin stages that exhibit kinematically identical motions. Furthermore, according to this embodiment of the sandwich flexure module 10, a first flexure blade or body 34 extends between the ground stage and reinforcement stage, a second flexure blade or body 36 extends between the ground stage and reinforcement stage, a third flexure blade or body 38 extends between the motion stage and reinforcement stage, and a fourth flexure blade or body 40 extends between the motion stage and reinforcement stage. In the sandwich flexure module 10, translational motion in the X and Y directions of the motion stage with respect to the ground stage is furnished via the flexure blades. Still, in other embodiments, not all twin stages of the sandwich flexure module 10 need to be connected via out of plane rigid inter-stage connections.

Figure 2A:
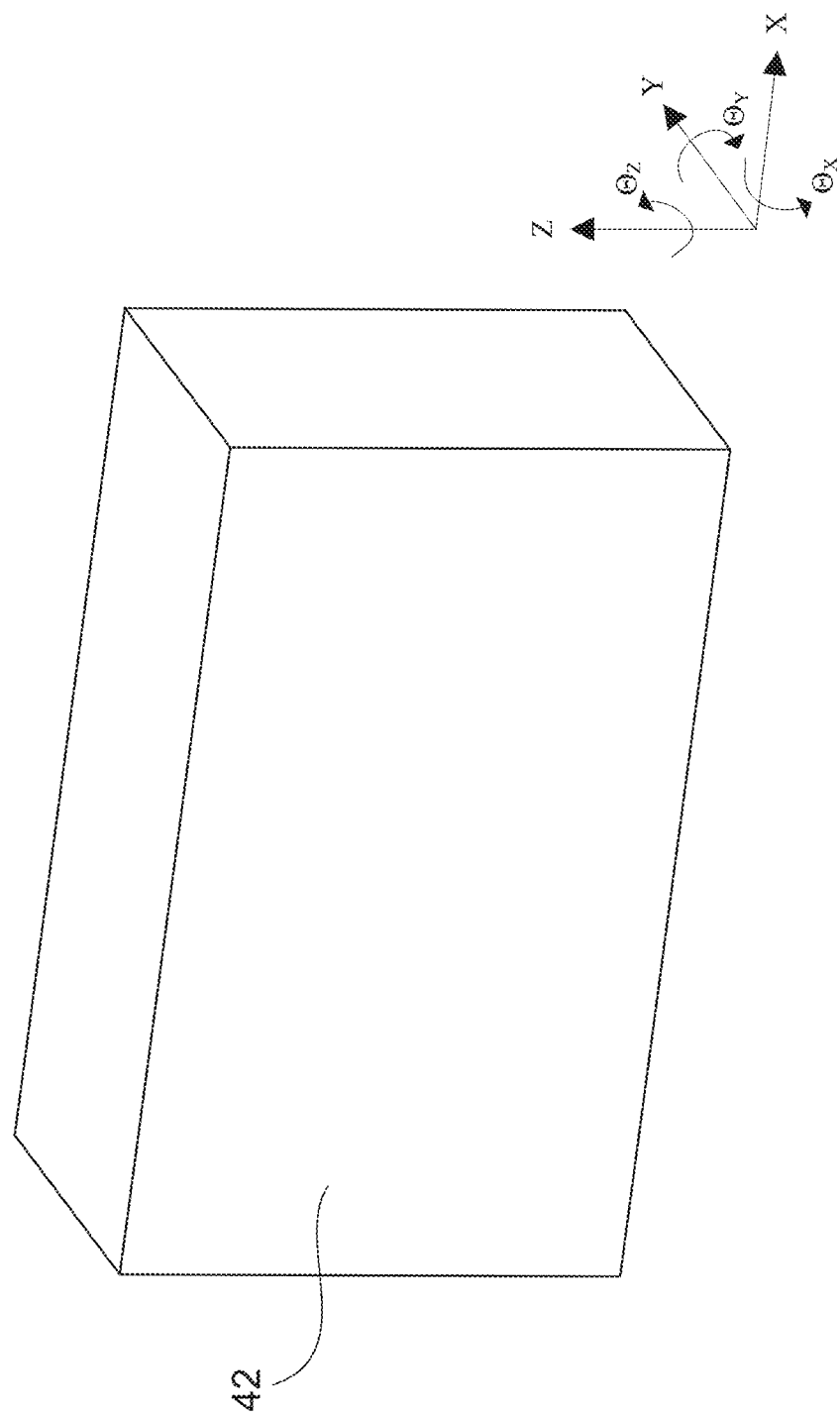
FIG. 2a is a depiction of a step according to an embodiment of a manufacturing method of the sandwich flexure module.
Figure 2B:
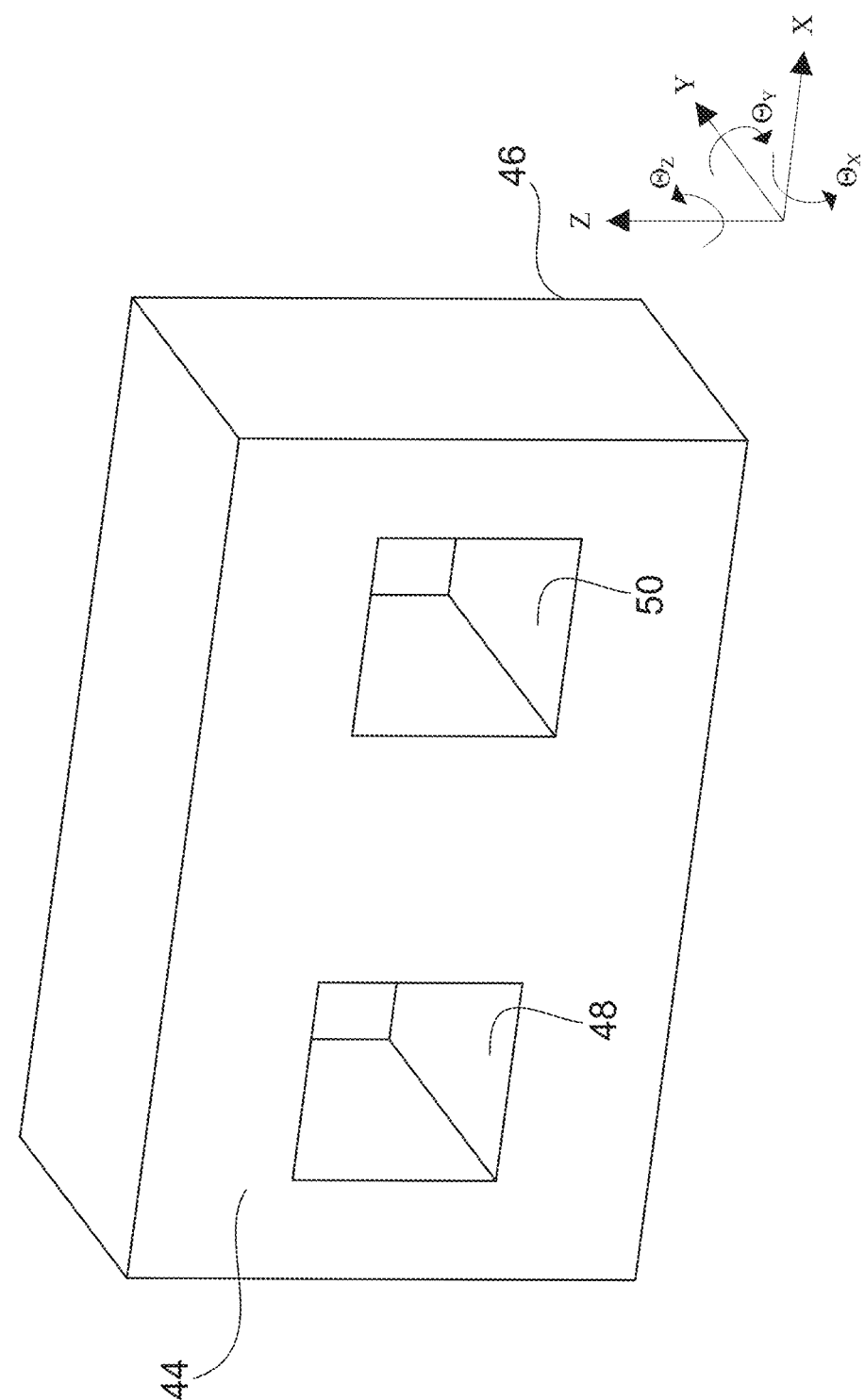
FIG. 2b is a depiction of a step of the manufacturing method of the sandwich flexure module.
Figure 2C:
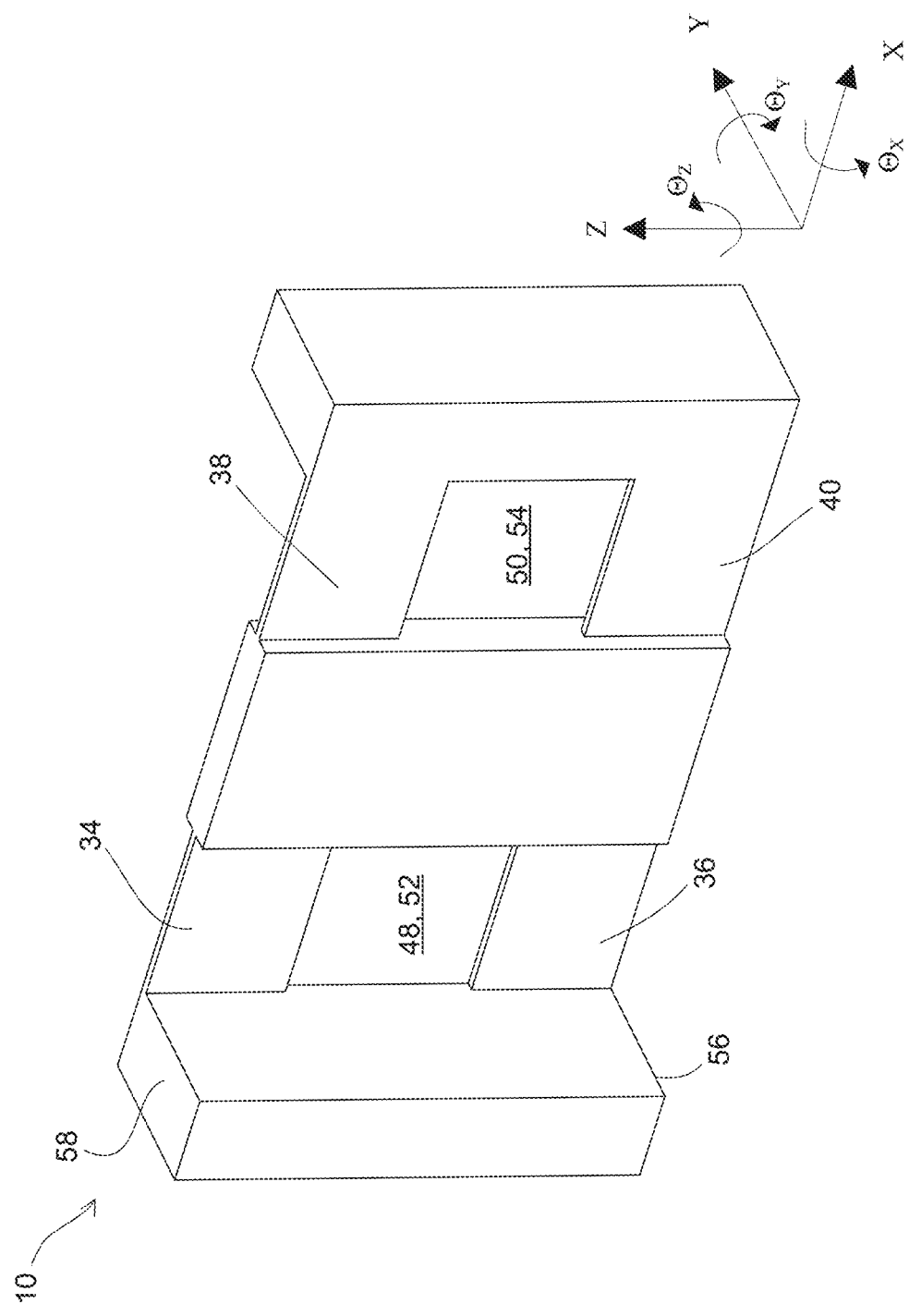
FIG. 2c is a depiction of a step of the manufacturing method of the sandwich flexure module.

With reference now to FIGS. 2a-2c, an embodiment of a method of manufacturing the sandwich flexure module 10 is presented. The method involves two steps that, once completed, yield the sandwich flexure module 10 of monolithic and one-piece construction. The steps can be carried out in an order other than shown in the figures and described herein. The steps involve subtractive manufacturing processes and fabrication. Depending on the desired dimensions and precisions demanded of the ultimately-produced module—among other potential factors—the subtractive manufacturing processes and fabrication can involve one or more of: milling, wire electrical discharge machining (EDM), sinker EDM, laser cutting, and waterjet cutting, as well as other possible manufacturing processes and fabrication techniques. In flexure mechanism applications with increased dimensional precisions, for instance, wire EDM manufacturing processes have been shown to be particularly suitable. The method begins, per this embodiment, with the provision of a solid, one-piece, and unitary block 42. Overall dimensions and extents of the block 42 in the X, Y, and Z directions can correspond to those of the sandwich flexure module 10 for efficiency purposes. The block 42 can be rectangular as shown, or can have another shape. The block 42 can be composed of a metal material including, but not limited to, aluminum, titanium, or steel.

The two steps of the method, according to this embodiment, are discrete processes performed to the block 42 from two directions with respect to the block 42. The directions have an orthogonal relationship with respect to each other. In FIG. 2b, a first subtractive manufacturing process is performed from the Y direction. The first subtractive manufacturing process is carried out via front and rear surfaces 44, 46 of the block 42. A first through-hole 48 and a second through-hole 50 are formed in this first subtractive manufacturing process. The first and second through-holes 48, 50 are rectangular in shape in this embodiment, and span wholly through the block 42 between the front and rear surfaces 44, 46 and establish open ends at the front and rear surfaces 44, 46. The first through-hole 48 establishes a first opening 52 of the sandwich flexure module 10 that resides between the first and second flexure blades 34, 36, as shown in FIG. 2c. The second through-hole 50, similarly, establishes a second opening 54 of the sandwich flexure module that resides between the third and fourth flexure blades 38, 40.

Further, with reference now to FIG. 2c, a second subtractive manufacturing process is performed to the block 42 from the Z direction. In this embodiment, the second subtractive manufacturing process is performed after the first subtractive manufacturing process, and while the block 42 is in an interim state of completion as shown in FIG. 2b with the first and second through-holes 48, 50. But as set forth, the second subtractive process could be performed initially and before the first subtractive process, according to an alternative embodiment. In FIG. 2c, the second subtractive manufacturing process is performed from the Z direction. The second subtractive manufacturing process is carried out via side surfaces 56, 58 of the block 42. In this step, material is removed over the Z direction in order to establish the remaining shapes and structures of the components that make-up the sandwich flexure module 10, namely, the ground stage, motion stage, reinforcement stage, and first, second, third, and fourth flexure blades 34, 36, 38, 40 situated thereamong, as well as the first, second, and third rigid inter-stage connections 28, 30, 32. The second subtractive manufacturing process serves to form the flexure blade pattern. After the second subtractive manufacturing process, formation of the sandwich flexure module 10 is complete and a monolithic construction of all of its components is provided. With the employment of wire EDM manufacturing processes, per an embodiment, two discrete steps from two orthogonal directions furnish the monolithic sandwich flexure module 10 in an efficient and effective manner.

Figure 3:
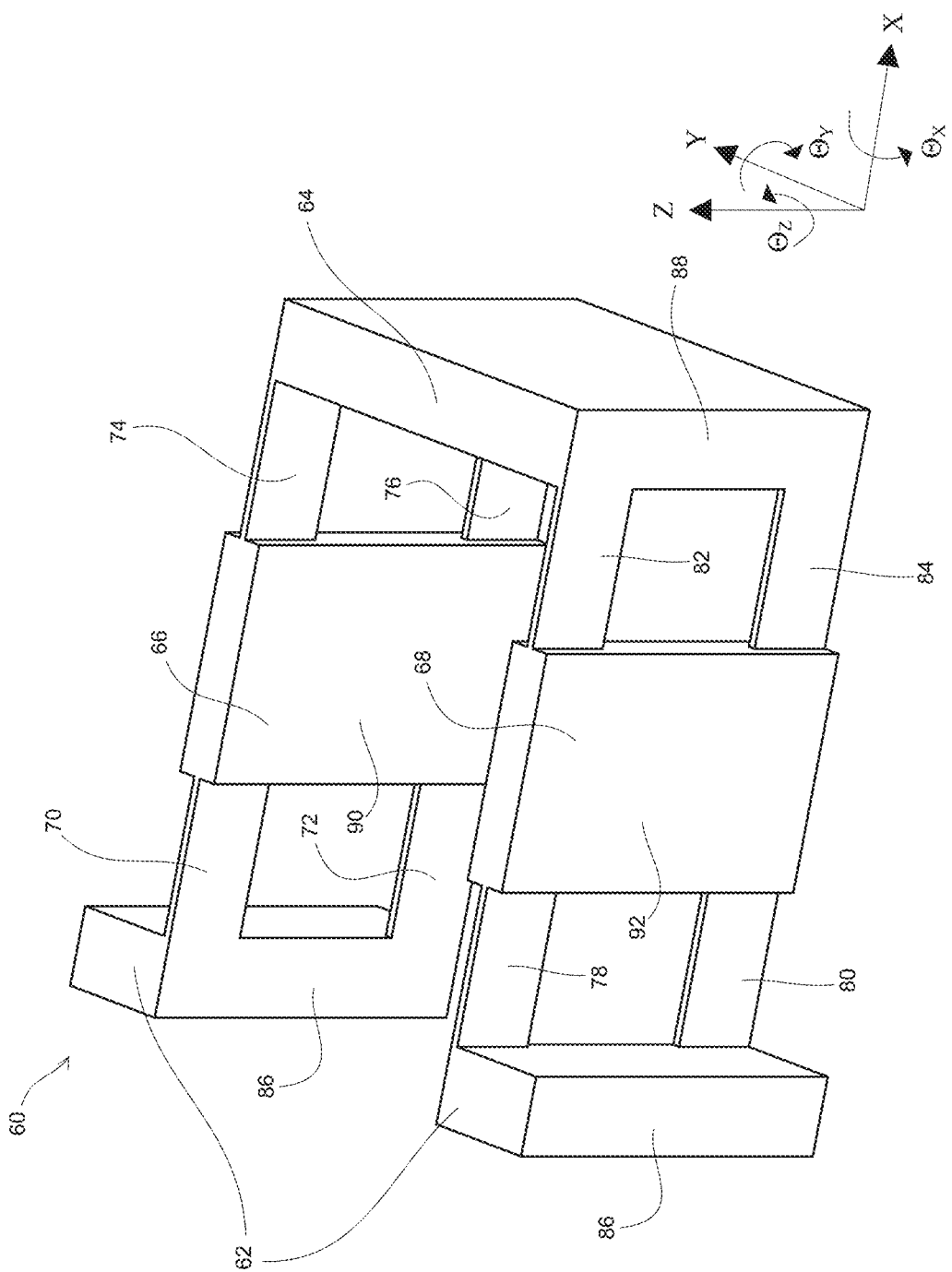
FIG. 3 is a perspective view of an embodiment of a sandwich parallelogram flexure mechanism (PFM)

Turning now to FIG. 3, an embodiment of a sandwich parallelogram flexure mechanism (PFM) module 60 is presented. The sandwich PFM module 60 employs out of plane rigid inter-stage connections to achieve significantly higher DoC out of plane stiffness in the Z, $\Theta_x$, and $\Theta_y$ directions between its ground and motion stages compared to known prior art flexure mechanism designs. The sandwich PFM module 60, per this embodiment, is made-up of two sandwich flexure modules unitarily connected together in a parallel kinematic arrangement, such as the sandwich flexure module 10 of FIG. 1. The sandwich PFM module 60 has a similar monolithic and one-piece construction as described in connection with the sandwich flexure module 10. In this embodiment, the sandwich PFM module 60 includes a ground stage or body 62, a motion stage or body 64, a first reinforcement stage or body 66, a second reinforcement stage or body 68, a first flexure blade or body 70, a second flexure blade or body 72, a third flexure blade or body 74, a fourth flexure blade or body 76, a fifth flexure blade or body 78, a sixth flexure blade or body 80, a seventh flexure blade or body 82, and an eighth flexure blade or body 84. Furthermore, a first rigid inter-stage connection 86 extends in the Z direction at the ground stage 62, a second rigid inter-stage connection 88 extends in the Z direction at the motion stage 64, a third rigid inter-stage connection 90 extends in the Z direction at the first reinforcement stage 66, and a fourth rigid inter-stage connection 92 extends in the Z direction at the second reinforcement stage 68. In the sandwich PFM module 60, translational motion in the X and Y directions of the motion stage 64 with respect to the ground stage 62 is furnished via the flexure blades 70, 72, 74, 76, 78, 80, 82, and 84. Still, in other embodiments, not all twin stages of the sandwich PFM module 60 need to be connected via out of plane rigid inter-stage connections.

Figure 4A:
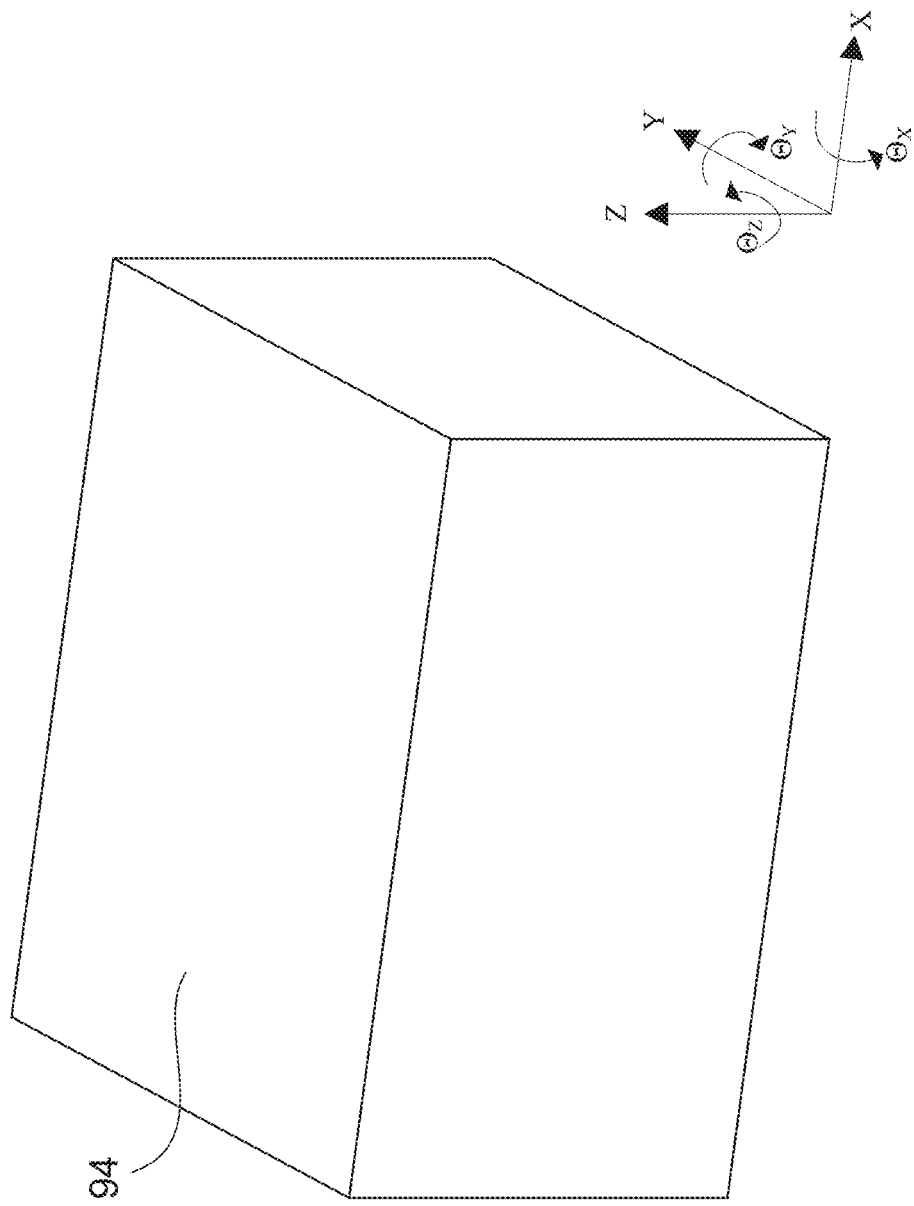
FIG. 4a is a depiction of a step according to an embodiment of a manufacturing method of the sandwich PFM.
Figure 4B:
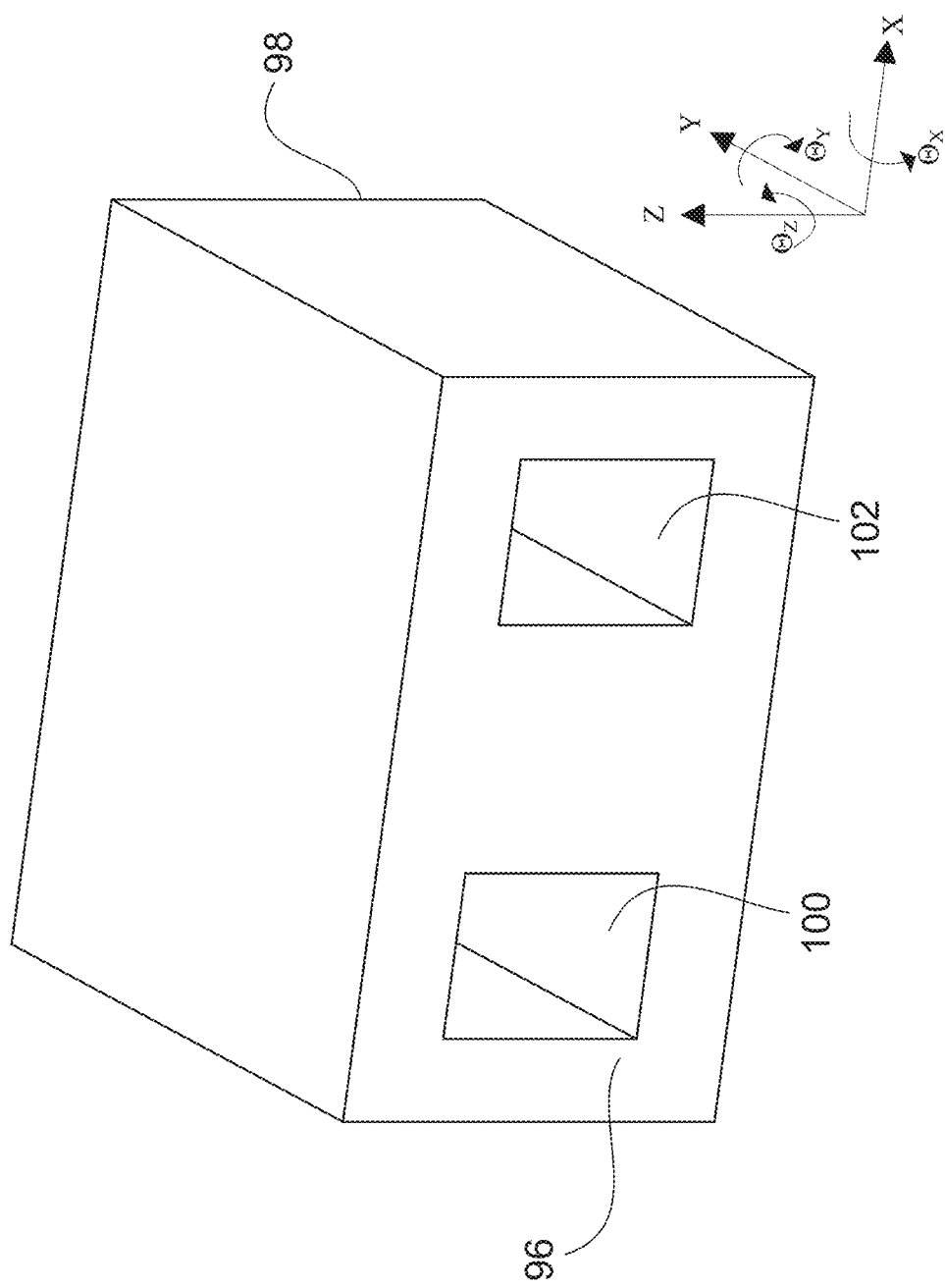
FIG. 4b is a depiction of a step of the manufacturing method of the sandwich PFM.
Figure 4C:
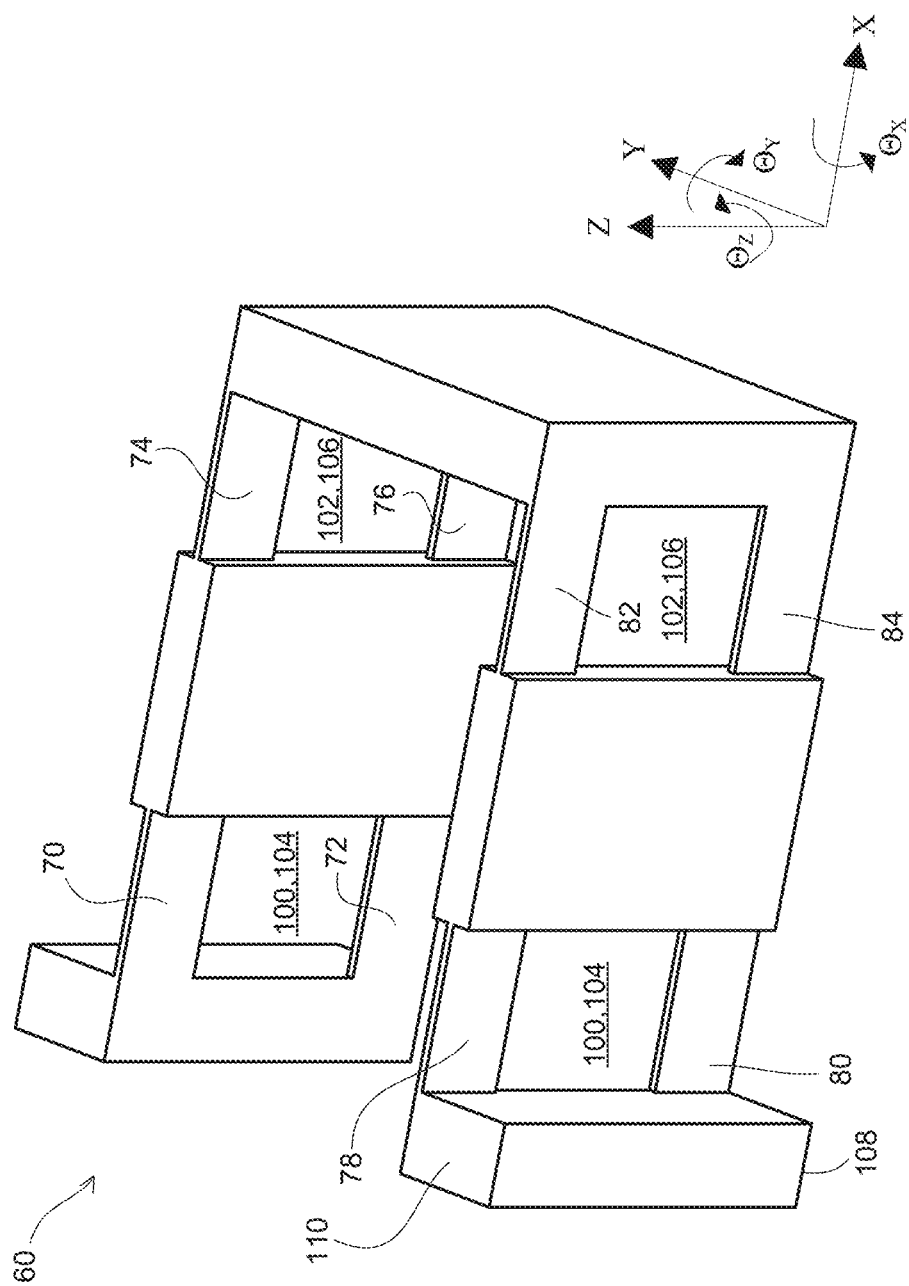
FIG. 4c is a depiction of a step of the manufacturing method of the sandwich PFM.

With reference now to FIGS. 4a-4c, an embodiment of a method of manufacturing the sandwich PFM module 60 is presented. The method of manufacturing the sandwich PFM module 60 is similar to the method of manufacturing the sandwich flexure module 10. The method involves two steps that, once completed, yield the sandwich PFM module 60 of monolithic and one-piece construction. As before, the steps can be carried out in an order other than shown in the figures and described herein, and the steps involve subtractive manufacturing processes and fabrication. Depending on the desired dimensions and precisions demanded of the ultimately-produced PFM—among other potential factors—the subtractive manufacturing processes and fabrication can involve one or more of: milling, wire electrical discharge machining (EDM), sinker EDM, laser cutting, and waterjet cutting, as well as other possible manufacturing processes and fabrication techniques. In flexure mechanism applications with increased dimensional precisions, for instance, wire EDM manufacturing processes have been shown to be particularly suitable. The method begins, per this embodiment, with the provision of a solid, one-piece, and unitary block 94. Overall dimensions and extents of the block 94 in the X, Y, and Z directions can correspond to those of the sandwich PFM module 60 for efficiency purposes. The block 94 can be rectangular as shown, or can have another shape. The block 94 can be composed of a metal material including, but not limited to, aluminum, titanium, or steel.

The two steps of the method, according to this embodiment, are discrete processes performed to the block 94 from two directions with respect to the block 94. The directions have an orthogonal relationship with respect to each other. In FIG. 4b, a first subtractive manufacturing process is performed from the Y direction. The first subtractive manufacturing process is carried out via front and rear surfaces 96, 98 of the block 94. A first through-hole 100 and a second through-hole 102 are formed in this first subtractive manufacturing process. The first and second through-holes 100, 102 are rectangular in shape in this embodiment, and span wholly through the block 94 between the front and rear surfaces 96, 98 and establish open ends at the front and rear surfaces 96, 98. The first through-hole 100 establishes a first opening 104 of the sandwich PFM module 60 that resides between the first and second flexure blades 70, 72 and that resides between the fifth and sixth flexure blades 78, 80, as shown in FIG. 4c. This single through-hole 100 forms the pair of first openings 104 of the flexure blades 70, 72 and 78, 80. The second through-hole 102, similarly, establishes a second opening 106 of the sandwich PFM module 60 that resides between the third and fourth flexure blades 74, 76 and that resides between the seventh and eighth flexure blades 82, 84. Again here, this single second through-hole 102 forms the pair of second openings 106 of the flexure blades 74, 76 and 82, 84.

Further, with reference now to FIG. 4c, a second subtractive manufacturing process is performed to the block 94 from the Z direction. In this embodiment, the second subtractive manufacturing process is performed after the first subtractive manufacturing process, and while the block 94 is in an interim state of completion as shown in FIG. 4b with the first and second through-holes 100, 102. But as set forth, the second subtractive process could be performed initially and before the first subtractive process, according to an alternative embodiment. In FIG. 4c, the second subtractive manufacturing process is performed from the Z direction. The second subtractive manufacturing process is carried out via side surfaces 108, 110 of the block 94. In this step, material is removed over the Z direction in order to establish the remaining shapes and structures of the components that make-up the sandwich PFM module 60, namely, the ground stage 62, motion stage 64, reinforcement stages 66, 68, flexure blades 70-84, and rigid inter-stage connections 86-92. The second subtractive manufacturing process serves to form the flexure blade pattern. After the second subtractive manufacturing process, formation of the sandwich PFM 60 is complete and a monolithic construction of all of its components is provided. With the employment of wire EDM manufacturing processes, per an embodiment, two discrete steps from two orthogonal directions furnish the monolithic sandwich PFM module 60 in an efficient and effective manner.

Turning now to FIG. 5, an embodiment of a sandwich double parallelogram flexure mechanism (DPFM) module 112 is presented. The sandwich DPFM module 112 employs out of plane rigid inter-stage connections to achieve significantly higher DoC out of plane stiffness in the Z, $\Theta_x$, and $\Theta_y$ directions between its ground and motion stages compared to known prior art flexure mechanism designs. The sandwich DPFM module 112, per this embodiment, is made-up of two sandwich PFMs (e.g., sandwich PFM module 60 of FIG. 3) oriented opposite relative to each other and unitarily connected together in a series kinematic arrangement. The sandwich DPFM module 112 has a similar monolithic and one-piece construction as described in connection with the sandwich PFM module 60. In this embodiment, the sandwich DPFM module 112 includes a ground stage or body 114, a motion stage or body 116, a secondary stage or body 118, a first reinforcement stage or body 120, a second reinforcement stage or body 122, a third reinforcement stage or body 124, a fourth reinforcement stage or body 126, a first flexure blade or body 128, a second flexure blade or body 130, a third flexure blade or body 132, a fourth flexure blade or body 134, a fifth flexure blade or body 136, a sixth flexure blade or body 138, a seventh flexure blade or body 140, an eighth flexure blade or body 142, a ninth flexure blade or body 144, a tenth flexure blade or body 146, an eleventh flexure blade or body 148, a twelfth flexure blade or body 150, a thirteenth flexure blade or body 152, a fourteenth flexure blade or body 154, a fifteenth flexure blade or body 156, and a sixteenth flexure blade or body 158. Furthermore, a first rigid inter-stage connection 160 extends in the Z direction at the ground stage 114, a second rigid inter-stage connection 162 extends in the Z direction at the motion stage 116, a third rigid inter-stage connection 164 extends in the Z direction at the secondary stage 118, a fourth rigid inter-stage connection 166 at the first reinforcement stage 120, a fifth rigid inter-stage connection 168 extends in the Z direction at the second reinforcement stage 122, a sixth rigid inter-stage connection 170 extends in the Z direction at the third reinforcement stage 124, and a seventh rigid inter-stage connection 172 extends in the Z direction at the fourth reinforcement stage 126. In the sandwich DPFM module 112, translational motion in the Y direction of the motion stage 116 with respect to the ground stage 114 is furnished via the secondary stage 118 and the flexure blades 128-158. Still, in other embodiments, not all twin stages of the sandwich DPFM module 112 need to be connected via out of plane rigid inter-stage connections.

Figure 6A:
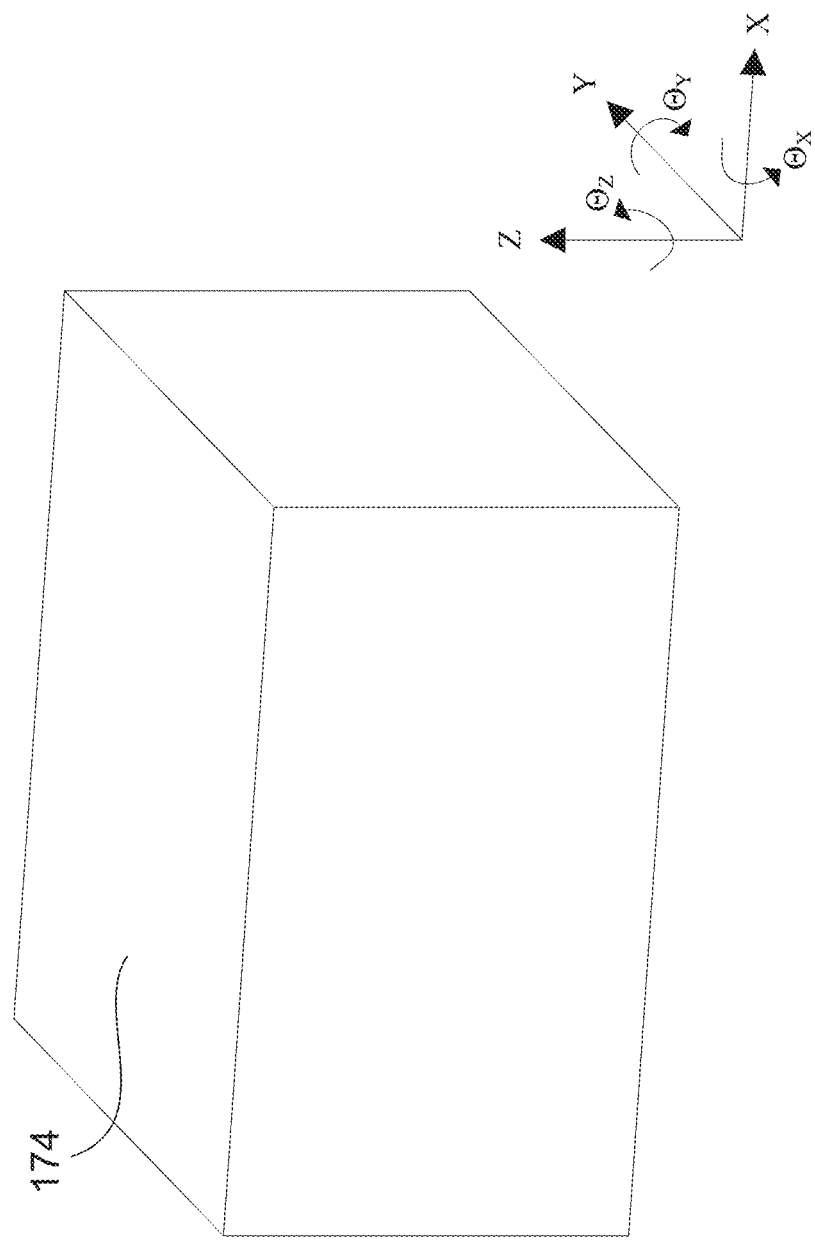
FIG. 6a is a depiction of a step according to an embodiment of a manufacturing method of the sandwich DPFM.
Figure 6B:
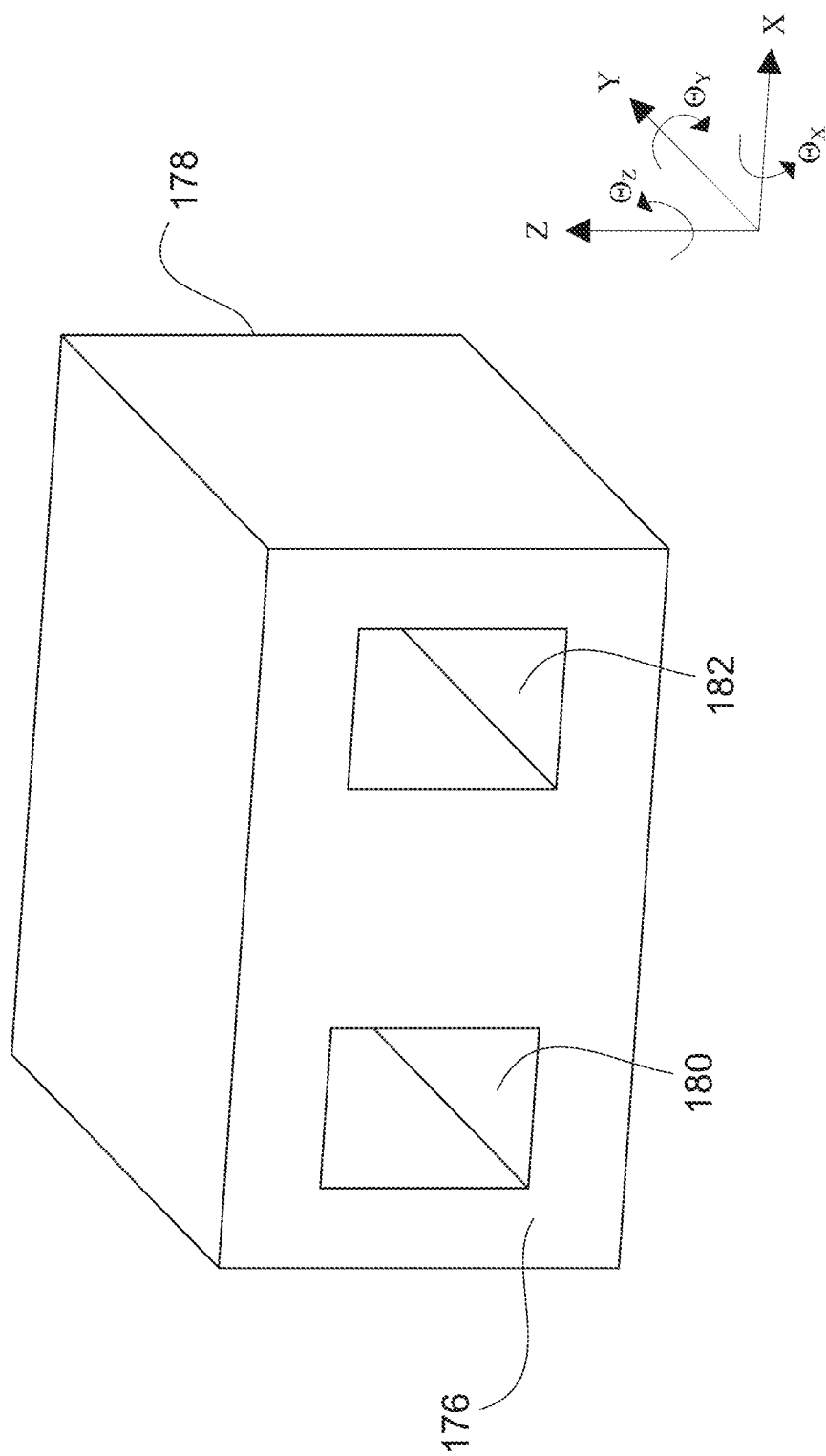
FIG. 6b is a depiction of a step of the manufacturing method of the sandwich DPFM.
Figure 6C:
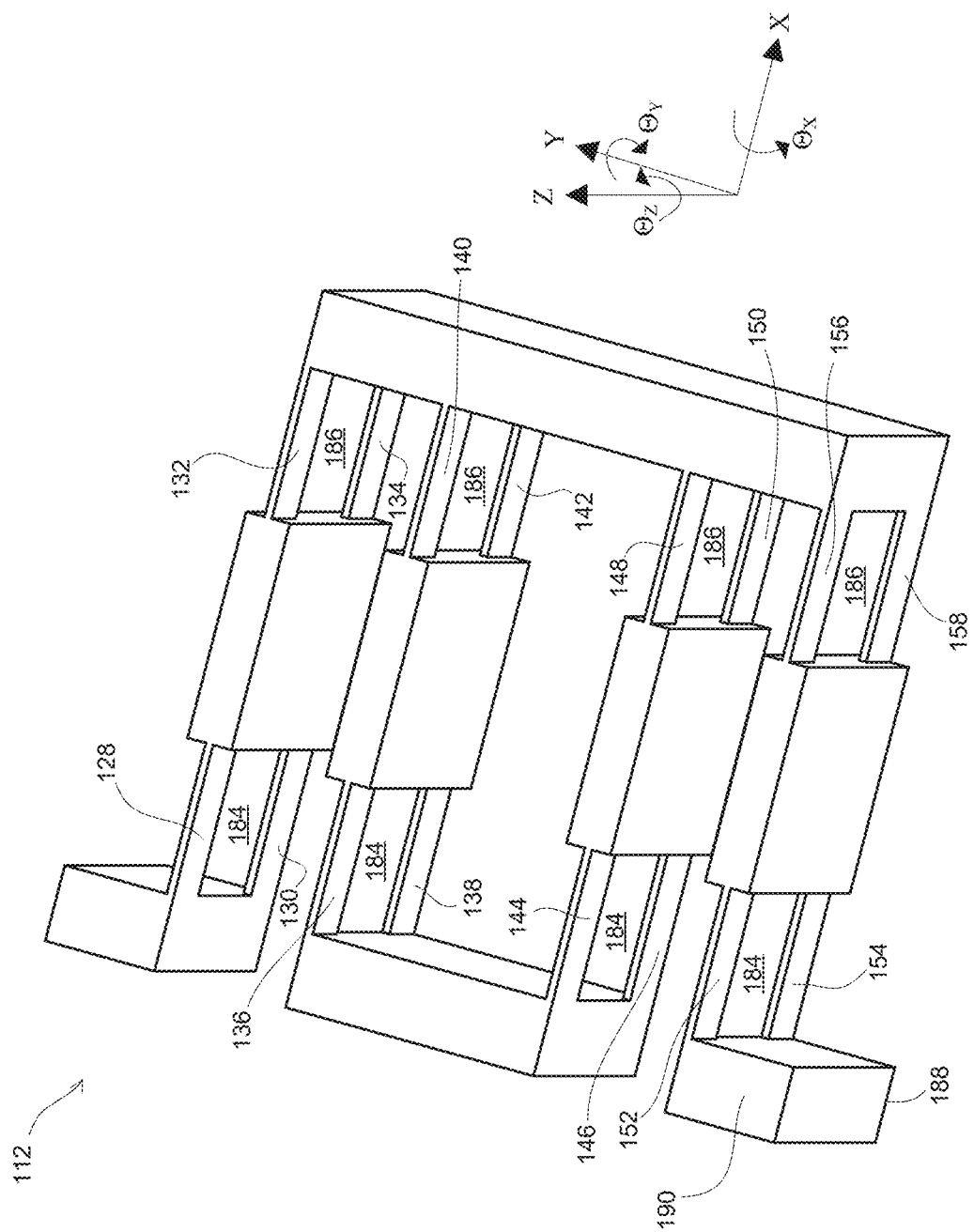
FIG. 6c is a depiction of a step of the manufacturing method of the sandwich DPFM.

With reference now to FIGS. 6a-6c, an embodiment of a method of manufacturing the sandwich DPFM module 112 is presented. The method of manufacturing the sandwich DPFM module 112 is similar to the method of manufacturing the sandwich PFM module 60. The method involves two steps that, once completed, yield the sandwich DPFM module 112 of monolithic and one-piece construction. As before, the steps can be carried out in an order other than shown in the figures and described herein, and the steps involve subtractive manufacturing processes and fabrication. Depending on the desired dimensions and precisions demanded of the ultimately-produced DPFM—among other potential factors—the subtractive manufacturing processes and fabrication can involve one or more of: milling, wire electrical discharge machining (EDM), sinker EDM, laser cutting, and waterjet cutting, as well as other possible manufacturing processes and fabrication techniques. In flexure mechanism applications with increased dimensional precisions, for instance, wire EDM manufacturing processes have been shown to be particularly suitable. The method begins, per this embodiment, with the provision of a solid, one-piece, and unitary block 174. Overall dimensions and extents of the block 174 in the X, Y, and Z directions can correspond to those of the sandwich DPFM module 112 for efficiency purposes. The block 174 can be rectangular as shown, or can have another shape. The block 174 can be composed of a metal material including, but not limited to, aluminum, titanium, or steel.

The two steps of the method, according to this embodiment, are discrete processes performed to the block 174 from two directions with respect to the block 174. The directions have an orthogonal relationship with respect to each other. In FIG. 6b, a first subtractive manufacturing process is performed from the Y direction. The first subtractive manufacturing process is carried out via front and rear surfaces 176, 178 of the block 174. A first through-hole 180 and a second through-hole 182 are formed in this first subtractive manufacturing process. The first and second through-holes 180, 182 are rectangular in shape in this embodiment, and span wholly through the block 174 between the front and rear surfaces 176, 178 and establish open ends at the front and rear surfaces 176, 178. The first through-hole 180 establishes a first opening 184 of the sandwich DPFM module 112 that resides between the first and second flexure blades 128, 130, that resides between the fifth and sixth flexure blades 136, 138, that resides between the ninth and tenth flexure blades 144, 146, and that resides between the thirteenth and fourteenth flexure blades 152, 154, as shown in FIG. 6c. This single first through-hole 180 forms the four first openings 184 of the flexure blades 128, 130; 136, 138; 144, 146; and 152, 154. The second through-hole 182, similarly, establishes a second opening 186 of the sandwich DPFM module 112 that resides between the third and fourth flexure blades 132, 134, that resides between the seventh and eighth flexure blades 140, 142, that resides between the eleventh and twelfth flexure blades 148, 150, and that resides between the fifteenth and sixteenth flexure blades 156, 158, as shown in FIG. 6c. Again here, this single second through-hole 182 forms the four second openings 186 of the flexure blades 132, 134; 140, 142; 148, 150; and 156, 158.

Further, with reference now to FIG. 6c, a second subtractive manufacturing process is performed to the block 174 from the Z direction. In this embodiment, the second subtractive manufacturing process is performed after the first subtractive manufacturing process, and while the block 174 is in an interim state of completion as shown in FIG. 6b with the first and second through-holes 180, 182. But as set forth, the second subtractive process could be performed initially and before the first subtractive process, according to an alternative embodiment. In FIG. 6c, the second subtractive manufacturing process is performed from the Z direction. The second subtractive manufacturing process is carried out via side surfaces 188, 190 of the block 174. In this step, material is removed over the Z direction in order to establish the remaining shapes and structures of the components that make-up the sandwich DPFM module 112, namely, the ground stage 114, motion stage 116, secondary stage 118, reinforcement stages 120-126, flexure blades 128-158, and rigid inter-stage connections 160-172. The second subtractive manufacturing process serves to form the flexure blade pattern. After the second subtractive manufacturing process, formation of the sandwich DPFM module 112 is complete and a monolithic construction of all of its components is provided. With the employment of wire EDM manufacturing processes, per an embodiment, two discrete steps from two orthogonal directions furnish the monolithic sandwich DPFM module 112 in an efficient and effective manner.

Figure 7:
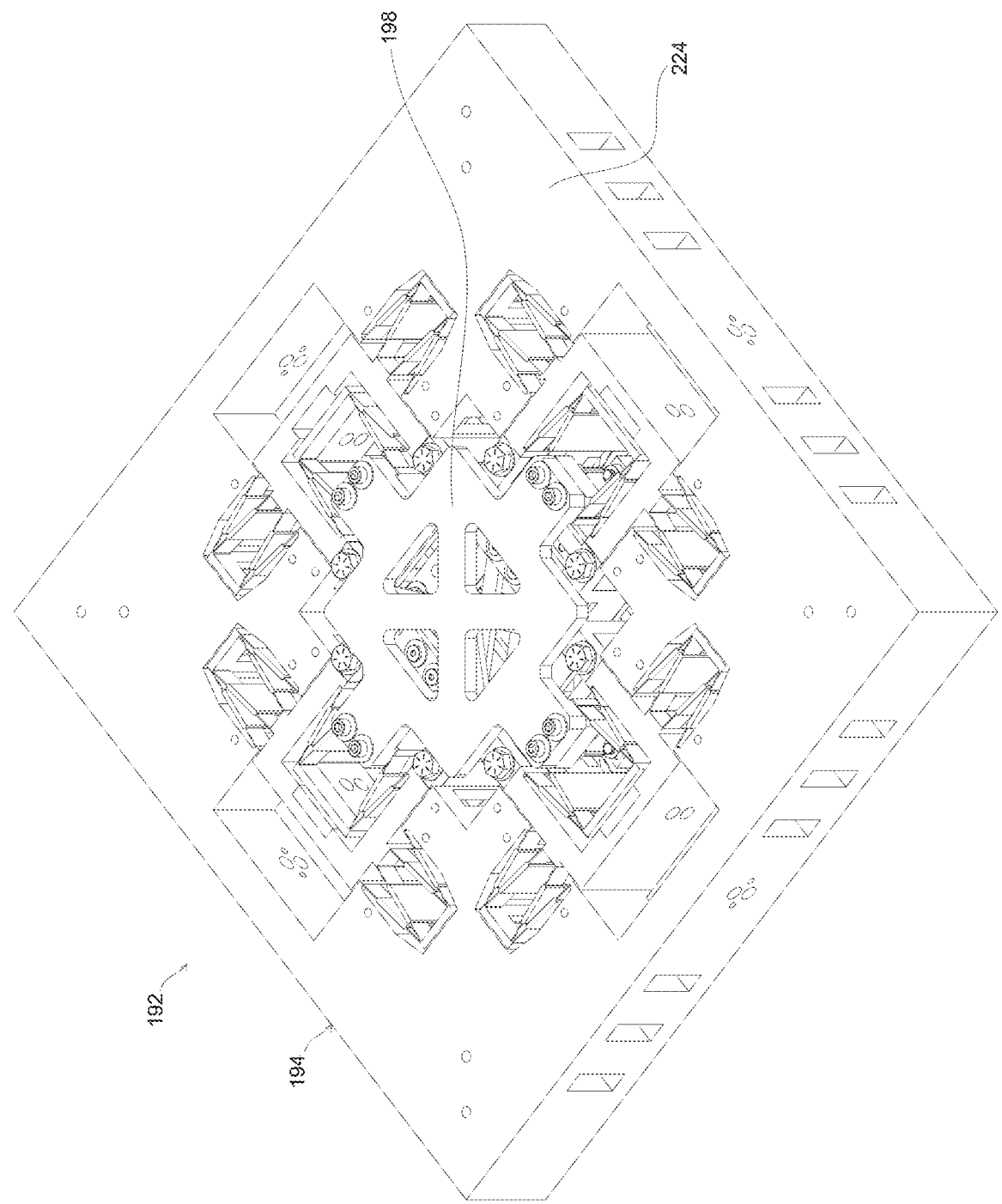
FIG. 7 is a perspective view of an embodiment of a sandwich XY flexure mechanism assembly.

Turning now to FIG. 7, an embodiment of a sandwich XY flexure mechanism assembly 192 is presented. The sandwich XY flexure mechanism assembly 192 is shown with its components fully assembled in the figure. As before, the sandwich XY flexure mechanism assembly 192 employs out of plane rigid inter-stage connections to achieve significantly higher DoC out of plane stiffness in the Z, $\Theta_x$, and $\Theta_y$ directions between its ground and motion stages compared to known prior art flexure mechanism designs. As its main components, the sandwich XY flexure mechanism assembly 192 includes a sandwich module 194 (also called a sandwich flexure module), an interconnect subassembly 196, and a motion stage or body 198 (also called an end effector); still, more, less, and/or different components could be provided in other embodiments. In the sandwich XY flexure mechanism assembly 192, the motion stage 198 has two degrees of freedom (DoF) with respect to its ground stage (introduced below) of the sandwich XY flexure mechanism assembly 192. In the embodiment of the figures, the DoF of the motion stage 198 relative to the ground stage are in the X direction and the Y direction.

Figure 8:
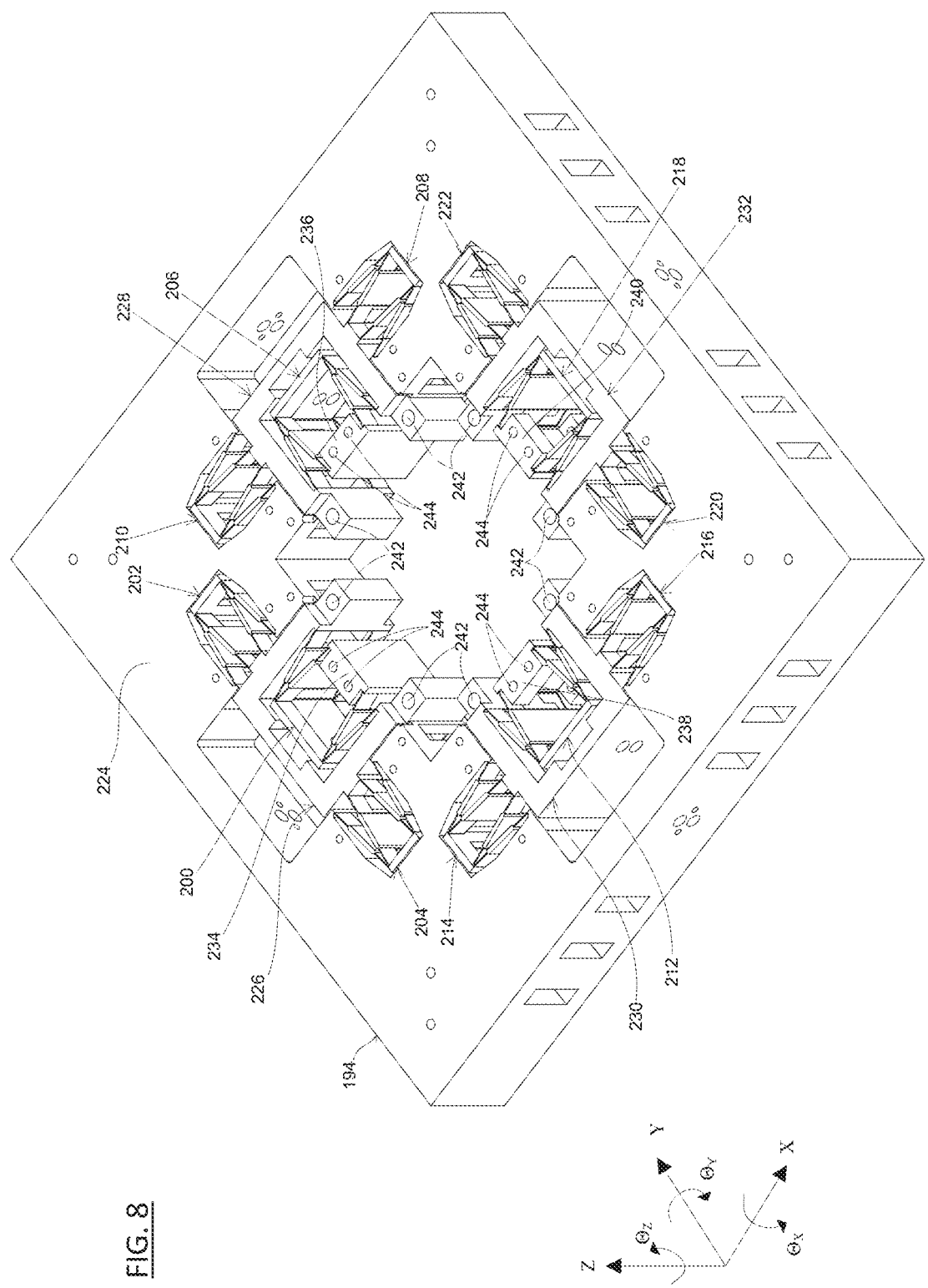
FIG. 8 is a perspective view of an embodiment of a sandwich module of the sandwich XY flexure mechanism assembly.

The sandwich module 194 is depicted in isolation in FIG. 8. The sandwich module 194 can have various designs, constructions, and components in varying embodiments. The sandwich module 194 employs out of plane rigid inter-stage connections between its twin stages to achieve significantly higher DoC out of plane stiffness in the Z, $\Theta_x$, and $\Theta_y$ directions between its ground and motion stages compared to known prior art flexure mechanism designs. In the embodiment of the figures, all twin stages of the sandwich module 194 are connected together via out of plane rigid inter-stage connections; but in other embodiments not all twin stages need connection via out of plane rigid inter-stage connections, and instead only one or some twin stages of the sandwich module 194 could be connected together via one or more out of plane rigid inter-stage connections. In this embodiment, the sandwich module 194 is made-up of four submodules of similar design and construction. As described in connection with previous embodiments, the sandwich module 194 has a monolithic and one-piece construction. Of the four submodules, per this embodiment, each submodule includes three sandwich DPFMs, for a total of twelve sandwich DPFMs in the sandwich module 194 and in the sandwich XY flexure mechanism assembly 192; still, other quantities of sandwich DPFMs are possible in other embodiments such as six DPFMs, eight DPFMs, ten DPFMs, sixteen DPFMs, twenty-four DPFMs, as well as other quantities. At each submodule and among the three DPFMs, one of the DPFMs constitutes an inner DPFM, while the other two DPFMs constitute peripheral DPFMs, according to this embodiment of the sandwich module 194. The sandwich module 194 therefore includes a first inner DPFM 200, a first peripheral DPFM 202, a second peripheral DPFM 204, a second inner DPFM 206, a third peripheral DPFM 208, a fourth peripheral DPFM 210, a third inner DPFM 212, a fifth peripheral DPFM 214, a sixth peripheral DPFM 216, a fourth inner DPFM 218, a seventh peripheral DPFM 220, and an eighth peripheral DPFM 222. Each DPFM of the sandwich module 194 can resemble the sandwich DPFM module 112 of FIG. 5, except with flexure blades and reinforcement stages in a tilted configuration as shown in FIG. 8; still, the DPFMs could have the flexure blades and reinforcement stages of FIG. 5 with a straightened configuration. Moreover, the DPFMs of the sandwich module 194 can have designs and constructions that resemble one another, as shown in FIG. 8, or could have designs and constructions that differ with respect to one another. Furthermore, the sandwich module 194 includes a ground stage or body 224, a first intermediate stage or body 226, a second intermediate stage or body 228, a third intermediate stage or body 230, and a fourth intermediate stage or body 232.

Each of the first, second, third, and fourth inner DPFMs 200, 206, 212, 218 serves as a flexure joint between respective first, second, third, and fourth inner stages or bodies 234, 236, 238, 240 and respective first, second, third, and fourth intermediate stages 226, 228, 230, 232. The inner DPFMs permit motion of their respective inner stages with respect to the respective intermediate stages along the associated degree of freedom. Taking the first inner DPFM 200 as an example, the first inner DPFM 200 provides Y-direction displacement of the first inner stage 234 with respect to the first intermediate stage 226, and constrains the remaining five directions (i.e., X, Z, $\Theta_x$, $\Theta_y$, $\Theta_z$ directions) of the first inner stage 234 relative to the first intermediate stage 226. Furthermore, the peripheral DPFMs 202, 204, 208, 210, 214, 216, 220, 222 serve as flexure joints between respective intermediate stages 226, 228, 230, 232 and the ground stage 224. The peripheral DPFMs permit motion of their respective intermediate stages with respect to the ground stage. Taking the first and second peripheral DPFMs 202, 204 as an example, the first and second peripheral DPFMs 202, 204 provide X-direction displacement of the first intermediate stage 226 with respect to the ground stage 224, and constrains the remaining five directions (i.e., Y, Z, $\Theta_x$, $\Theta_y$, $\Theta_z$ directions) of the first intermediate stage 226 relative to the ground stage 224.

With continued reference to FIG. 8 and according to this embodiment, for securing the interconnect subassembly 196 to the first, second, third, and fourth intermediate stages 226, 228, 230, 232, thru-holes 242 reside in the intermediate stages to accommodate a bolt and nut fastening. Still, in other embodiments, other techniques and components of securement are possible. Similarly, according to this embodiment, for securing the motion stage 198 to the first, second, third, and fourth inner stages 234, 236, 238, 240, thru-holes 244 reside in the inner stages to accommodate a bolt and nut fastening. Still, in other embodiments, other techniques and components of securement are possible.

Figure 9A:
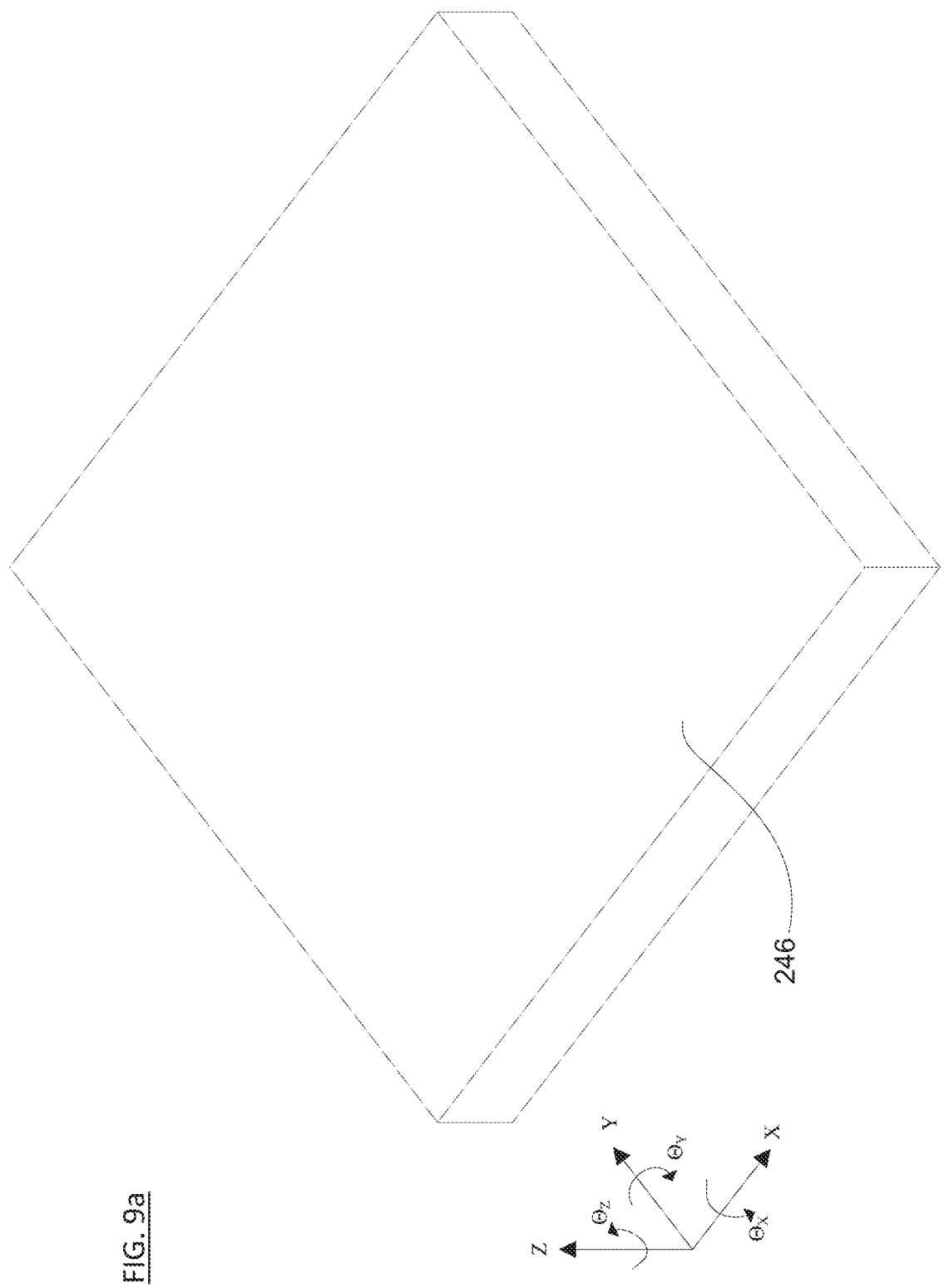
FIG. 9a is a depiction of a step according to an embodiment of a manufacturing method of the sandwich module.
Figure 9B:
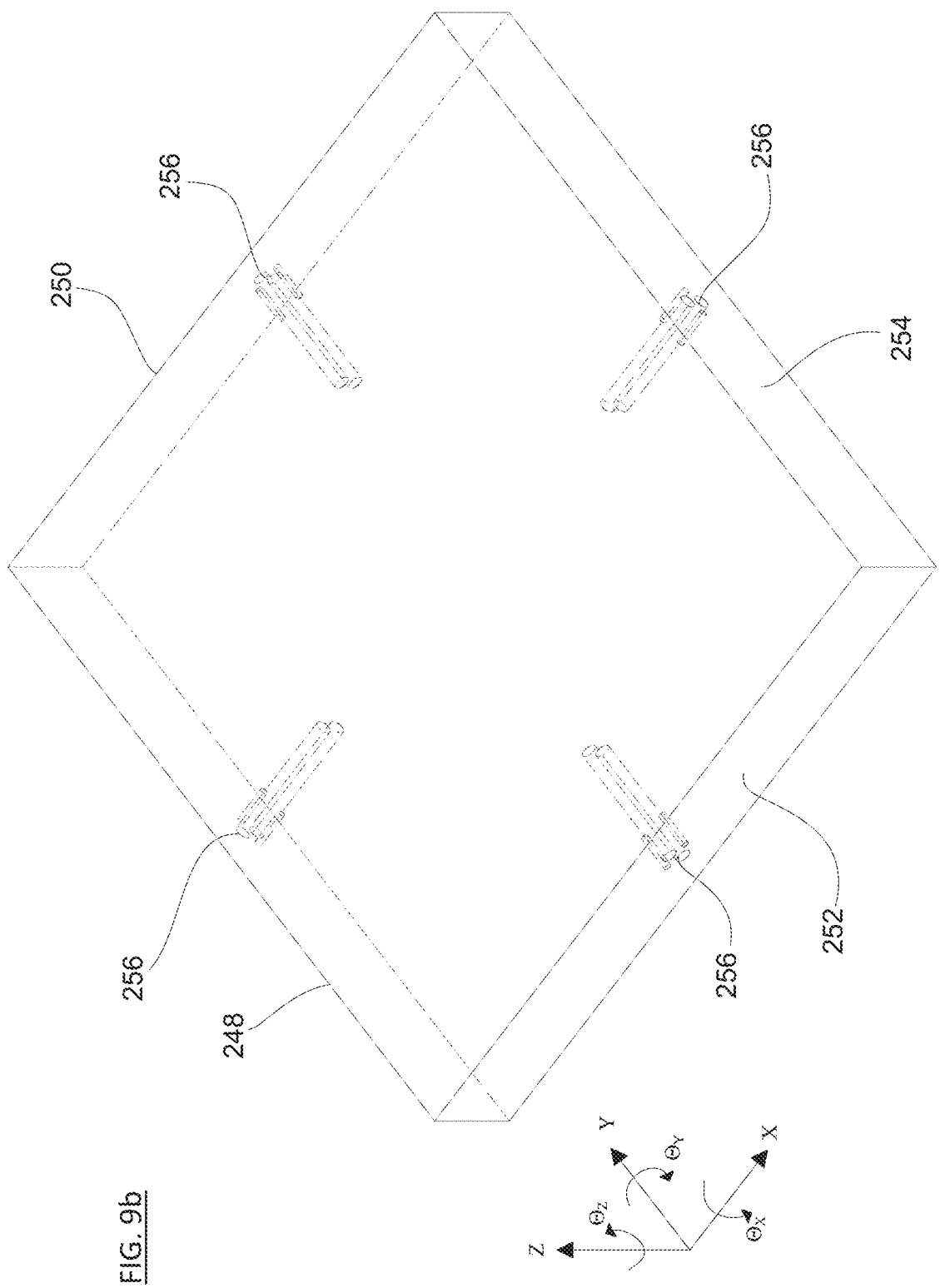
FIG. 9b is a depiction of a step of the manufacturing method of the sandwich module.
Figure 9C:
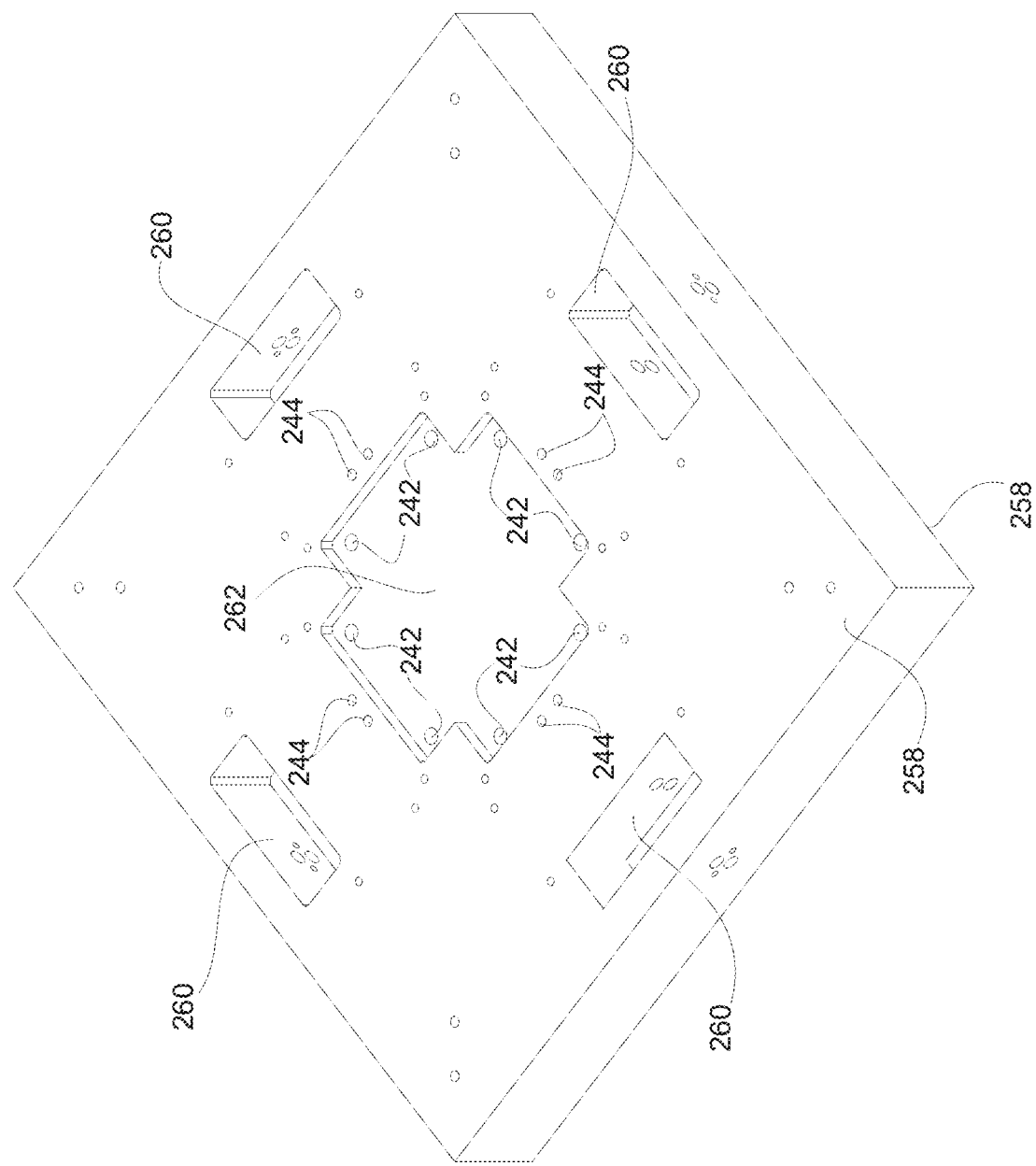
FIG. 9c is a depiction of a step of the manufacturing method of the sandwich module.

With reference now to FIGS. 9a-9c, an embodiment of a method of manufacturing the sandwich module 194 is presented. The method of manufacturing the sandwich module 194 is similar to the method of manufacturing the sandwich DPFM module 112. The method involves four steps that, once completed, yield the sandwich module 194 of monolithic and one-piece construction. As before, the steps can be carried out in an order other than shown in the figures and described herein, and the steps involve subtractive manufacturing processes and fabrication. Depending on the desired dimensions and precisions demanded of the ultimately-produced DPFM—among other potential factors—the subtractive manufacturing processes and fabrication can involve one or more of: milling, wire electrical discharge machining (EDM), sinker EDM, laser cutting, and waterjet cutting, as well as other possible manufacturing processes and fabrication techniques. In flexure mechanism applications with increased dimensional precisions, for instance, wire EDM manufacturing processes have been shown to be particularly suitable. The method begins, per this embodiment, with the provision of a solid, one-piece, and unitary block 246. Overall dimensions and extents of the block 246 in the X, Y, and Z directions can correspond to those of the sandwich module 194 for efficiency purposes. The block 246 can be shaped as a square as shown, or can have another shape. The block 246 can be composed of a metal material including, but not limited to, aluminum, titanium, or steel.

The steps of the method, according to this embodiment, are discrete processes performed to the block 246 from three directions (i.e., X, Y, and Z directions) with respect to the block 246. The directions have an orthogonal relationship with respect to one another. In FIG. 9b, a first subtractive manufacturing process is performed from the X and Y directions. The first subtractive manufacturing process is carried out via first, second, third, and fourth side surfaces 248, 250, 252, 254 of the block 246. In this embodiment, a multitude of blind holes 256 clustered together are formed at each of the first, second, third, and fourth side surfaces 248, 250, 252, 254 in the first subtractive manufacturing process. The blind holes 256 accept bolts amid a subsequent assembly step for securing actuator components to the sandwich module 194. In particular, per this embodiment, bolts are inserted in two of the blind holes 256 for securing actuator movers (introduced below) to the subsequently-formed intermediate stages 226, 228, 230, 232, and bolts are inserted in the remaining two blind holes 256 for securing actuator stators (introduced below) to the ground stage 224.

Further, with reference now to FIG. 9c, a second subtractive manufacturing process is performed to the block 246 from the Z direction. In this embodiment, the second subtractive manufacturing process is performed after the first subtractive manufacturing process, and while the block 246 is in an interim state of completion as shown in FIG. 9b. But as set forth, the second subtractive process could be performed at another time in the overall method of manufacturing the sandwich module 194, according to an alternative embodiment. In FIG. 9c, the second subtractive manufacturing process is performed from the Z direction. The second subtractive manufacturing process is carried out via upper and lower surfaces 258 of the block 246. In this step, material is removed over the Z direction in order to establish or partly establish certain shapes and structures of the components that make-up the sandwich module 194, namely, actuator pockets 260, an interconnect recess 262, the thru-holes 242 at the intermediate stages 226, 228, 230, 232, and the thru-holes 244 at the inner stages 234, 236, 238, 240. The actuator pockets 260, four in total per this embodiment, serve to accommodate reception of the actuator components (i.e., stators and movers), as set forth below. The interconnect recess 262 is a depression at this interim state, and approximates the overall size of the interconnect subassembly 196, per this embodiment.

Figure 9D:
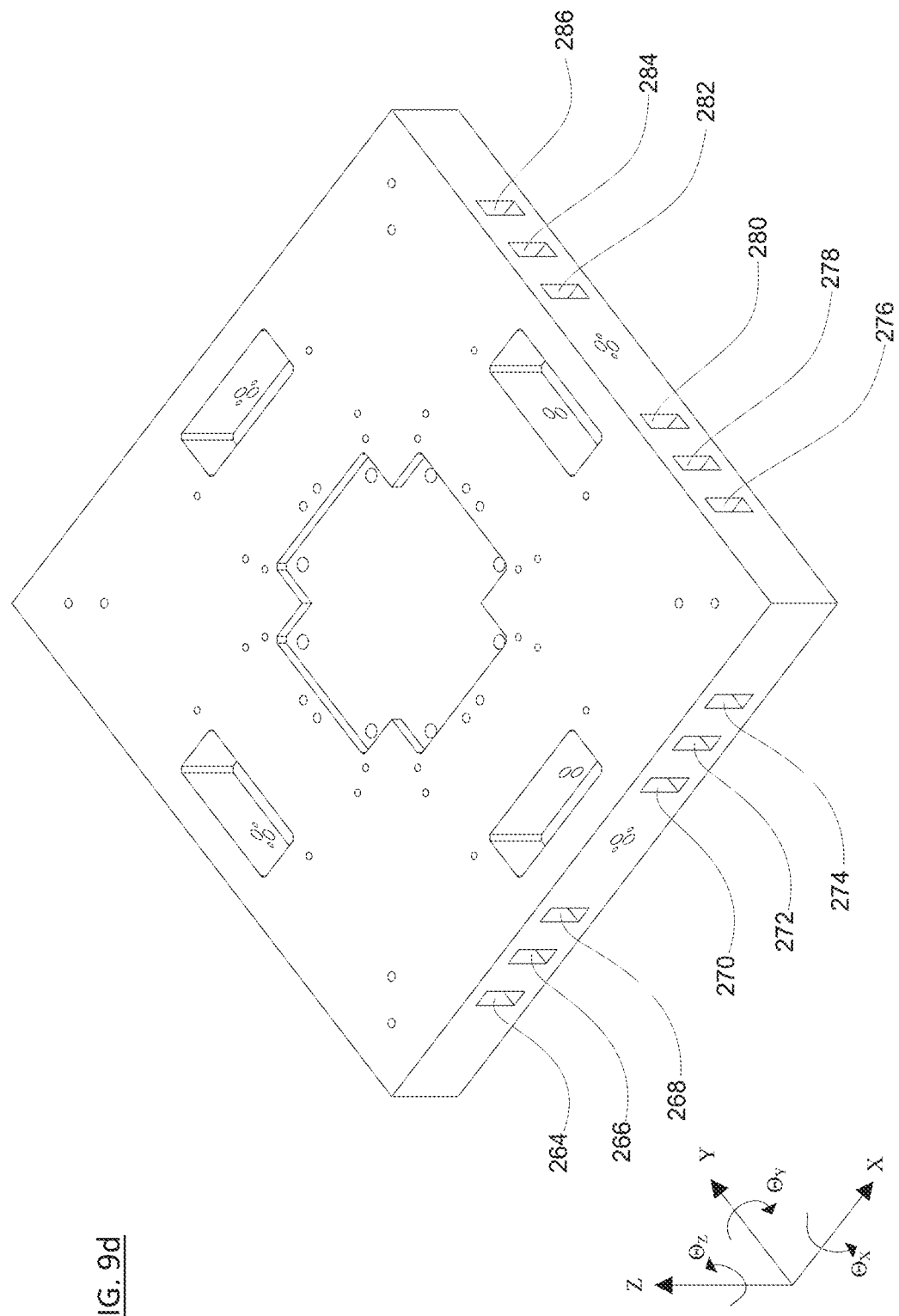
FIG. 9d is a depiction of a step of the manufacturing method of the sandwich module.
Figure 9E:
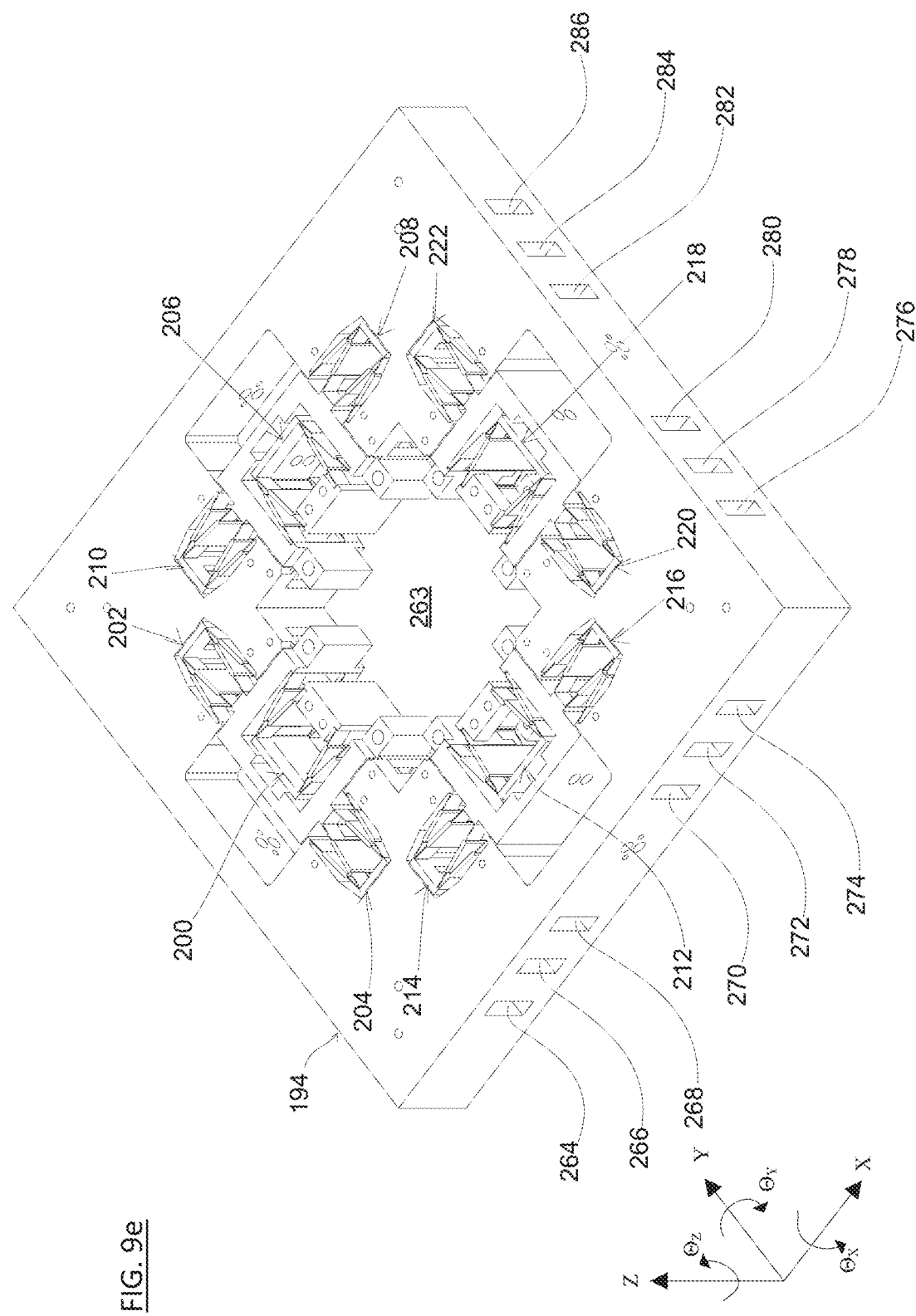
FIG. 9e is a depiction of a step of the manufacturing method of the sandwich module.

Further, with reference now to FIG. 9d, a third subtractive manufacturing process is performed to the block 246 from the X and Y directions. In this embodiment, the third subtractive manufacturing process is performed after the second subtractive manufacturing process, and while the block 246 is in an interim state of completion as shown in FIG. 9c. But as set forth, the third subtractive process could be performed at another time in the overall method of manufacturing the sandwich module 194, according to an alternative embodiment. In FIG. 9d, the third subtractive manufacturing process is performed from the X and Y directions. The third subtractive manufacturing process is carried out via the first, second, third, and fourth side surfaces 248, 250, 252, 254 of the block 246. In this step, material is removed over the X and Y directions in order to establish or partly establish certain shapes and structures of the components that make-up the sandwich module 194. A first set of through-holes and a second set of through-holes are formed in this third subtractive manufacturing process. The first set of through-holes, according to this embodiment, includes six individual rectangular-shaped through-holes that span wholly through the block 246 between the second and third side surfaces 250, 252 in the Y direction: a first through-hole 264, a second through-hole 266, a third through-hole 268, a fourth through-hole 270, a fifth through-hole 272, and a sixth through-hole 274. Similarly, the second set of through-holes, according to this embodiment, includes six individual rectangular-shaped through-holes that span wholly through the block 246 between the first and fourth side surfaces 248, 254 in the X direction: a seventh through-hole 276, an eighth through-hole 278, a ninth through-hole 280, a tenth through-hole 282, an eleventh through-hole 284, and a twelfth through-hole 286.

The through-holes establish openings that reside between flexure blades of the inner and peripheral DPFMs of the sandwich module 194. Certain inner and peripheral DPFMs of certain submodules of the sandwich module 194 are arranged and positioned relative to one another such that certain through-holes establish the openings of these inner and peripheral DPFMs. This has been shown to facilitate formation of the inner and peripheral DPFMs and overall manufacture of the sandwich module 194. For example, according to this embodiment, the first inner DPFM 200, fourth peripheral DPFM 210, and fifth peripheral DPFM 214 are arranged and positioned relative to one another such that the first, second, and third through-holes 264, 266, 268 establish the openings that reside between flexure blades of the first inner DPFM 200, fourth peripheral DPFM 210, and fifth peripheral DPFM 214. Likewise, in this embodiment, the fourth inner DPFM 218, third peripheral DPFM 208, and sixth peripheral DPFM 216 are arranged and positioned relative to one another such that the fourth, fifth, and sixth through-holes 270, 272, 274 establish the openings that reside between flexure blades of the fourth inner DPFM 218, third peripheral DPFM 208, and sixth peripheral DPFM 216. Further, the third inner DPFM 212, second peripheral DPFM 204, and seventh peripheral DPFM 220 are arranged and positioned relative to one another such that the seventh, eighth, and ninth through-holes 276, 278, 280 establish the openings that reside between flexure blades of the third inner DPFM 212, second peripheral DPFM 204, and seventh peripheral DPFM 220. Lastly, in this embodiment, the second inner DPFM 206, first peripheral DPFM 202, and eighth peripheral DPFM 222 are arranged and positioned relative to one another such that the tenth, eleventh, and twelfth through-holes 282, 284, 286 establish the openings that reside between flexure blades of the second inner DPFM 206, first peripheral DPFM 202, and eighth peripheral DPFM 222.

Lastly, with reference now to FIG. 9c, a fourth subtractive manufacturing process is performed to the block 246 from the Z direction. In this embodiment, the fourth subtractive manufacturing process is performed after the third subtractive manufacturing process, and while the block 246 is in an interim state of completion as shown in FIG. 9d. But as set forth, the fourth subtractive process could be performed at another time in the overall method of manufacturing the sandwich module 194, according to an alternative embodiment. In FIG. 9c, the fourth subtractive manufacturing process is performed from the Z direction. The fourth subtractive manufacturing process is carried out via upper and lower surfaces 258 of the block 246. In this step, material is removed over the Z direction in order to establish or partly establish certain shapes and structures of the components that make-up the sandwich module 194, namely: the first, second, third, and fourth inner DPFMs 200, 206, 212, 218; the first, second, third, fourth, fifth, sixth, seventh, and eighth peripheral DPFMs 202, 204, 208, 210, 214, 216, 220, 222; the first, second, third, and fourth intermediate stages 226, 228, 230, 232; and the first, second, third, and fourth inner stages 234, 236, 238, 240. Further, an interconnect opening 263 is formed in this step for accepting reception of the interconnect subassembly 196 in a subsequent procedure and step. After the fourth subtractive manufacturing process, formation of the sandwich module 194 is complete and a monolithic construction of all of its components is provided. The fourth subtractive manufacturing process, hence, constitutes the final step per this embodiment of the overall method of manufacturing the sandwich module 194. With the employment of wire EDM manufacturing processes, per an embodiment, four discrete steps from three orthogonal directions (i.e., X, Y, and Z directions) furnish the monolithic sandwich module 194 in an efficient and effective manner.

Turning now to FIG. 10, an embodiment of a first interconnect bar 288 of the interconnect subassembly 196 is presented in isolation. Still, the interconnect subassembly 196 can have various designs, constructions, and components in varying embodiments. The first interconnect bar 288 can have various designs and constructions in varying embodiments. According to the arrangement in this embodiment, the first interconnect bar 288 is intended for assembly and installation in the Y direction in the sandwich XY flexure mechanism assembly 192 and with respect thereto. There is a total of two first interconnect bars 288 in the interconnect subassembly 196, according to this embodiment. The first interconnect bars 288 serve as in-plane rigid inter-stage connections in the sandwich XY flexure mechanism assembly 192 that provides improved static and dynamic performance thereof. Since the second and third intermediate stages 228, 230 constitute sister stages that exhibit kinematically compatible motion in this embodiment, the first interconnect bars 288 connect the second and third intermediate stages 228, 230 together and extend in the Y direction therebetween. It has been found that such first interconnect bars 288 serving as in-plane rigid inter-stage connections can be employed without increasing the X direction DoF stiffness of the motion stage 198 with respect to the ground stage 224, and likewise without increasing the Y direction DoF stiffness of the motion stage 198 with respect to the ground stage 224. Moreover, it has been found that such first interconnect bars 288 serving as in-plane rigid inter-stage connections provides a significantly higher nominal and non-nominal Z translation direction DoC stiffness compared to that provided by an XY flexure mechanism lacking such in-plane rigid inter-stage connections, and further provides an increased $\Theta_z$ rotation DoC stiffness of the second and third intermediate stages 228, 230 with respect to the ground stage 224 compared to that provided by an XY flexure mechanism lacking such in-plane rigid inter-stage connections.

An embodiment of a method of manufacturing the first interconnect bar 288 is similar to previous methods of manufacturing described herein. The method involves two steps that, once completed, yield the first interconnect bar 288 of monolithic and one-piece construction. As before, the steps can be carried out in an order other than described herein, and the steps involve subtractive manufacturing processes and fabrication. Depending on the desired dimensions and precisions demanded of the ultimately-produced first interconnect bar 288—among other potential factors—the subtractive manufacturing processes and fabrication can involve one or more of: milling, wire electrical discharge machining (EDM), sinker EDM, laser cutting, and waterjet cutting, as well as other possible manufacturing processes and fabrication techniques. The method begins, per this embodiment, with the provision of a solid, one-piece, and unitary block. Overall dimensions and extents of the block in the X, Y, and Z directions can correspond to those of the first interconnect bar 288 for efficiency purposes. The block can be rectangular as shown, or can have another shape. The block can be composed of a metal material including, but not limited to, aluminum, titanium, or steel.

The two steps of the method, according to this embodiment, are discrete processes performed to the block from two directions with respect thereto. The directions have an orthogonal relationship with respect to each other. A first subtractive manufacturing process is performed from the Z direction. First thru-holes 290 are formed in this first subtractive manufacturing process. The first thru-holes 290 serve as pass-throughs for a bolt, per this embodiment, for connection of the first interconnect bar 288 to the second and third intermediate stages 228, 230. Further, second holes 292 are formed in this first subtractive manufacturing process. The second holes 292 are threaded in order to accommodate a bolt fastening, per this embodiment, for connection of the first interconnect bar 288 with an interconnect plate (introduced below) of the interconnect subassembly 196. Furthermore, in the method manufacturing the first interconnect bar 288, a second subtractive manufacturing process is performed from the Y direction. Here, material is removed over the Y direction in order to establish the remaining shapes and structures that make-up the first interconnect bar 288, namely, vertical and horizontal bars 294, 296, leaving a window 298 residing thereamong. The window 298 accommodates insertion and reception of a section of a second interconnect bar (introduced below) of the interconnect subassembly 196 for an interfit assembled configuration therebetween.

Figure 11:
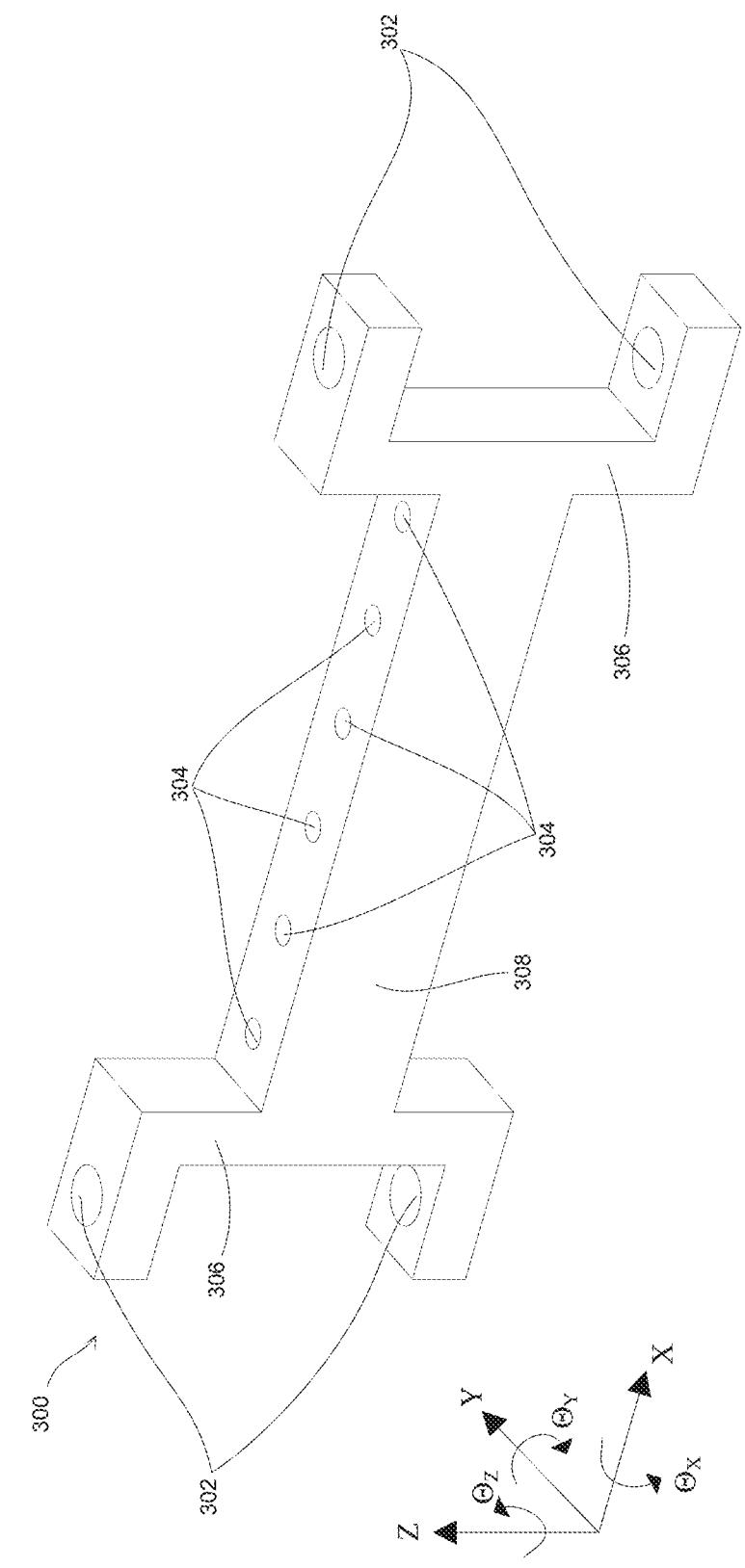
FIG. 11 is a perspective view of another embodiment of an interconnect bar of the sandwich XY flexure mechanism assembly.

Turning now to FIG. 11, an embodiment of a second interconnect bar 300 of the interconnect subassembly 196 is presented in isolation. The second interconnect bar 300 can have various designs and constructions in varying embodiments. According to the arrangement in this embodiment, the second interconnect bar 300 is intended for assembly and installation in the X direction in the sandwich XY flexure mechanism assembly 192 and with respect thereto. There is a total of two second interconnect bars 300 in the interconnect subassembly 196, according to this embodiment. The second interconnect bars 300 serve as in-plane rigid inter-stage connections in the sandwich XY flexure mechanism assembly 192 that provides improved static and dynamic performance thereof. Since the first and fourth intermediate stages 226, 232 constitute sister stages that exhibit kinematically compatible motion in this embodiment, the second interconnect bars 300 connect the first and fourth intermediate stages 226, 232 together and extend in the X direction therebetween. It has been found that such second interconnect bars 300 serving as in-plane rigid inter-stage connections can be employed without increasing the X direction DoF stiffness of the motion stage 198 with respect to the ground stage 224, and likewise without increasing the Y direction DoF stiffness of the motion stage 198 with respect to the ground stage 224. Moreover, it has been found that such second interconnect bars 300 serving as in-plane rigid inter-stage connections provides a significantly higher nominal and non-nominal Z translation direction DoC stiffness compared to that provided by an XY flexure mechanism lacking such in-plane rigid inter-stage connections, and further provides an increased $\Theta_z$ rotation DoC stiffness of the first and fourth intermediate stages 226, 232 with respect to the ground stage 224 compared to that provided by an XY flexure mechanism lacking such in-plane rigid inter-stage connections.

An embodiment of a method of manufacturing the second interconnect bar 300 is similar to previous methods of manufacturing described herein. The method involves two steps that, once completed, yield the second interconnect bar 300 of monolithic and one-piece construction. As before, the steps can be carried out in an order other than described herein, and the steps involve subtractive manufacturing processes and fabrication. Depending on the desired dimensions and precisions demanded of the ultimately-produced second interconnect bar 300—among other potential factors—the subtractive manufacturing processes and fabrication can involve one or more of: milling, wire electrical discharge machining (EDM), sinker EDM, laser cutting, and waterjet cutting, as well as other possible manufacturing processes and fabrication techniques. The method begins, per this embodiment, with the provision of a solid, one-piece, and unitary block. Overall dimensions and extents of the block in the X, Y, and Z directions can correspond to those of the second interconnect bar 300 for efficiency purposes. The block can be rectangular as shown, or can have another shape. The block can be composed of a metal material including, but not limited to, aluminum, titanium, or steel.

The two steps of the method, according to this embodiment, are discrete processes performed to the block from two directions with respect thereto. The directions have an orthogonal relationship with respect to each other. A first subtractive manufacturing process is performed from the Z direction. First thru-holes 302 are formed in this first subtractive manufacturing process. The first thru-holes 302 serve as pass-throughs for a bolt, per this embodiment, for connection of the second interconnect bar 300 to the first and fourth intermediate stages 226, 232. Further, second holes 304 are formed in this first subtractive manufacturing process. The second holes 304 are threaded in order to accommodate a bolt fastening, per this embodiment, for connection of the second interconnect bar 300 with the interconnect plate (introduced below) of the interconnect subassembly 196. Furthermore, in the method manufacturing the second interconnect bar 300, a second subtractive manufacturing process is performed from the Y direction. Here, material is removed over the Y direction in order to establish the remaining shapes and structures that make-up the second interconnect bar 300, namely, vertical and horizontal bars 306, 308.

Figure 12:
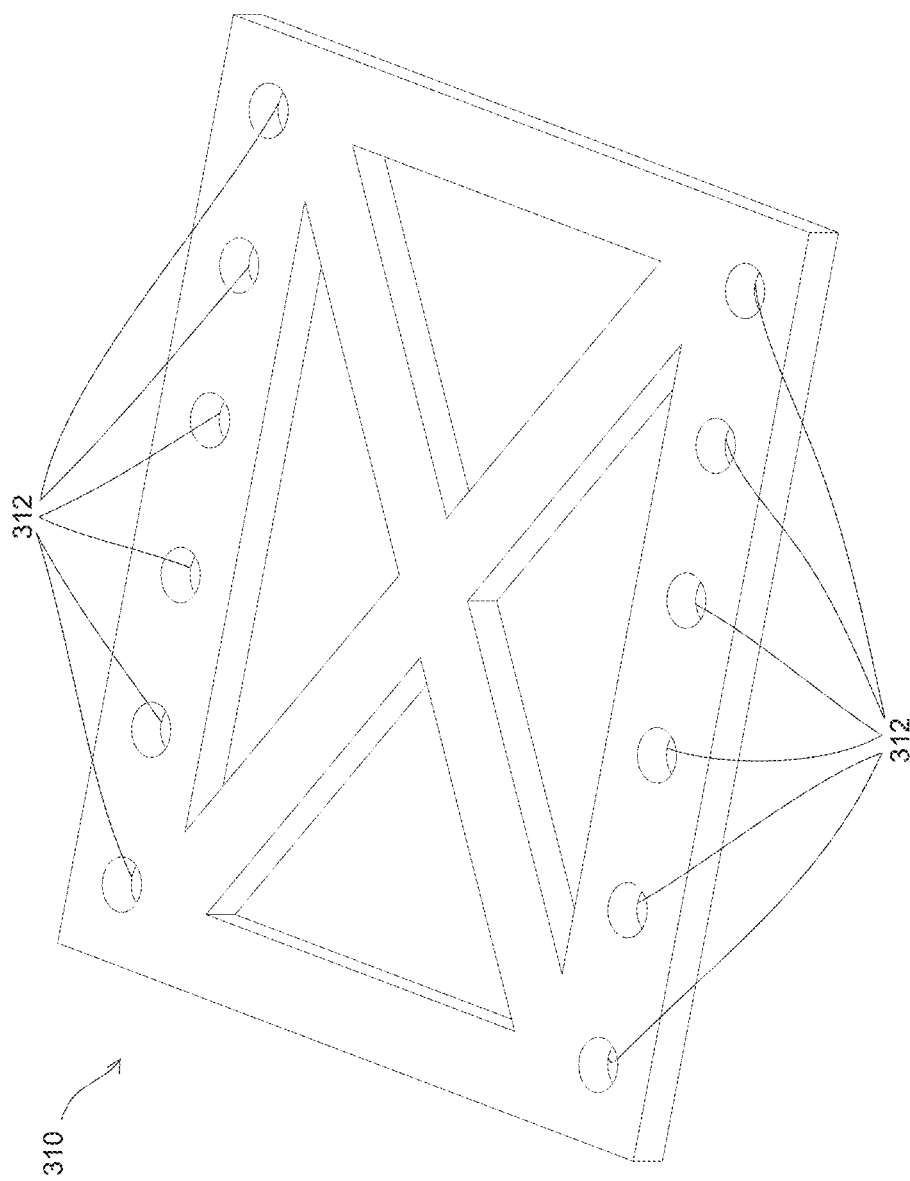
FIG. 12 is a perspective view of an embodiment of an interconnect plate of the sandwich XY flexure mechanism assembly.

Turning now to FIG. 12, an embodiment of an interconnect plate 310 of the interconnect subassembly 196 is presented in isolation. The interconnect plate 310 can have various designs and constructions in varying embodiments. According to this embodiment, there are a total of four interconnect plates 310 in the interconnect subassembly 196. The interconnect plates 310 serve as rigid connections between the two first interconnect bars 288 and between the two second interconnect bars 300 in the interconnect subassembly 196—two interconnect plates 310 for the two first interconnect bars 288 and two interconnect plates 310 for the two second interconnect bars 300.

An embodiment of a method of manufacturing the interconnect plate 310 is similar to previous methods of manufacturing described herein. The method involves a single step that, once completed, yields the interconnect plate 310 of monolithic and one-piece construction. As before, the step can involve subtractive manufacturing processes and fabrication. Depending on the desired dimensions and precisions demanded of the ultimately-produced interconnect plate 310—among other potential factors—the subtractive manufacturing process and fabrication can involve one or more of: milling, wire electrical discharge machining (EDM), sinker EDM, laser cutting, and waterjet cutting, as well as other possible manufacturing processes and fabrication techniques. The method begins, per this embodiment, with the provision of a solid, one-piece, and unitary block. Overall dimensions and extents of the block in the X, Y, and Z directions can correspond to those of the interconnect plate 310 for efficiency purposes. The block can be rectangular as shown, or can have another shape. The block can be composed of a metal material including, but not limited to, aluminum, titanium, or steel. A subtractive manufacturing process is performed from the Z direction. Thru-holes 312 are formed in this subtractive manufacturing process. The thru-holes 312 serve as pass-throughs to accommodate a bolt, per this embodiment, for connection of the interconnect plates 310 with the first and second interconnect bars 288, 300 of the interconnect subassembly 196.

FIG. 13 shows an embodiment of a subassembly of the first interconnect bars 288, second interconnect bars 300, and interconnect plates 310 all assembled and secured together. This subassembly is ultimately assembled and installed with the sandwich module 194 in the larger sandwich XY flexure mechanism assembly 192, as subsequently set forth. The subassembly, according to this embodiment, constitutes the interconnect subassembly 196. Here, the first and second interconnect bars 288, 300 are interfit with one another. A pair of first interconnect bars 288 are connected and secured with a pair of interconnect plates 310—a first interconnect plate 311 is secured via bolting on one side (e.g., top side) of the first interconnect bars 288, and a second interconnect plate 313 is secured via bolting on an opposite side (e.g., bottom side) of the first interconnect bars 288. In a similar manner, a pair of second interconnect bars 300 are connected and secure with a pair of interconnect plates 310—a third interconnect plate 315 is secured via bolting on one side (e.g., top side) of the second interconnect bars 300, and a fourth interconnect plate 317 is secured via bolting on an opposite side (e.g., bottom side) of the second interconnect bars 300. Still, in other embodiments, the interconnect subassembly could have varying designs, constructions, and components (including more or less components) than those set forth herein depending upon—among other possible factors—the design and construction and components of the accompanying sandwich module and the in-plane rigid inter-stage connections intended to be provided by the interconnect subassembly.

Figure 14A:
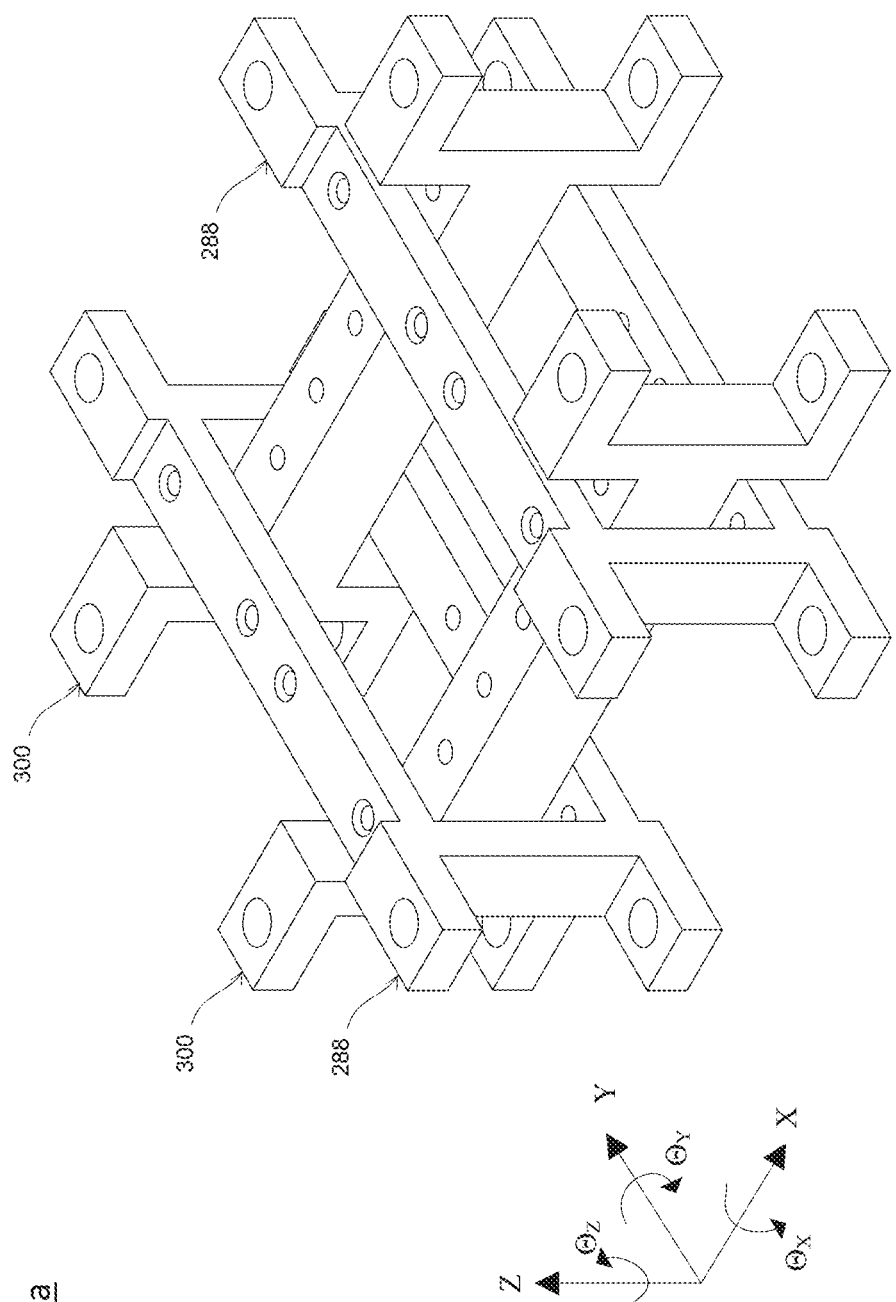
FIG. 14a is a depiction of a step according to an embodiment of an assembly method of the subassembly of interconnect bars and plates.
Figure 14B:
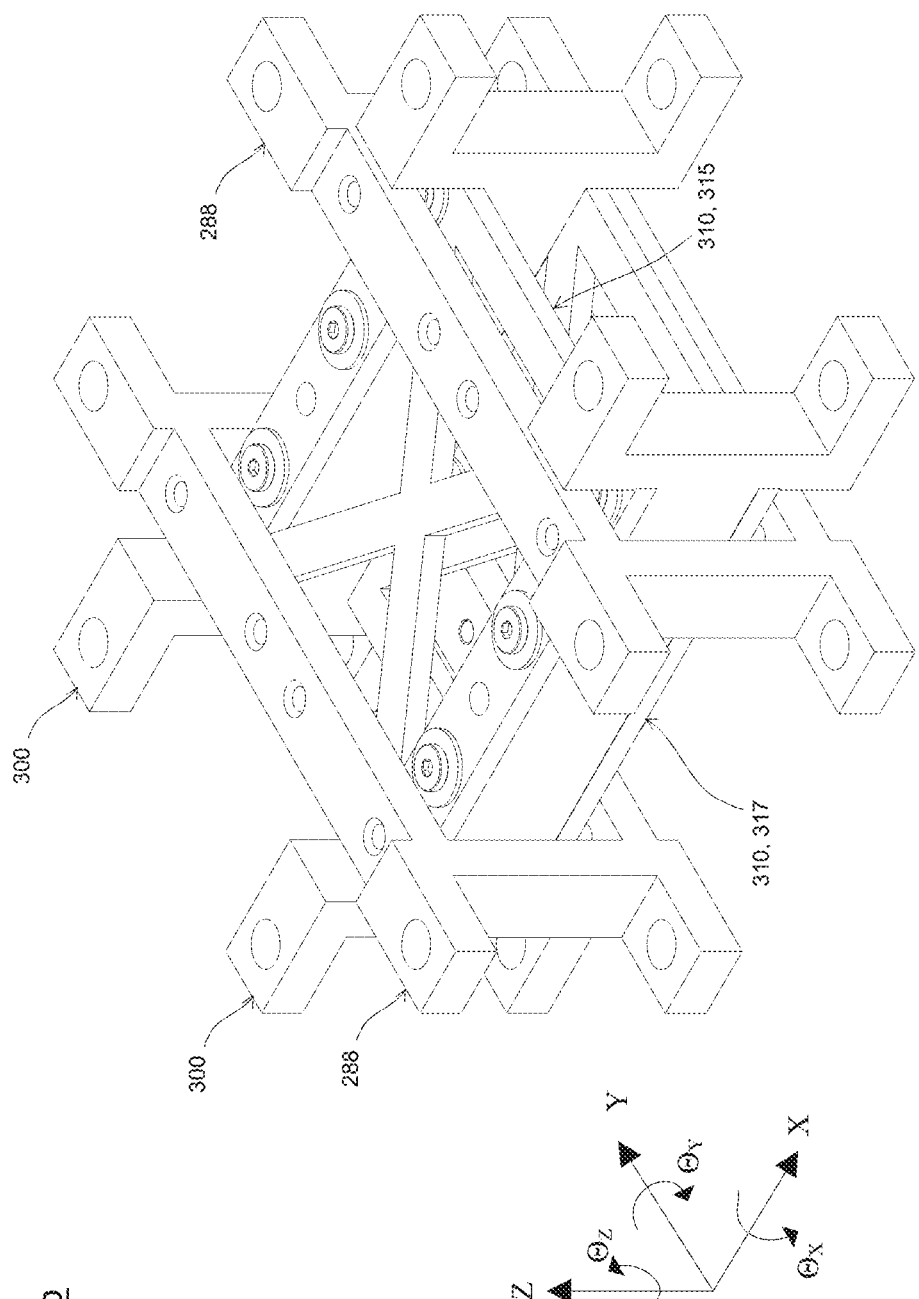
FIG. 14b is a depiction of a step of the assembly method of the subassembly of interconnect bars and plates.
Figure 14C:
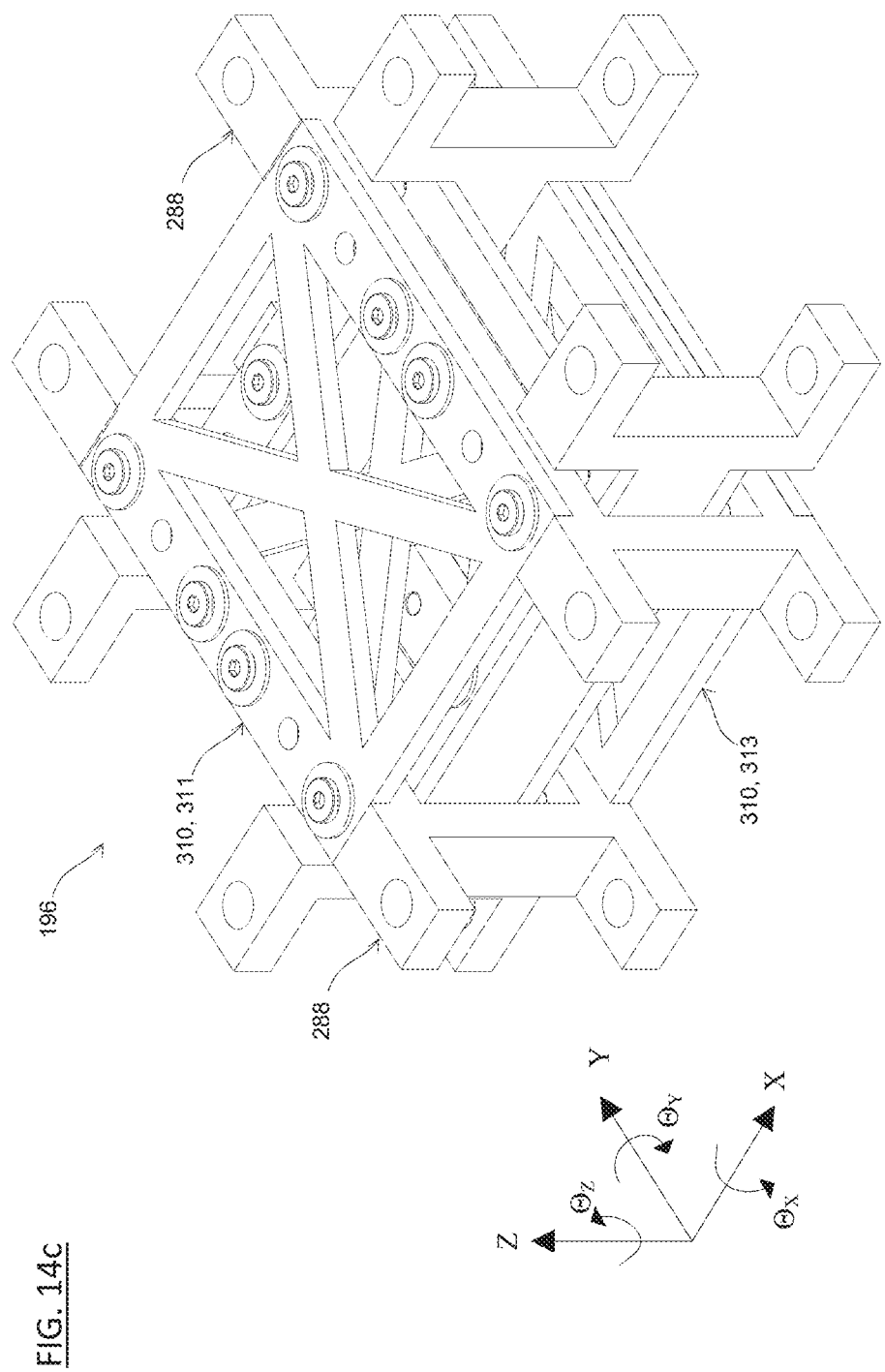
FIG. 14c is a depiction of a step of the assembly method of the subassembly of interconnect bars and plates.

With reference now to FIGS. 14a-14c, an embodiment of a method of assembling the interconnect subassembly 196 is presented. The method can differ in varying embodiments. In FIG. 14a, a first step of assembly is performed. The first and second interconnect bars 288, 300 are interfit with one another. According to this embodiment, the second interconnect bars 300 are turned on their sides and inserted through the windows 298 of the first interconnect bars 288. Once received and inserted, the second interconnect bars 300 are returned upright, as depicted in FIG. 14a. In FIG. 14b, a second step of assembly is performed. The third interconnect plate 315 is bolted on one side of the second interconnect bars 300, and the fourth interconnect plate 317 is bolted on the opposite side of the second interconnect bars 300. For accommodating the bolting, the second interconnect bars 300 can be moved back-and-forth within the windows 298 of the first interconnect bars 288, as needed. Lastly, in FIG. 14c, a third step of assembly is performed. The first interconnect plate 311 is bolted on one side of the first interconnect bars 288, and the second interconnect plate 313 is bolted on the opposite side of the first interconnect bars 288. The method of assembling the interconnect subassembly 196 is completed after the third step, according to this embodiment. The secured second interconnect bars 300 and interconnect plates 315, 317 are able to move with respect to the secured first interconnect bars 288 and interconnect plates 311, 313.

Furthermore, FIG. 15 shows an embodiment of a method of assembling and installing the interconnect subassembly 196 with the sandwich module 194. The method can differ in varying embodiments. In the embodiment of FIG. 15, the fully assembled interconnect subassembly 196 is secured in place via bolting in the sandwich module 194 and within the interconnect opening 263. Bolts 314 are employed for this securement. The interconnect subassembly 196—particularly the first and second interconnect bars 288, 300—is secured to the first, second, third, and fourth intermediate stages 226, 228, 230, 232. The thru-holes 242 of the intermediate stages 226, 228, 230, 232 are aligned with respective first thru-holes 290, 302 of the first and second interconnect bars 288, 300. The bolts 314 are inserted through the aligned thru-holes and tightened down with nuts for assembly and installation. In an alternative embodiment of the method of assembling and installing the interconnect subassembly 196 with the sandwich module 194, the method of assembling the interconnect subassembly 196 as described in connection with FIGS. 14a-14c can be carried out at the location and site of installation in the sandwich module 194, i.e., within the interconnect opening 263. In other words, for instance, the first step of assembly depicted in FIG. 14a in which the first and second interconnect bars 288, 300 are interfit with one another can be performed within the interconnect opening 263 that resides within the sandwich module 194 itself. The remaining subsequent second and third steps of FIGS. 14b and 14c can be performed within the interconnect opening 263 too, per this alternative embodiment. Still further, in other embodiments the interconnect subassembly 196 could be assembled to only a pair of intermediate bodies (i.e., sister stages) of the sandwich module 194, in which case an in-plane rigid inter-stage connection would be provided only between the pair of intermediate bodies while other intermediate bodies of the sandwich module 194 could remain free of in-plane rigid inter-stage connections.

Figure 16:
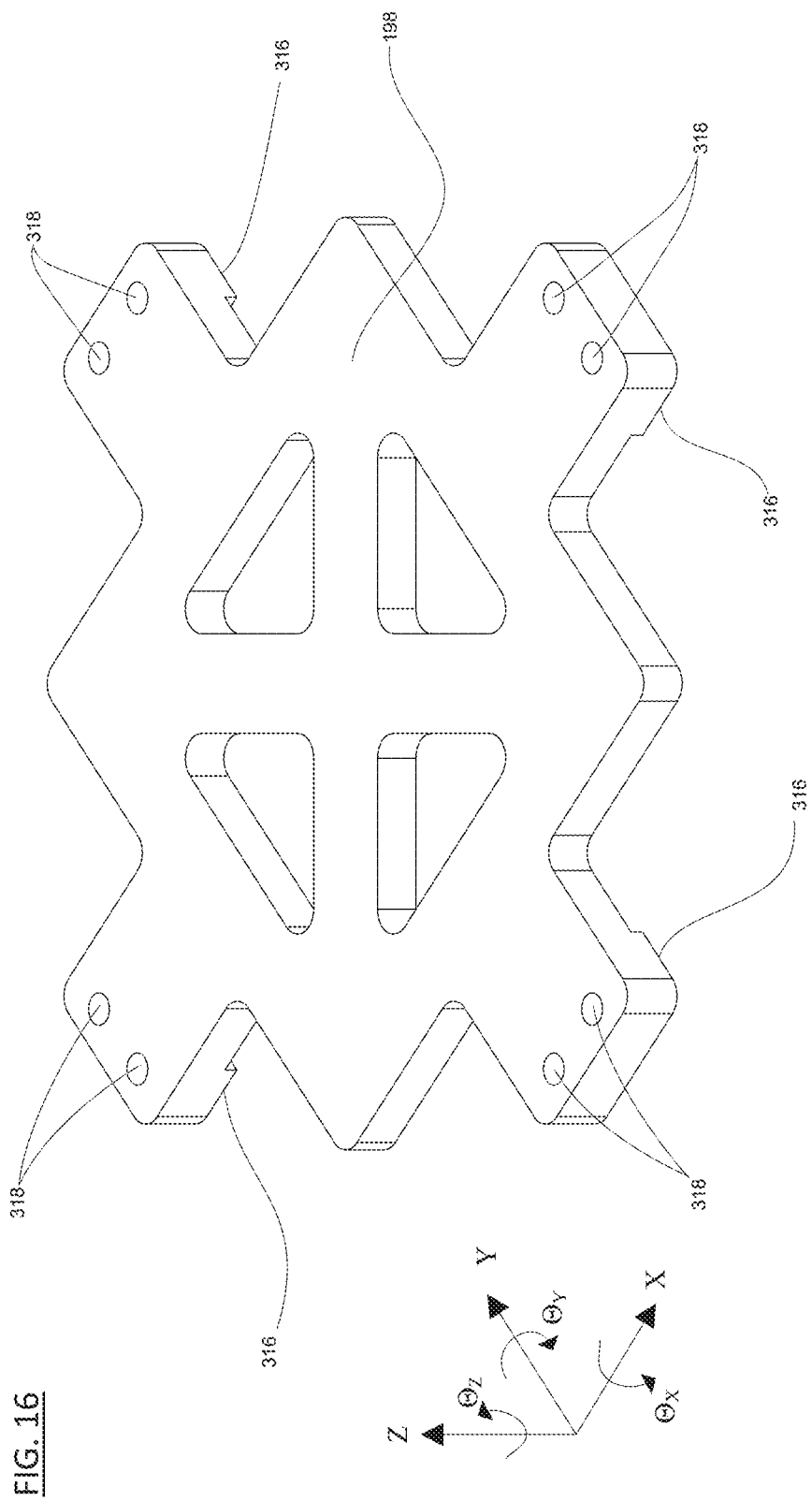
FIG. 16 is a perspective view of an embodiment of a motion stage of the sandwich XY flexure mechanism assembly.

Turning now to FIG. 16, an embodiment of the motion stage 198 of the sandwich XY flexure mechanism assembly 192 is presented in isolation. The motion stage 198 can have various designs, constructions, and components in varying embodiments. In this embodiment, the motion stage 198 serves as the end effector of the sandwich XY flexure mechanism assembly 192. As previously mentioned, in the sandwich XY flexure mechanism assembly 192, the motion stage 198 has two DoF with respect to the ground stage 224. In this embodiment, the two DoF are translational motions of the motion stage 198 with respect to the ground stage 224 in the X direction and the Y direction. The remaining four directions—Z, $\Theta_x$, $\Theta_y$, and $\Theta_z$ directions—are hence load bearing and DoC directions, according to this embodiment. There is a total of two of these motion stage components assembled in the sandwich XY flexure mechanism assembly 192 furnishing the motion stage 198 thereof, per this embodiment. Here, providing two motion stage components is for symmetry purposes. In order to accommodate the interconnect subassembly 196 in assembly and preclude interference therewith, pads 316 are provided at an underside of the motion stage 198. The pads 316 provide spacing in the Z direction of the remaining regions of the motion stage 198 relative to the interconnect subassembly 196.

An embodiment of a method of manufacturing the motion stage 198 is similar to previous methods of manufacturing described herein. The method involves a single step that, once completed, yields the motion stage 198 of monolithic and one-piece construction. As before, the step can involve subtractive manufacturing processes and fabrication. Depending on the desired dimensions and precisions demanded of the ultimately-produced motion stage 198—among other potential factors—the subtractive manufacturing process and fabrication can involve one or more of: milling, wire electrical discharge machining (EDM), sinker EDM, laser cutting, and waterjet cutting, as well as other possible manufacturing processes and fabrication techniques. The method begins, per this embodiment, with the provision of a solid, one-piece, and unitary block. Overall dimensions and extents of the block in the X, Y, and Z directions can correspond to those of the motion stage 198 for efficiency purposes. The block can be composed of a metal material including, but not limited to, aluminum, titanium, or steel. A subtractive manufacturing process is performed from the Z direction. Thru-holes 318 are formed in this subtractive manufacturing process. The thru-holes 318 accommodate a bolt and nut fastening, per this embodiment, for securement and connection of the motion stage 198 with the first, second, third, and fourth inner stages 234, 236, 238, 240 of the sandwich module 194. Further, in the embodiment of FIG. 16, portions of the motion stage 198 are removed for reduction of weight purposes.

Figure 17:
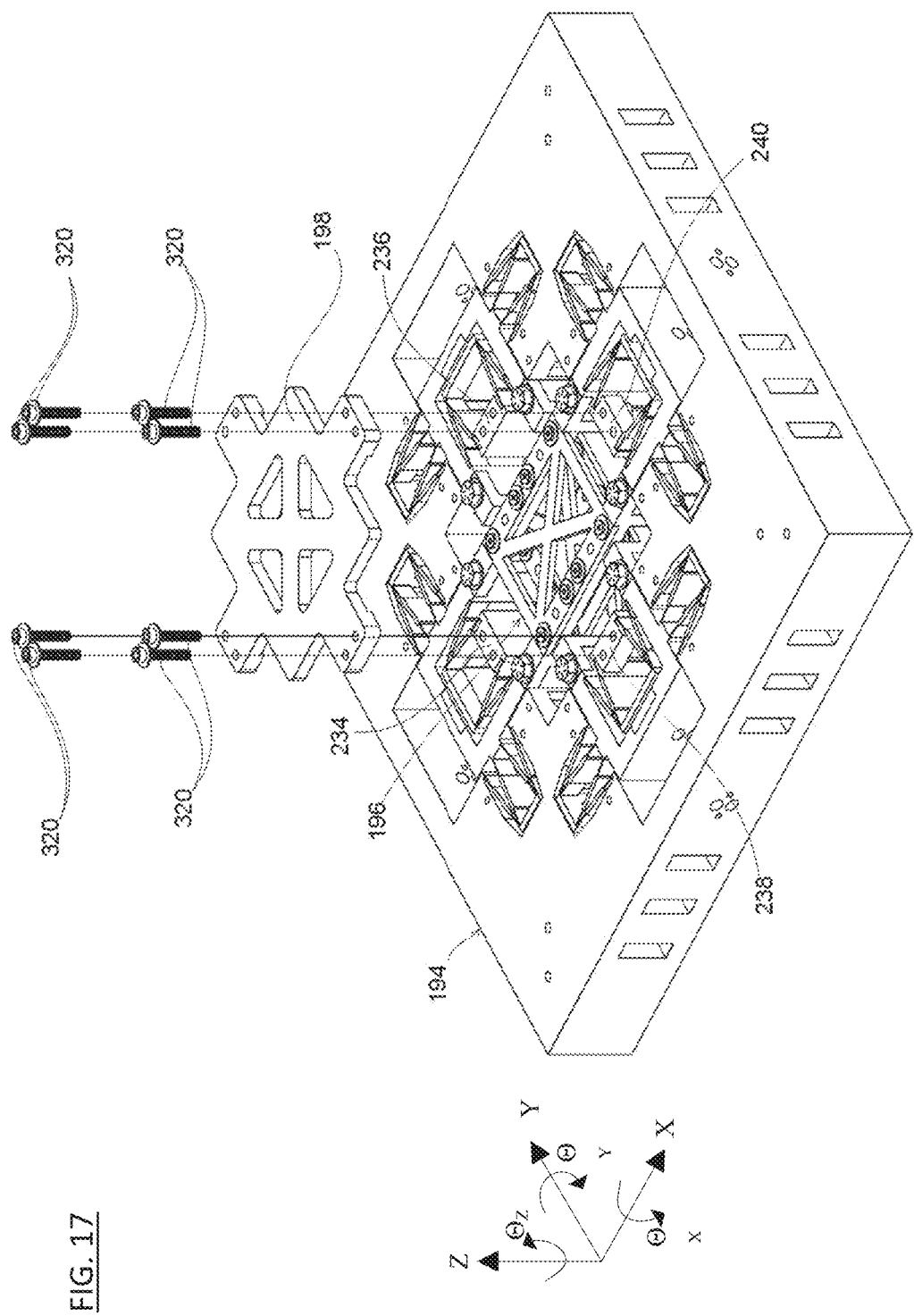
FIG. 17 is a partially exploded view of an embodiment of an assembly method of the motion stage with the sandwich module and subassembly of interconnect bars and plates.

Furthermore, FIG. 17 shows an embodiment of a method of assembling and installing the motion stage 198 with the sandwich module 194. The method can differ in varying embodiments. In the embodiment of FIG. 17, the motion stage 198 is secured in place via bolting in the sandwich module 194. Bolts 320 are employed for this securement. The motion stage 198 is secured to the first, second, third, and fourth inner stages 234, 236, 238, 240. The thru-holes 244 of the inner stages 234, 236, 238, 240 are aligned with the thru-holes 316 of the motion stage 198. The bolts 320 are inserted through the aligned thru-holes and tightened down with nuts for assembly and installation. While FIG. 17 depicts the assembly of a motion stage component at a top side of the sandwich module 194, another motion stage component is assembled in the same manner at a bottom side of the sandwich module 194.

Turning now to FIG. 18, an exploded view is depicted for demonstrative purposes of the main components of the sandwich XY flexure mechanism assembly 192, namely, the sandwich module 194, the interconnect subassembly 196, and the motion stage 198.

Figure 19A:
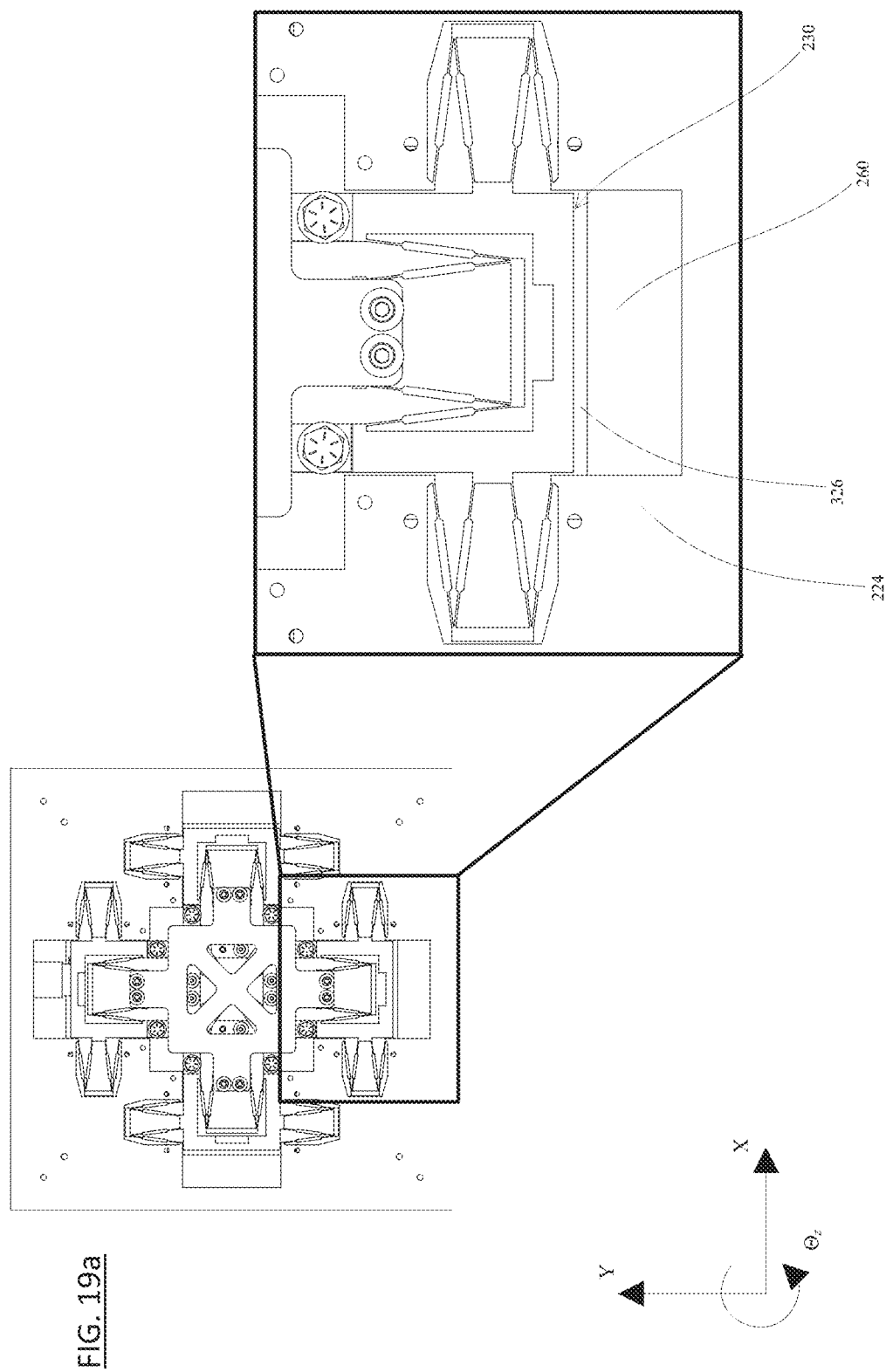
FIG. 19a is an enlarged depiction of a step according to an embodiment of an assembly method of an actuator of the sandwich XY flexure mechanism assembly.
Figure 19B:
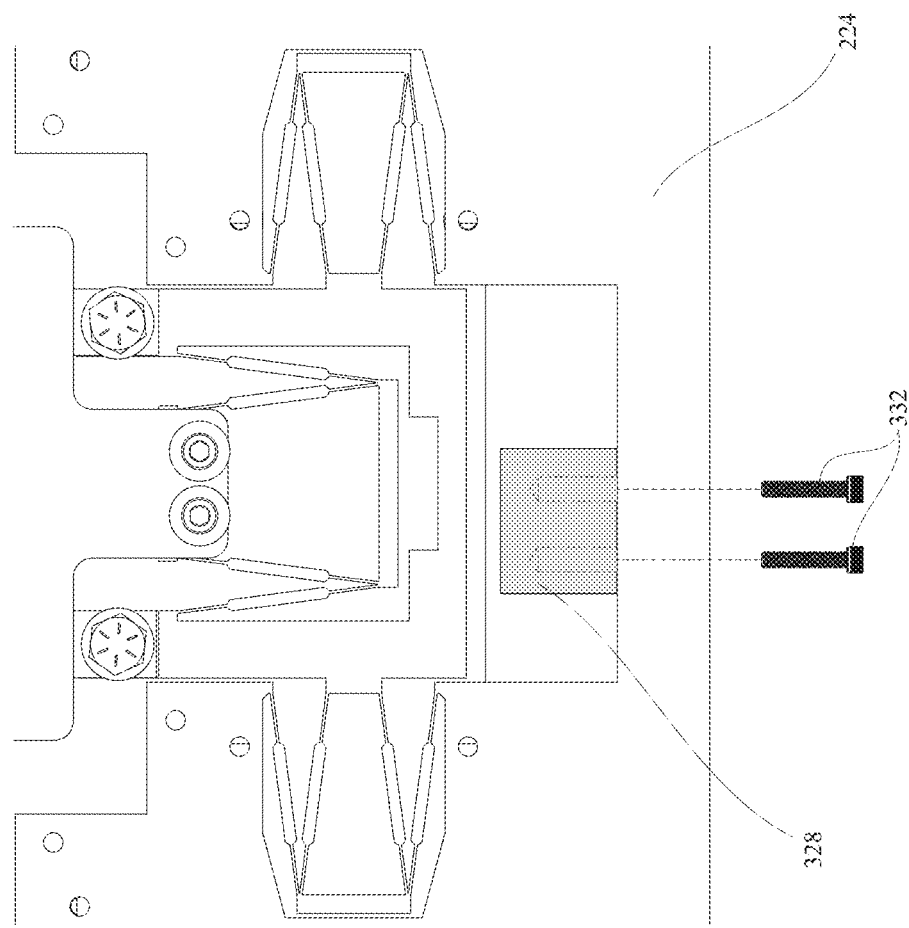
FIG. 19b is an enlarged depiction of a step of the assembly method of the actuator.
Figure 19C:
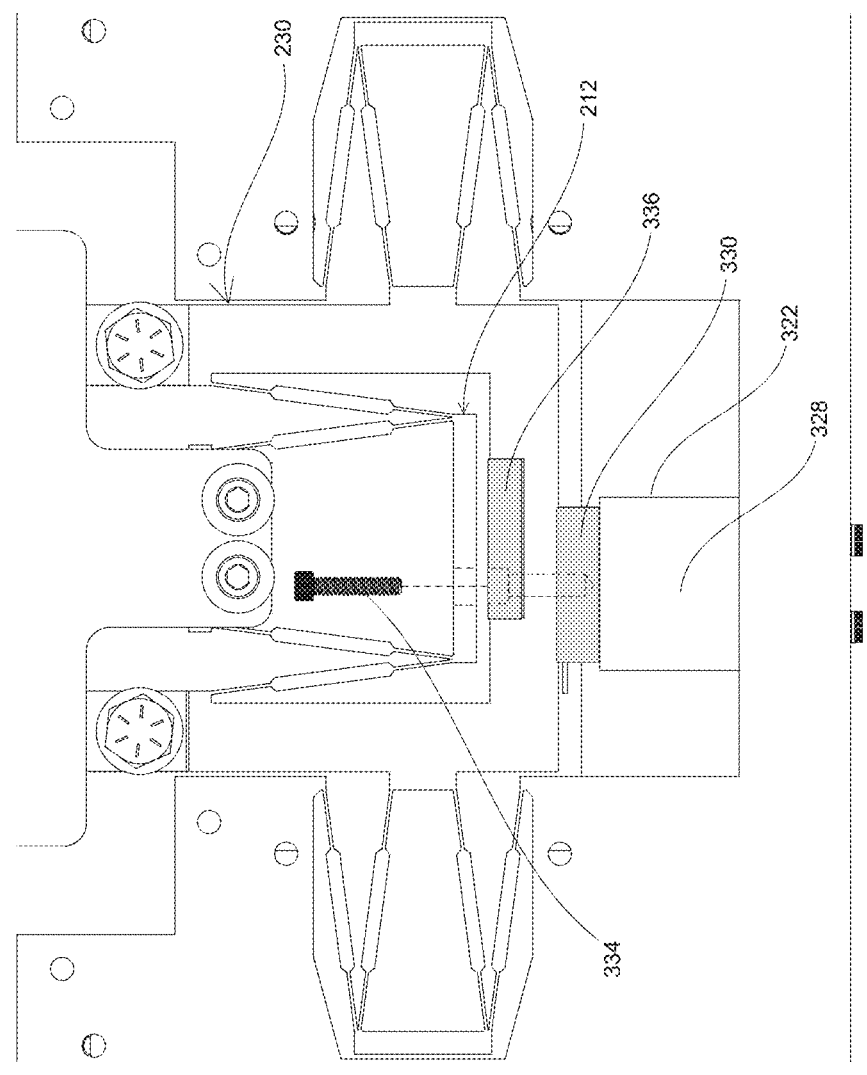
FIG. 19c is an enlarged depiction of a step of the assembly method of the actuator.
Figure 19D:
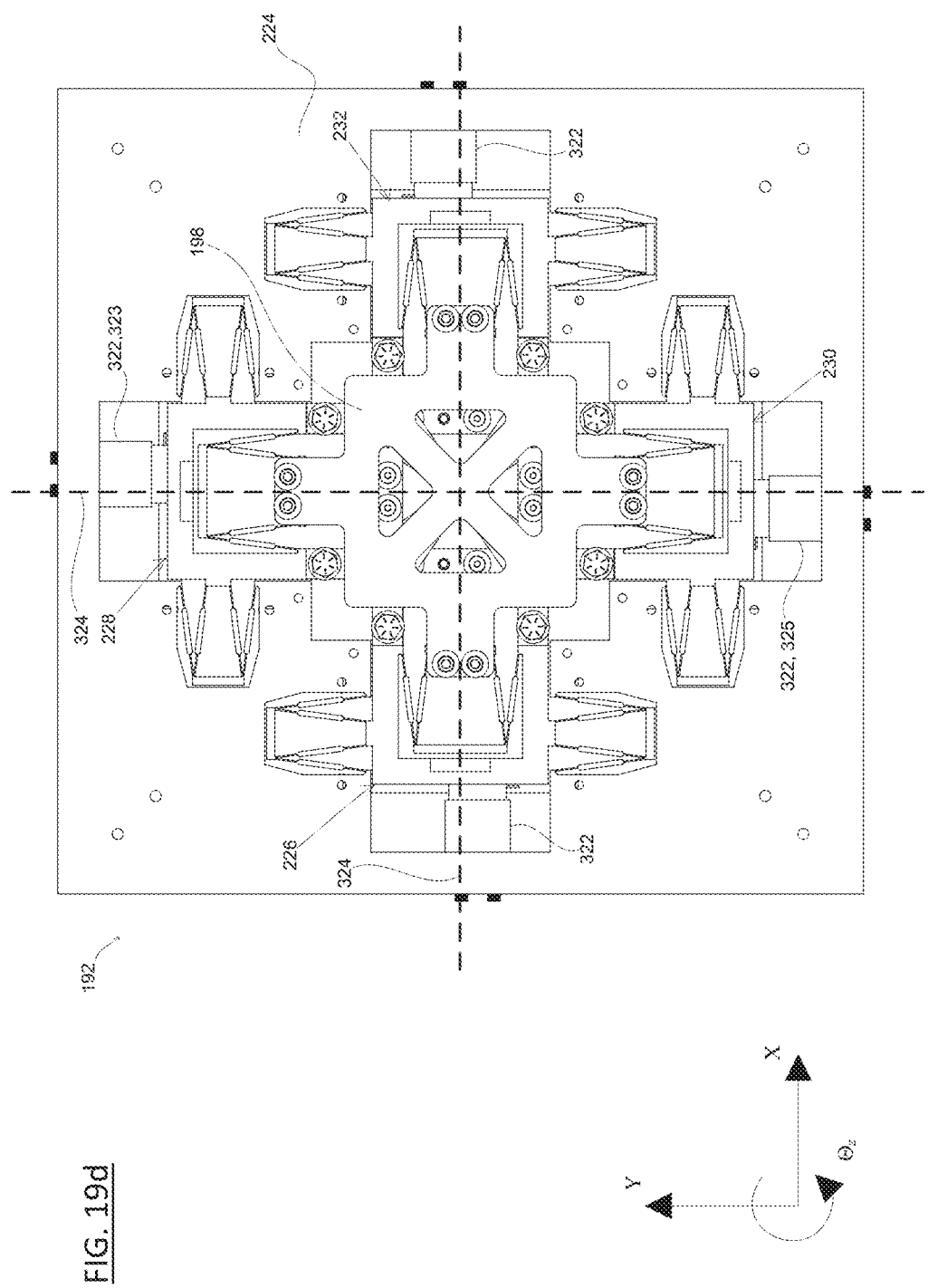
FIG. 19d is a top view of the sandwich XY flexure mechanism assembly with multiple actuators assembled.

With reference to FIGS. 19a-19d, a multitude of actuators 322 is provided in the sandwich XY flexure mechanism assembly 192 and are employed for inciting and imparting movement to the motion stage 198 amid use of the sandwich XY flexure mechanism assembly 192. The motion stage 198 is driven to move via the actuators 322. The actuators 322 can have various designs and constructions and components in varying embodiments, can be of differing types, can have differing quantities, and can exhibit differing installation locations, among other possibilities dependent upon a particular embodiment. In the embodiment of FIGS. 19a-19d, there is a total of four actuators 322 precisely controlling movements of the motion stage 198 in the X and Y directions with respect to the ground stage 224. As illustrated perhaps best in FIG. 19d, one actuator 322 is situated at each of the first, second, third, and fourth intermediate stages 226, 228, 230, 232, with components disposed and seated within the actuator pockets 260 and adjacent thereto. Two oppositely-located actuators 322 have a staggered configuration and are offset with respect to each other and relative to a center line 324, according to this embodiment. For example, in FIG. 19d, a first actuator 323 is positioned off-center, misaligned, and to a first side of the center line 324 by a first distance, and a second actuator 325 located on an opposite end of the sandwich XY flexure mechanism assembly 192 and of the motion stage 198 is likewise positioned off-center, misaligned, and to an opposite second side of the center line 324 by the first distance; this relationship is also true of the other two actuators 322, as depicted in FIG. 19d. The opposed actuators 322 have been shown to induce a $\Theta_z$ moment on the respective intermediate stages, and the staggered configuration has proven to facilitate active control of any $\Theta_z$ rotation of the motion stage 198 that may otherwise occur.

Furthermore, an embodiment of a method of assembling the actuators 322 in the sandwich XY flexure mechanism assembly 192 is presented. The method can differ in varying embodiments. In FIG. 19a, the actuator pocket 260 is denoted, along with an actuation gap 326 that serves to accommodate movement of the third intermediate stage 230 with respect to the ground stage 224, per this enlarged view (while only an enlarged view and associated description of the actuator 322 at the third intermediate stage 230 is set forth here, a corresponding description applies for actuators 322 at each of the other intermediate stages 226, 228, 232). According to this embodiment, the actuator 322 includes a stator 328 and a mover 330. In FIG. 19b, the stator 328 is secured and fixed to the ground stage 224 via bolting. Bolts 332 are inserted through the blind holes 256 in the ground stage 224 and into threaded holes of the stator 328 for such fixation. In FIG. 19c, the mover 330 is secured and fixed to the third intermediate stage 230 via bolting. A bolt 334 is passed through the accompanying secondary stage of the third inner DPFM 212 via a clearance established by the blind hole 256 thereat, is inserted and seated at an insert 336, is inserted through the blind hole 256 in the third intermediate stage 230, and is threaded into threaded holes of the mover 330. The insert 336 is a discrete component provided in this embodiment in order to furnish a counterbore for a head portion of the bolt 334.

Figure 20A:
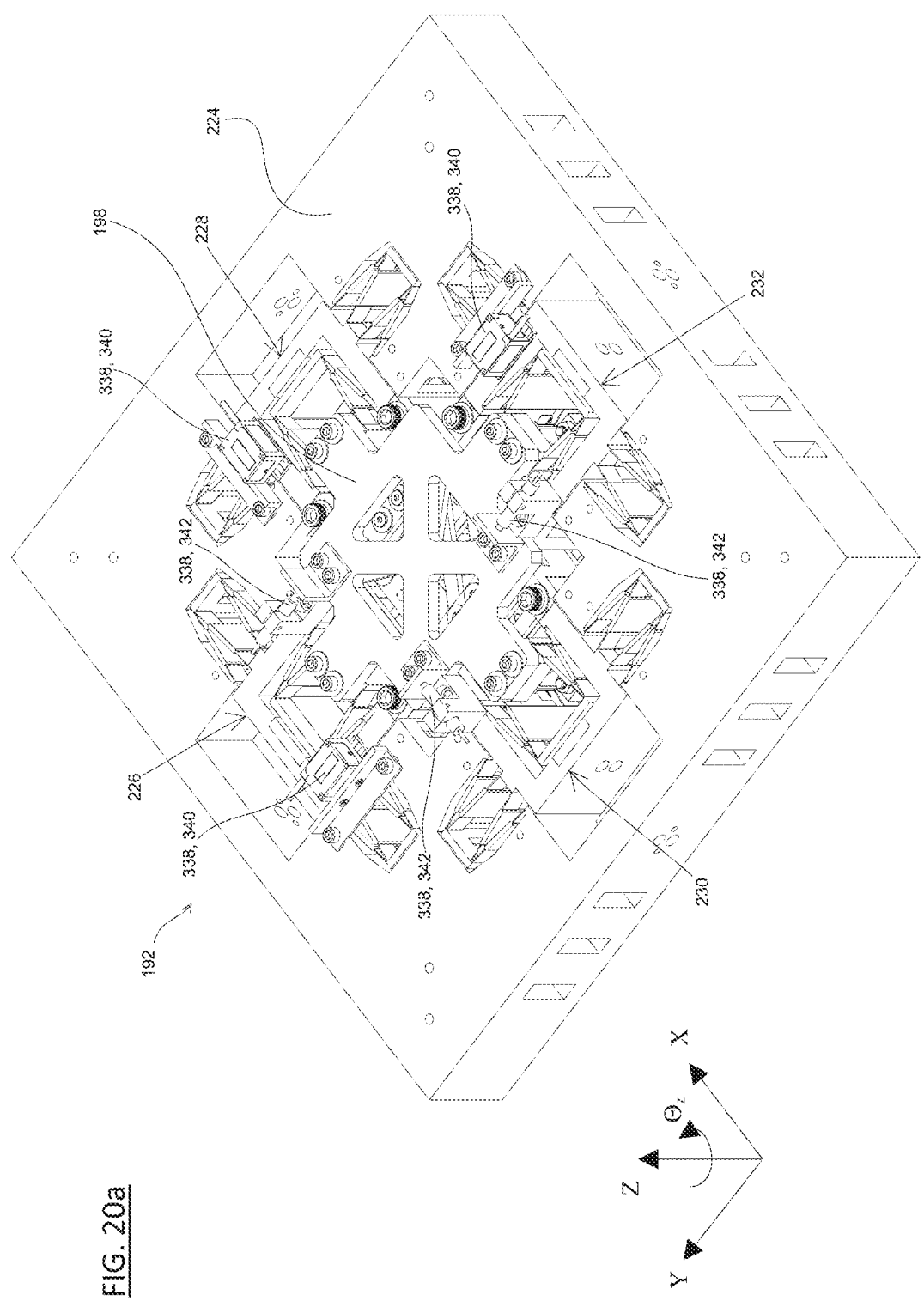
FIG. 20a is a perspective view of the sandwich XY flexure mechanism assembly with embodiments of multiple displacement sensors.
Figure 20B:
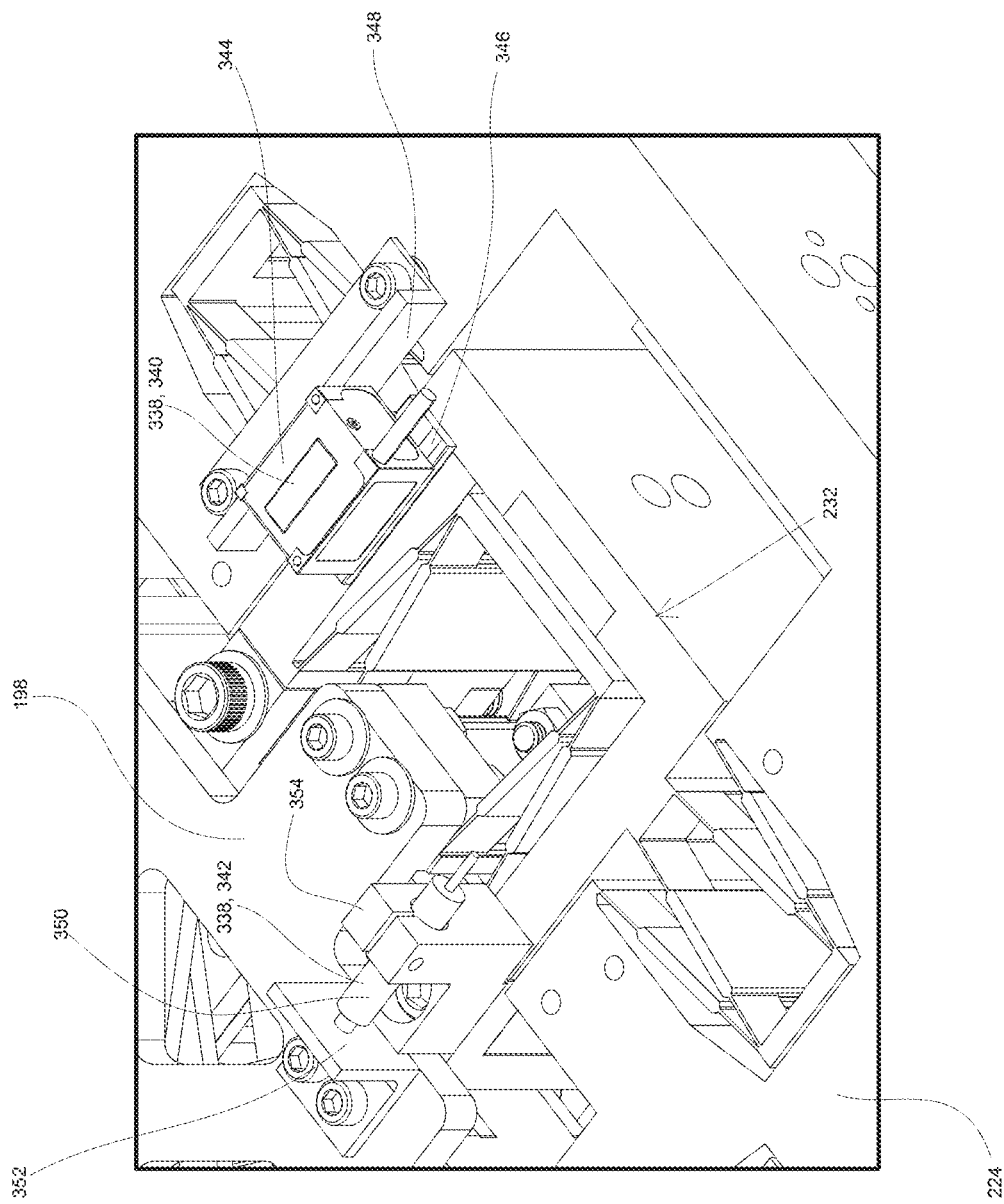
FIG. 20b is an enlarged view of some of the displacement sensors.

With reference now to FIGS. 20a and 20b, a multitude of displacement sensors 338 is provided in the sandwich XY flexure mechanism assembly 192 and are employed for measuring displacement of the motion stage 198 with respect to the ground stage 224 amid use of the sandwich XY flexure mechanism assembly 192. The displacement sensors 338 can have various designs and constructions and components in varying embodiments, can be of differing types, can have differing quantities, and can exhibit differing installation locations, among other possibilities dependent upon a particular embodiment. In the embodiment of FIGS. 20a and 20b, there is a total of six displacement sensors 338 precisely measuring the aggregate displacement between the ground stage 224 and the motion stage 198. The six displacement sensors 338 measure linear distance and come in two types according to this embodiment. Three of the displacement sensors 338 are linear encoder sensors 340 and three of the displacement sensors 338 are capacitance probe sensors 342.

In order to measure the aggregate displacement of the motion stage 198 with respect to the ground stage 224, the displacement sensors 338 are situated among the motion stage 198 and the ground stage 224 and the first, second, third, and fourth intermediate stages 226, 228, 230, 232, per this embodiment. It has been determined that the total displacement between the ground stage 224 and the motion stage 198 is made-up of two components: i) displacement between the ground stage 224 and the respective intermediate stage, and ii) displacement between the respective intermediate stage and the motion stage 198. The magnitude of the displacement between the ground stage 224 and respective intermediate stage has been shown to be greater than that of the displacement between the respective intermediate stage and motion stage 198. The linear sensors 340 are therefore disposed for taking measurements between the ground stage 224 and the respective intermediate stage, while the capacitance probe sensors 342 are disposed for taking measurements between the respective intermediate stage and the motion stage 198.

In this embodiment, the linear encoder sensors 340 each include a read head 344 and a scale 346. The read head 344 is secured and fixed to the ground stage 224 via a bracket 348, and the scale 346 is secured and fixed to the respective intermediate stage (e.g., the fourth intermediate stage 232 in FIG. 20b). The scale 346 moves with the respective intermediate stage. Furthermore, the capacitance probe sensors 342 each include a capacitance probe 350 and a target block 352. The capacitance probe 350 is secured and fixed to the respective intermediate stage (e.g., the fourth intermediate stage 232 in FIG. 20b) via a clamp 354 and moves therewith, and the target block 352 is secured and fixed to the motion stage 198 via bolting and moves therewith. Further, in FIGS. 20a and 20b, the displacement sensors 338 are provided in pairs—i.e., one linear sensor 340 and one capacitance probe sensor 342—to measure linear displacement in the X direction of the motion stage 198 with respect to the ground stage 224, to measure linear displacement in the Y direction of the motion stage 198 with respect to the ground stage 224, and to measure rotation in the $\Theta_z$ direction of the motion stage 198 with respect to the ground stage 224. Two of the pairs are arranged about the X or Y axis for measuring linear displacement in the X or Y direction and rotation in the $\Theta_z$ direction, and the remaining one of the pairs is arranged about the other X or Y axis for measuring linear displacement in the other X or Y direction.

Furthermore, while the methods of manufacturing have thus far been depicted and described as involving subtractive manufacturing processes and fabrication, the modules and components set forth herein could instead be manufactured via an additive manufacturing process. Examples of additive manufacturing processes include 3D printing, friction stir additive manufacturing (FSAM), as well as possibly other types and techniques of additive manufacturing. The modules and components could remain composed of a metal material, and could still be of monolithic and one-piece construction, as described. Further, the modules and components potentially subject to additive manufacturing are those set forth herein, including one or more or all of the following: the sandwich flexure module 10, the sandwich PFM module 60, the sandwich DPFM module 112, the sandwich module 194, the first interconnect bar 288, the second interconnect bar 300, and/or the interconnect plate 310.

As used herein, the terms "general" and "generally" and "substantially" are intended to account for the inherent degree of variance and imprecision that is often attributed to, and often accompanies, any design and manufacturing process, including engineering tolerances—and without deviation from the relevant functionality and outcome—such that mathematical precision and exactitude is not implied and, in some instances, is not possible. In other instances, the terms "general" and "generally" and "substantially" are intended to represent the inherent degree of uncertainty that is often attributed to any quantitative comparison, value, and measurement calculation, or other representation.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method of manufacturing and assembling a sandwich flexure mechanism assembly, the method comprising:
   providing a monolithic sandwich module comprising a plurality of sandwich double parallelogram flexure mechanisms, a plurality of intermediate bodies, and a plurality of out of plane rigid inter-stage connections between at least some twin stages of said monolithic sandwich module; and
   providing an interconnect subassembly to at least a pair of intermediate bodies of said plurality of intermediate bodies, said interconnect subassembly providing at least one in-plane rigid inter-stage connection between said at least pair of intermediate bodies;
   wherein said sandwich flexure mechanism assembly effects at least one in-plane degree of freedom of a motion body of the sandwich flexure mechanism assembly.

2. The method of manufacturing and assembling a sandwich flexure mechanism assembly as set forth in claim 1, wherein providing said monolithic sandwich module comprises performing subtractive manufacturing to a block from at least two directions with respect to said block, said at least two directions being orthogonal with respect to each other.

3. The method of manufacturing and assembling a sandwich flexure mechanism assembly as set forth in claim 2, wherein performing subtractive manufacturing to said block from at least two directions forms a plurality of side through-holes in said block, said plurality of side through-holes establishing a plurality of openings among a plurality of flexure blades of said plurality of sandwich double parallelogram flexure mechanisms.

4. The method of manufacturing and assembling a sandwich flexure mechanism assembly as set forth in claim 2, wherein performing subtractive manufacturing to said block is performed from at least three directions with respect to said block, said at least three directions being orthogonal with respect to one another.

5. The method of manufacturing and assembling a sandwich flexure mechanism assembly as set forth in claim 1, wherein providing said interconnect subassembly comprises assembling said interconnect subassembly to said plurality of intermediate bodies, and said interconnect subassembly provides in-plane rigid inter-stage connections between pairs of intermediate bodies constituting sister stages of the sandwich flexure mechanism assembly.

6. The method of manufacturing and assembling a sandwich flexure mechanism assembly as set forth in claim 1, wherein said monolithic sandwich module comprises a plurality of actuator pockets, and the method further comprises assembling a plurality of actuators at said plurality of actuator pockets.

7. The method of manufacturing and assembling a sandwich flexure mechanism assembly as set forth in claim 6, wherein at least a pair of oppositely-located actuators of said plurality of actuators have a staggered arrangement with respect to each other and relative to a center line of the monolithic sandwich flexure module.

8. The method of manufacturing and assembling a sandwich flexure mechanism assembly as set forth in claim 1, wherein said monolithic sandwich module comprises a plurality of inner bodies, and the method further comprises assembling the motion body to said plurality of inner bodies.

9. A method of manufacturing and assembling a sandwich flexure mechanism assembly, the method comprising:
   providing a monolithic sandwich module comprising a plurality of sandwich double parallelogram flexure mechanisms, a plurality of intermediate bodies, a plurality of inner bodies, a plurality of actuator pockets, and a plurality of out of plane rigid inter-stage connections between at least some twin stages of said monolithic sandwich module;
   assembling an interconnect subassembly to at least a pair of intermediate bodies of said plurality of intermediate bodies, said interconnect subassembly providing at least one in-plane rigid inter-stage connection between said at least pair of intermediate bodies;
   assembling a motion body to said plurality of inner bodies; and
   assembling a plurality of actuators at said plurality of actuator pockets.

10. The method of manufacturing and assembling a sandwich flexure mechanism assembly as set forth in claim 9, wherein said plurality of out of plane rigid inter-stage connections are between all twin stages of said monolithic sandwich module, and wherein assembling said interconnect subassembly comprises assembling said interconnect subassembly to said plurality of intermediate bodies, and said interconnect subassembly provides in-plane rigid inter-stage connections between all pairs of intermediate bodies constituting sister stages of the sandwich flexure mechanism assembly.

11. The method of manufacturing and assembling a sandwich flexure mechanism assembly as set forth in claim 9, further comprising situating a plurality of displacement sensors among said plurality of intermediate bodies, said motion body, and a ground body of said monolithic sandwich module, said plurality of displacement sensors sensing displacement of said motion body with respect to said ground body.

* * * * *